(12) United States Patent   (10) Patent No.: US 6,985,009 B2
Nishio et al.   (45) Date of Patent: Jan. 10, 2006

(54) SIGNAL TRANSMITTING SYSTEM

(75) Inventors: Yoji Nishio, Tokyo (JP); Seiji Funaba, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 54 days.

(21) Appl. No.: 10/816,187

(22) Filed: Apr. 2, 2004

(65) Prior Publication Data

US 2004/0264267 A1    Dec. 30, 2004

(30) Foreign Application Priority Data

Apr. 4, 2003   (JP) ............................. 2003-101741

(51) Int. Cl.
*H03K 17/16* (2006.01)
(52) U.S. Cl. ..................... 326/30; 326/33; 326/31; 326/86
(58) Field of Classification Search ............ 326/30–34, 326/86, 90
See application file for complete search history.

(56) References Cited

U.S. PATENT DOCUMENTS 6,838,900 B2 *  1/2005  Huang et al. .................. 326/30

FOREIGN PATENT DOCUMENTS

| JP | 8-288828 | 11/1996 |
|----|----------|---------|
| JP | 10-105307 | 4/1998 |
| JP | 10-145217 | 5/1998 |
| JP | 11-27134 | 1/1999 |

* cited by examiner

*Primary Examiner*—Anh Q. Tran
(74) *Attorney, Agent, or Firm*—McGinn IP Law Group, PLLC

(57) ABSTRACT

Semiconductor integrated circuit devices that operate under different power supply voltages are directly interconnected by a bidirectional bus which is a transmission line. A driver is of a push-pull type and a reception side is CTT-terminated. If a terminating resistor is in conformity with the characteristic impedance of the transmission line, the on resistance of the driver is equal to or lower than the characteristic impedance. If the on resistance of the driver is in conformity with the characteristic impedance of the transmission line, the value of the terminating resistor is equal to or lower than the characteristic impedance of the transmission line. If the reception side is VTT-terminated, the value of the VTT is ½ of a lower one of power supply voltages that are supplied to the respective semiconductor integrated circuit devices. The value of the terminating resistor is in conformity with the characteristic impedance of the transmission line. The semiconductor integrated circuit devices use a common reference voltage for determining the signal voltage.

39 Claims, 26 Drawing Sheets

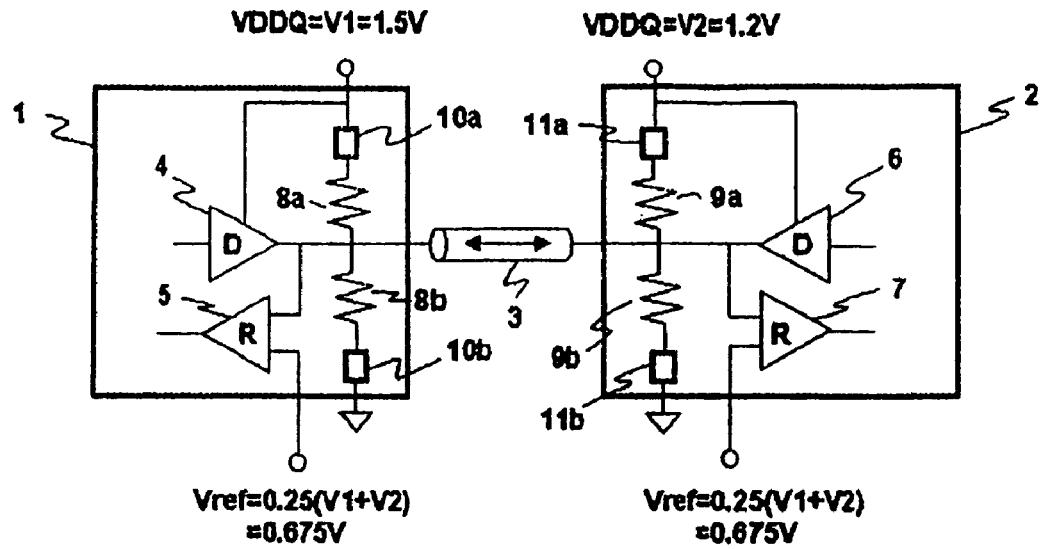
F I G. 9
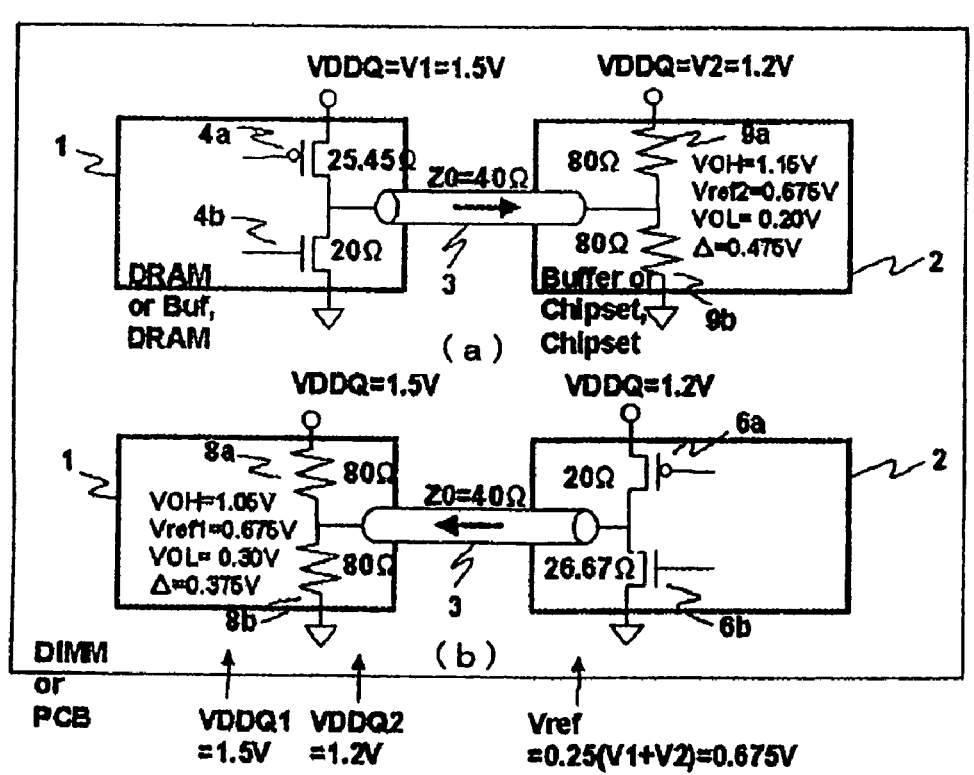
F I G. 10

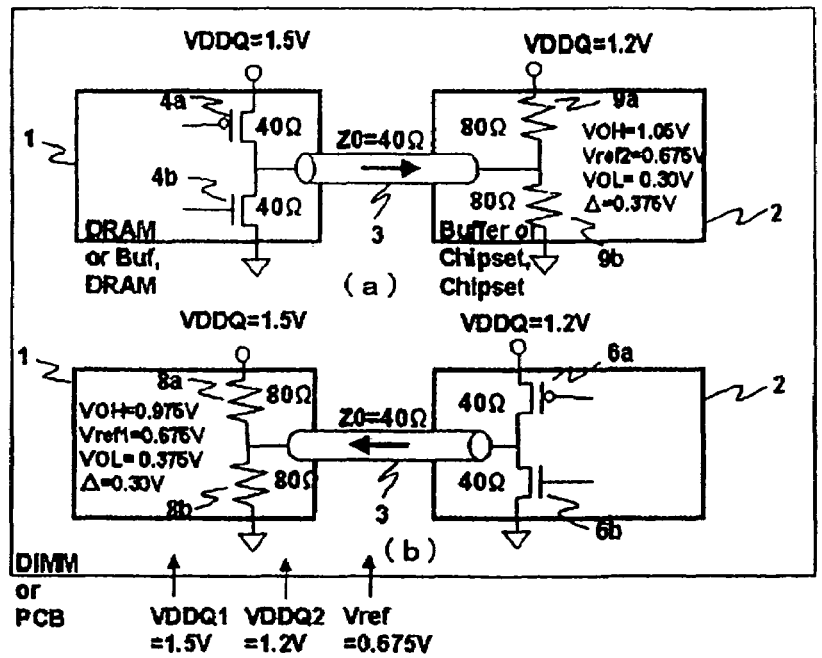
F I G. 1 5
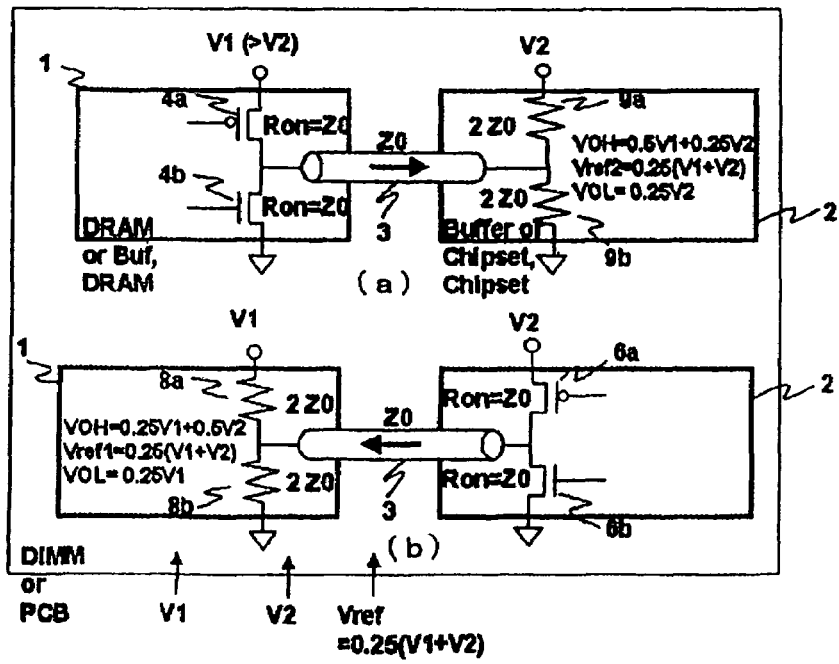
F I G. 1 6

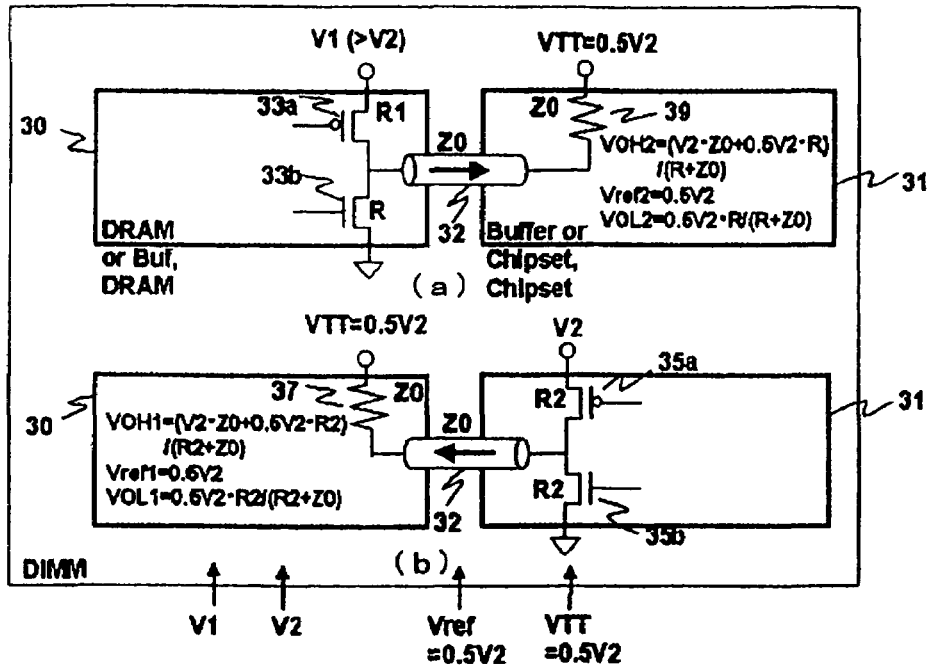
R1=2V1(R+Z0)/V2 - (2Z0+R)    FIG. 21
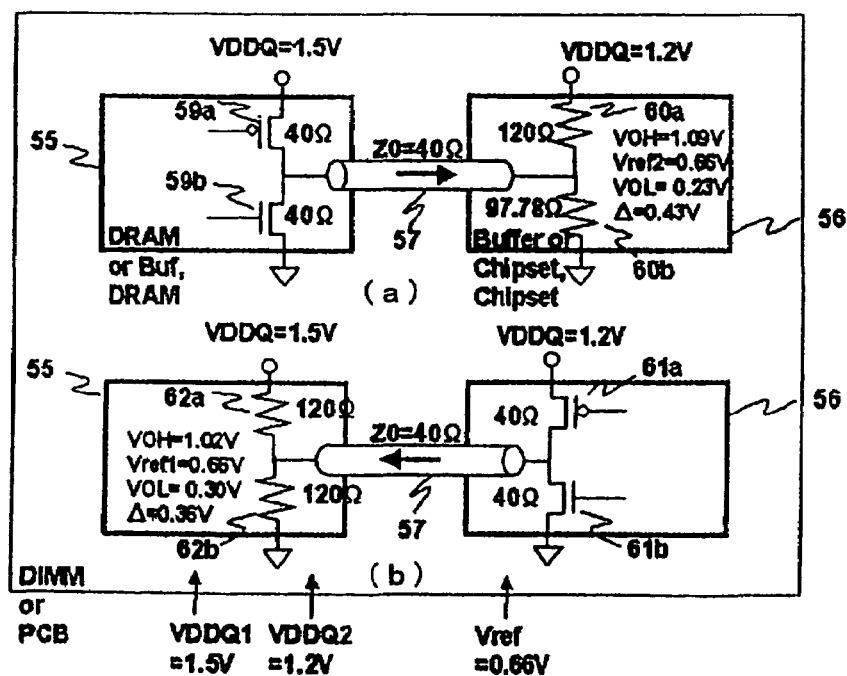
FIG. 22

$R1=2R \cdot Ron(V1 \cdot Ron + 0.5V2 \cdot R)$
$/(V2 \cdot R \cdot Ron + R \cdot R \cdot V1 + 4Ron \cdot Ron \cdot V2 - R \cdot R \cdot V2 - 2Ron \cdot Ron \cdot V1)$
$VOH2=(R \cdot R1 \cdot V1+R1 \cdot Ron \cdot V2)/(R \cdot R1+R1 \cdot Ron+R \cdot Ron)$
$VOL2=R1 \cdot Ron \cdot V2/(R \cdot R1+R \cdot Ron+R1 \cdot Ron)$

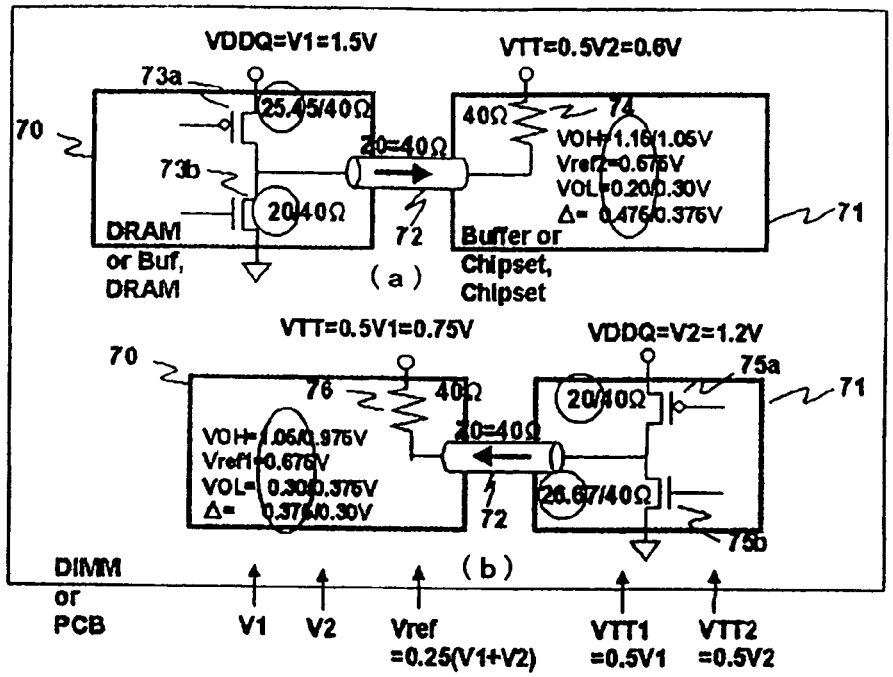
F I G. 27
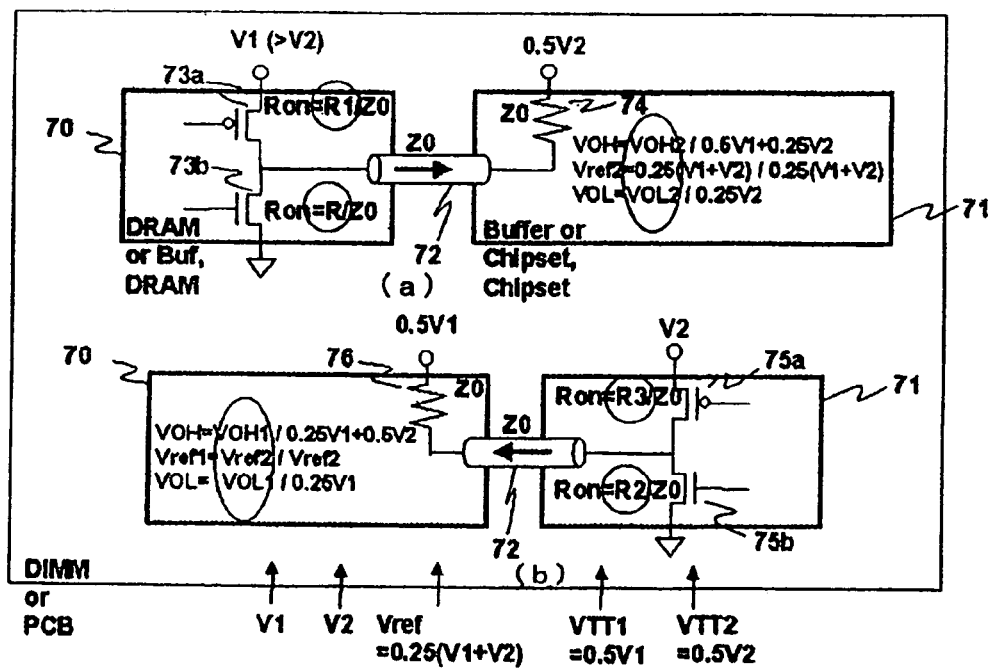
F I G. 28

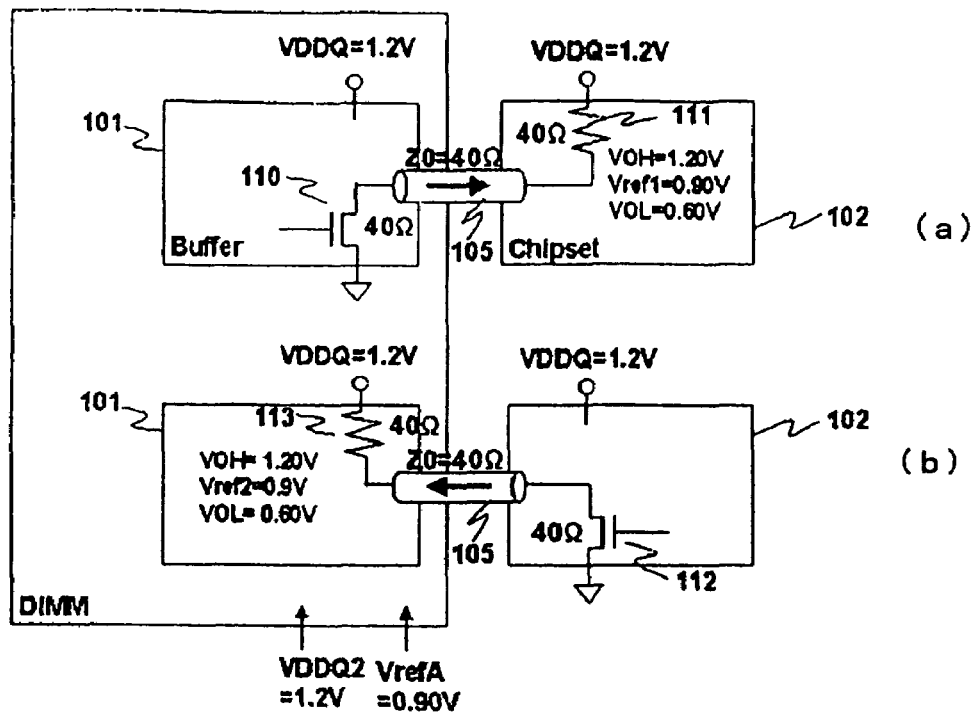
F I G. 4 1
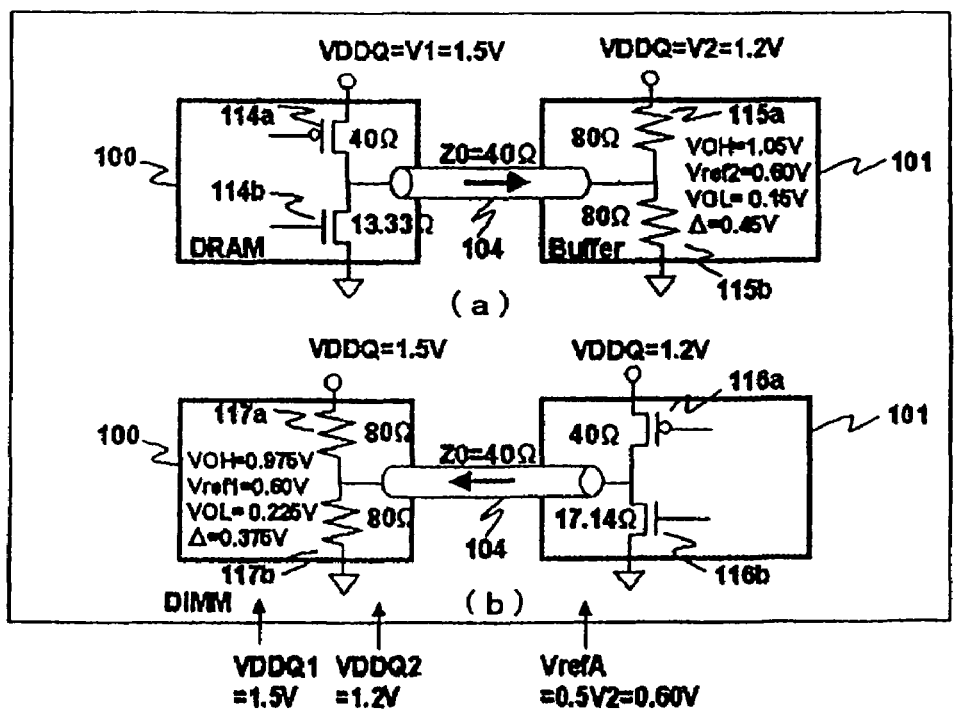
F I G. 4 2

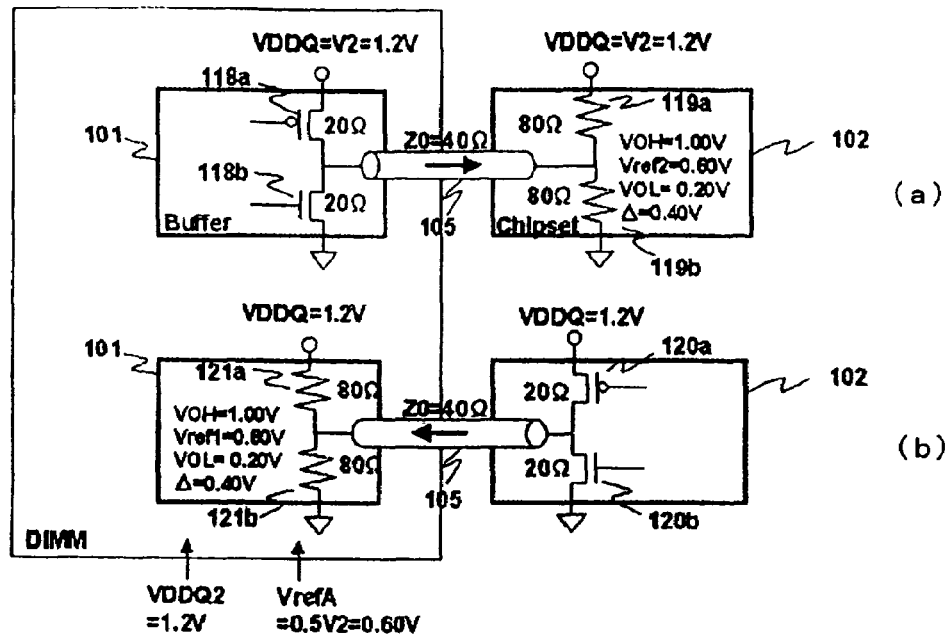
F I G. 43
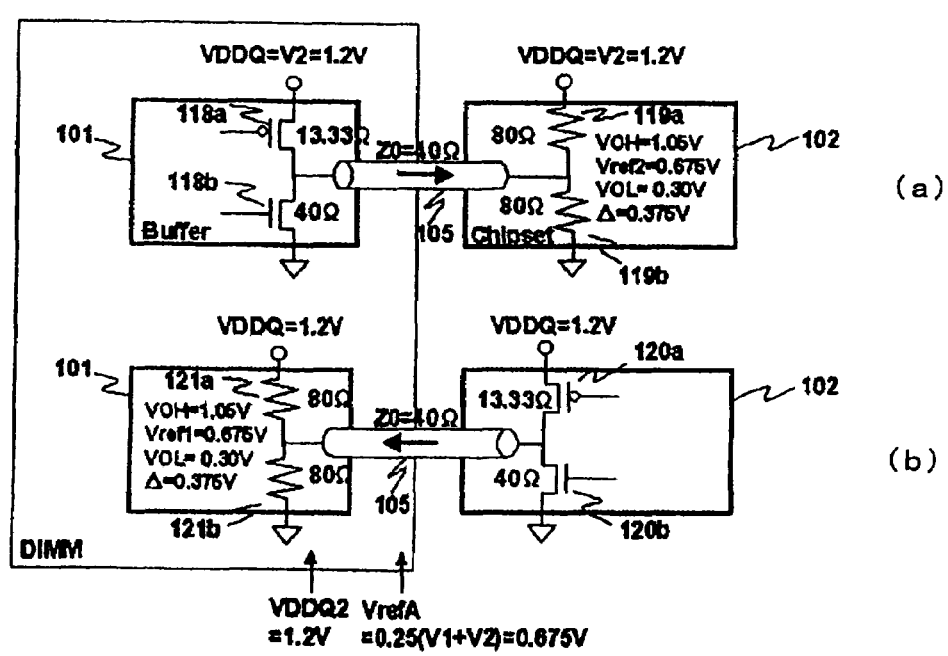
F I G. 44

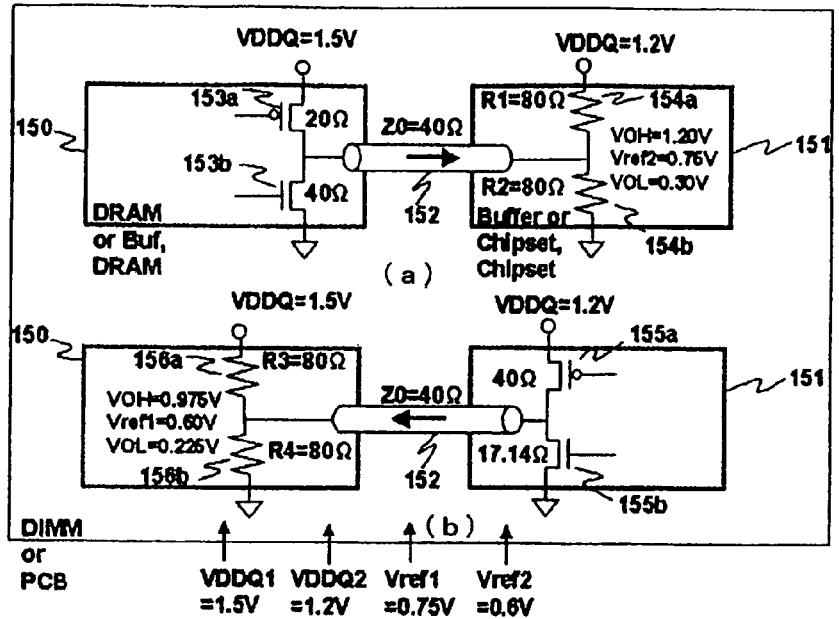
F I G. 53
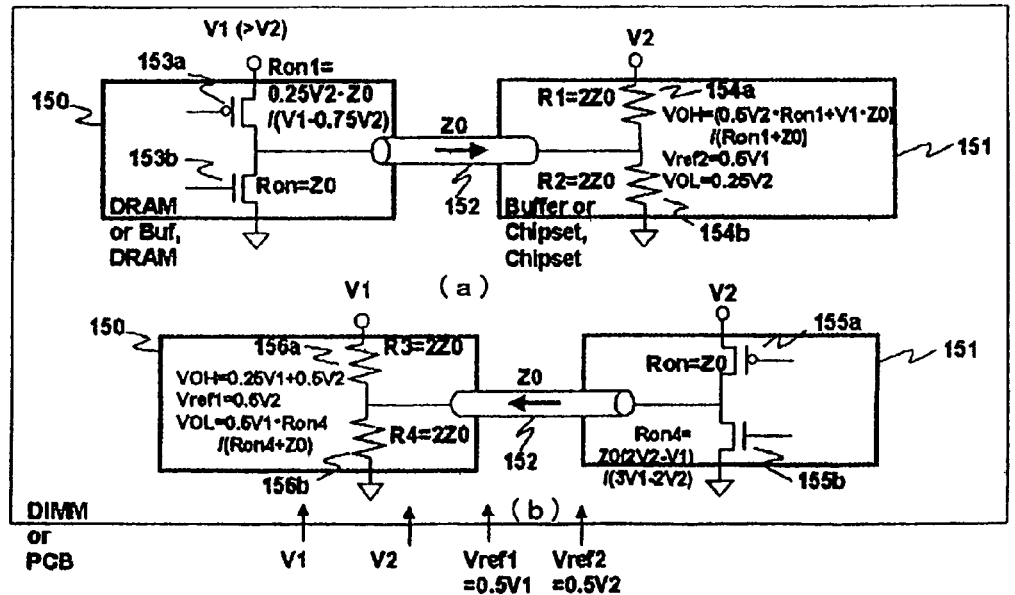
F I G. 54

SIGNAL TRANSMITTING SYSTEM

BACKGROUND OF THE INVENTION

1. Field of the Invention

The present invention relates to a signal transmission system for transmitting a signal between a plurality of semiconductor integrated circuit devices that operate under different power supply voltages.

2. Description of the Related Art

There has heretofore been a system which is required to transmit a signal between semiconductor integrated circuit devices that operate under different power supply voltages. FIG. 1 shows a conventional arrangement of such a system. The system shown in FIG. 1 transmits a single-ended signal between a 1.8-V semiconductor integrated circuit device (LSI 1) and a 1.5-V semiconductor integrated circuit device (LSI 3). A voltage converter LSI (LSI 2) for converting voltages is provided between the 1.8-V semiconductor integrated circuit device and the 1.5-V semiconductor integrated circuit device for relaying a signal to be sent and received between LSI 1 and LSI 3. LSI 1 and LSI 2 are interconnected by a transmission line having characteristic impedance Z01, and LSI 2 and LSI 3 are interconnected by a transmission line having characteristic impedance Z02. Specific examples of the voltage converter LSI for converting voltages are described in Japanese laid-open patent publication No. 8-288828 and Japanese laid-open patent publication No. 11-27134.

FIG. 2 shows another conventional system which is required to transmit a signal between semiconductor integrated circuit devices that operate under different power supply voltages. The system shown in FIG. 2 transmits a single-ended signal between a 1.5-V semiconductor integrated circuit device (hereinafter also referred to as "LSI") and 1.2-V LSI. The 1.2-V LSI comprises a receiver (having an oxide film or the like formed to a thickness capable of withstanding 1.5 V) operable by a 1.5-V power supply and an internal circuit operable under 1.2 V. By being supplied with both power supply voltages of 1.5 V and 1.2 V, the 1.2-V LSI is allowed to transmit a signal to and from the 1.5-V LSI. While FIG. 2 illustrates an example wherein a signal is transmitted from the 1.5-V LSI to the 1.2-V LSI, the actual signal transmission system is capable of bidirectionally sending and receiving signals.

FIG. 3 shows a specific signal transmission system having uniform power supply voltages to be supplied to components required to perform the signal transmission shown in FIG. 2. FIG. 3(a) shows an arrangement for transmitting a single-ended signal from 1.5-V LSI (DRAM) to 1.2-V LSI having a driver and a receiver which are supplied with 1.5 V, and FIG. 3(b) shows an arrangement for performing a reversed signal transmission. The LSIs are mounted on respective PCBs (Printed Circuit Boards) and interconnected by a transmission line having a characteristic impedance Z0 of 50 ?. The driver for sending a signal comprises a pMOS and an nMOS transistors which are pushpull-connected (push-pull configuration), and has an on-resistance of 20 ?. The receiver for receiving a signal is terminated with CTT (Center Tapped Termination, which may be referred to as Thevenin termination). The value of the terminating resistor of the CTT circuit is equalized to the characteristic impedance Z0 for impedance matching. The value of the terminating resistor of the CTT circuit is the same as the value obtained when the illustrated upper and lower resistors of the CTT circuit are connected parallel to each other. If the values of the power supply voltages (VDDQ) to be supplied to the driver and the receiver that are used for signal transmission are thus uniformized, then the system is capable of sending and receiving a signal without fail.

FIG. 4 shows an arrangement wherein semiconductor integrated circuit devices, each having a driver and a receiver, which are operable under different power supply voltages are connected in series with each other for bidirectionally transmitting a single-ended signal. Although there appears to be no system which would employ the arrangement shown in FIG. 4, the illustrated arrangement is used to assist in understanding the present invention. In FIG. 4, squares represent switches which are turned off when a signal is to be sent. In FIG. 4, the driver comprises a pMOS and an nMOS transistors which are push-pull-connected, and the receiver is terminated with CTT.

With this arrangement, since different power supply voltages (VDDQ) are supplied to the two LSIs for sending and receiving a signal, different reference voltages Vref are supplied to the respective receivers as threshold values for determining input voltages.

FIG. 5 shows a specific arrangement of the signal transmission system shown in FIG. 4. In FIG. 5, as with FIG. 3, the driver comprises a PMOS and an nMOS transistors which are push-pull-connected, the receiver is terminated with CTT, the driver has an on-resistance of 20 ?, the transmission line has a characteristic impedance of 50 ?, and the terminating resistor of the receiver has a value of 50 ?. FIG. 5(a) shows an equivalent circuit for sending a single-ended signal from the 1.5-V LSI, and FIG. 5(b) shows an equivalent circuit for sending a single-ended signal from the 1.2-V LSI.

As shown in FIG. 5(a), for sending a signal from the 1.5-V LSI, the output signal has a high level VOH of 1.24 V and a low level VOL of 0.17 V, and the reference voltage Vref set to an intermediate value between VOH and VOL is 0.71 V. Therefore, the reference voltage Vref for receiving the signal with the 1.2-V LSI is 0.71V.

As shown in FIG. 5(b), for sending a signal from the 1.2-V LSI, the output signal has a high level VOH of 1.07 V and a low level VOL of 0.21 V, and the reference voltage Vref set to an intermediate value between VOH and VOL is 0.64 V. Therefore, the reference voltage Vref for receiving the signal with the 1.5-V LSI is 0.64V.

FIG. 6 shows an arrangement wherein semiconductor integrated circuit devices (1.5-V LSI and 1.2-V LSI 3), each having a driver and a receiver, which are operable under different power supply voltages are connected in series with each other for bidirectionally transmitting a single-ended signal. Although there appears to be no system which would employ the arrangement shown in FIG. 6, the illustrated arrangement is used to assist in understanding the present invention. In FIG. 6, squares represent switches which are turned off when a signal is to be sent. In FIG. 6, the driver comprises a pMOS and an nMOS transistors which are push-pull-connected, and the receiver is of an arrangement (CTT-terminated circuit) having an input terminal pulled up to a terminating voltage VTT. FIG. 6 also shows an arrangement having 1.2-V LSI operable under a 1.2-V power supply for transmitting a signal between the 1.2-V LSI 3 and the 1.2-V LSI.

Even with the above arrangement, since the power supply voltages (VDDQ) supplied to the 1.5-V LSI and the 1.2-V LSI 3 for sending and receiving a signal are different from each other, reference voltages Vref as threshold values for determining an input voltage and values of VTT, which are supplied to the receiver, are different from each other.

FIG. 7 shows a specific arrangement of the signal transmission system shown in FIG. 6. In FIG. 7, the driver comprises a pMOS and an nMOS transistors which are push-pull-connected, the receiver is pulled up to VTT by a terminating resistor, the driver has an on-resistance of 20 ?, the transmission line has a characteristic impedance of 40 ?, and the terminating resistor of the receiver has a value of 40 ?. FIG. 7(a) shows an equivalent circuit for transmitting a single-ended signal from the 1.5-V LSI, and FIG. 7(b) shows an equivalent circuit for transmitting a single-ended signal from the 1.2-V LSI 3.

As shown in FIG. 7(a), for sending a signal from the 1.5-V LSI, the output signal has a high level VOH of 1.25 V and a low level VOL of 0.25 V, and the reference voltage Vref set to an intermediate value between VOH and VOL is 0.75 V. Therefore, the reference voltage Vref for receiving the signal with the 1.2-V LSI is 0.75V.

As shown in FIG. 7(b), for sending a signal from the 1.2-V LSI 3, the output signal has a high level VOH of 1.00 V and a low level VOL of 0.20 V, and the reference voltage Vref set to an intermediate value between VOH and VOL is 0.60 V. Therefore, the reference voltage Vref for receiving the signal with the 1.5-V LSI is 0.60V.

The foregoing signal transmission systems suffer the following problems:

First, the arrangement having the voltage converter LSI as shown in FIG. 1 is problematic in that since the propagation speed of signals is reduced by the voltage converter LSI, the system performance is lowered. Furthermore, the cost of the system increases because the number of parts used is increased by using the voltage converter LSI.

The arrangement wherein the 1.5-V power supply is supplied to the 1.2-V LSI shown in FIG. 2 is problematic in that the LSI fabrication process tends to be complex because of the need for a process for making the oxide film partially thick. Another problem is that terminals are required to supply the 1.5-V power supply, and the cost of the 1.2-V LSI is increased due to an increase in the LSI package size and the number of terminals.

The arrangement as shown in FIG. 4, wherein the semiconductor integrated circuit devices that operate under different power supply voltages are directly interconnected for bidirectionally transmitting a signal, requires two types of reference voltages Vref. Therefore, relatively expensive reference voltage generating circuits are needed, and two types of interconnection patterns for reference voltages of different potentials are required, resulting in an increased number of layers in the PCB and hence an increased system cost. Though two types of reference voltages are required, if a reference voltage Vref that is actually supplied is limited to either one of them, then the following problem arises:

In the example shown in FIG. 5, 0.71 V and 0.64 V are used as the reference voltages Vref. If the reference voltage Vref supplied to the two LSIs is set to 0.64 V, for example, then the 1.5-V LSI is not affected, but since the reference voltage Vref for the 1.2-V LSI is lowered, the 1.2-V LSI is affected as shown in FIG. 8.

Specifically, when the received signal goes high, the input circuit (receiver) responds more quickly than when the reference voltage Vref of 0.71 V is supplied. However, when the input signal goes low, the input circuit (receiver) responds more slowly than when the reference voltage Vref of 0.71 V is supplied, resulting in a timing skew in the input circuit.

If the received signal has a rise time tR and a fall time tF, both of about 250 ps, then the timing skew is 33 ps. This value corresponds to 5.2% of an eye window (bit time)=625 ps of a signal which has a transmission rate of 1.6 Gbps, and cannot be ignored. If the timing skew increases due to a reduction in the reference voltage Vref, then the possibility of an error becomes higher.

The other arrangement as shown in FIG. 6, wherein the semiconductor integrated circuit devices that operate under different power supply voltages are directly interconnected for bidirectionally transmitting a signal, also requires two types of reference voltages Vref and terminating voltages VTT. Therefore, two types of reference voltage generating circuits and VTT generating circuits are needed, and two types of interconnection patterns for reference voltages having different potentials and terminating voltages VTT are needed. As there is a possibility for an increased number of PCB layers, the system cost tends to rise.

Though there are two types of reference voltages and terminating voltages VTT, if a reference voltage Vref and a terminating voltage VTT that are actually supplied are limited to either one of them, then the same problem as with FIG. 5 arises.

SUMMARY OF THE INVENTION

It is an object of the present invention to provide a signal transmission system which suppresses a timing skew between semiconductor integrated circuit devices that operate under different power supply voltages and also prevents an increase in the cost.

To achieve the above object, a signal transmission system according to the present invention has semiconductor integrated circuit devices that operate under different power supply voltages which are directly interconnected by a bidirectional bus serving as a transmission line. A driver on a signal transmission side is of a push-pull type, and a signal reception side is terminated with a CTT (Center Tapped Termination). If a terminating resistor Rterm is in conformity with the characteristic impedance Z0 of the transmission line for impedance matching, the on resistance Ron of the driver is equal to or lower than the characteristic impedance Z0 for maintaining a signal amplitude. If the on resistance Ron of the driver is in conformity with the characteristic impedance Z0 of the transmission line for impedance matching, the terminating resistor Rterm is equal to or lower than the characteristic impedance Z0 for maintaining a signal amplitude.

In order to reduce the number of power supplies, the values of reference voltages Vref used to determine an input voltage which are supplied to the respective semiconductor integrated circuit devices are brought into conformity with each other. Preferably, the values of the reference voltages Vref are set to 0.25 (V1+V2), making it easy to generate the reference voltages Vref. V1 and V2 represent power supply voltages VDDQ supplied to the semiconductor integrated circuit devices which send and receive signals.

In view of the ease with which to design a printed board and signal integrity, the path of return current flowing through the transmission line comprises a common ground conductor (ground plane) shared by the semiconductor integrated circuit devices. The signal to be transmitted may be a single-ended signal or a differential signal. If a differential signal is to be transmitted, two reception ends may be terminated by a bridge joined by a resistance value which is twice the ODD mode impedance, dispensing with the reference voltage Vref.

Another signal transmission system according to the present invention has semiconductor integrated circuit devices that operate under different power supply voltages which are directly interconnected by a bidirectional bus serving as a transmission line. A driver is of a push-pull type, and a signal reception side is terminated with a VTT. The value of the VTT is ½ of a lower one VDDQ (low VDDQ) of power supply voltages supplied to the respective semiconductor integrated circuit devices which send and receive signals. The terminating resistor Rterm is in conformity with the characteristic impedance Z0 of the transmission line for impedance matching.

In order to reduce the number of power supplies, the values of reference voltages used in the respective semiconductor integrated circuit devices are brought into conformity with each other. Preferably, the values of the reference voltages are set to 0.5V2, making it easy to generate the reference yyvoltages. V2 represents the low VDDQ.

In view of the ease in designing a printed board and signal integrity, the path of return current flowing through the transmission line comprises a common ground plane shared by the semiconductor integrated circuit devices.

With the above signal transmission system, since a semiconductor integrated circuit device for voltage conversion is not required, the types of power supply voltages supplied to the semiconductor integrated circuit devices are prevented from increasing.

By bringing the terminating resistor Rterm or the on resistance Ron into conformity with the characteristic impedance of the transmission line and using the ground plane shared by the semiconductor integrated circuit devices as the path of the return current flowing through the transmission line, the signal can be transmitted with good signal integrity. Furthermore, by using the same value of reference voltage in the semiconductor integrated circuit devices, the types of power supplies are reduced and the number of layers of the printed board is reduced. Since the value of an optimum reference voltage can be used at all times, the timing skew in an input circuit section is reduced.

Furthermore, inasmuch as the value of the reference voltage is set to a value that can easily be generated (e.g., 0.25 (V1+V2)), a circuit for generating the reference voltage is simple.

If the reception side uses a bridge termination for the transmission of a differential signal, then since no reference voltage is required, no conventional considerations for the reference voltage are necessary.

Consequently, there is obtained a signal transmission system which is of good signal integrity, has a reduced timing skew, and prevents cost increases.

The above and other objects, features, and advantages of the present invention will become apparent from the following description with reference to the accompanying drawings which illustrate examples of the present invention.

BRIEF DESCRIPTION OF THE DRAWINGS

FIG. 9 is a block diagram of an arrangement of a first working example of a signal transmission system according to the present invention;

FIG. 10 is a circuit diagram of an arrangement of a first embodiment of a signal transmission system according to the present invention;

FIG. 15 is a circuit diagram of an arrangement of a third embodiment of a signal transmission system according to the present invention;

FIG. 16 is a circuit diagram of an arrangement of a generalized circuit of the signal transmission system according to the third embodiment shown in FIG. 15;

FIG. 21 is a circuit diagram of an arrangement of a generalized circuit of the signal transmission system according to the fourth embodiment shown in FIG. 20;

FIG. 22 is a circuit diagram of an arrangement of a fifth embodiment of a signal transmission system according to the present invention;

FIG. 27 is a circuit diagram of an arrangement of an eighth embodiment of a signal transmission system according to the present invention;

FIG. 28 is a circuit diagram of an arrangement of a generalized circuit of the signal transmission system according to the eighth embodiment shown in FIG. 27;

FIG. 41 is a circuit diagram of an arrangement of an eighteenth embodiment of a signal transmission system according to the present invention;

FIG. 42 is a circuit diagram of an arrangement of a nineteenth embodiment of a signal transmission system according to the present invention;

FIG. 43 is a circuit diagram of an arrangement of a twentieth embodiment of a signal transmission system according to the present invention;

FIG. 44 is a circuit diagram of an arrangement of a twenty-first embodiment of a signal transmission system according to the present invention;

FIG. 53 is a circuit diagram of an arrangement of a twenty-eighth embodiment of a signal transmission system according to the present invention; and FIG. 54 is a circuit diagram of an arrangement of a generalized circuit of the signal transmission system according to the twenty-eighth embodiment shown in FIG. 53.

DETAILED DESCRIPTION OF THE PREFERRED EMBODIMENTS

Figure 1:
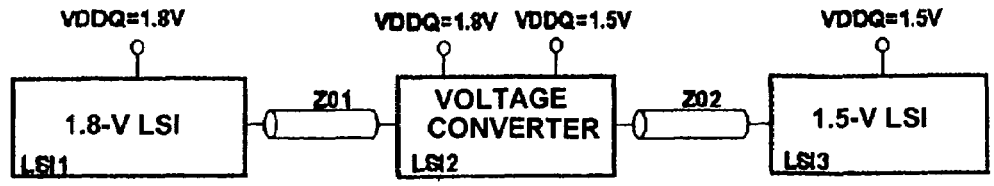
FIG. 1 is a block diagram of an arrangement of a conventional system which is required to transmit a signal between semiconductor integrated circuit devices that operate under different power supply voltages.
Figure 2:
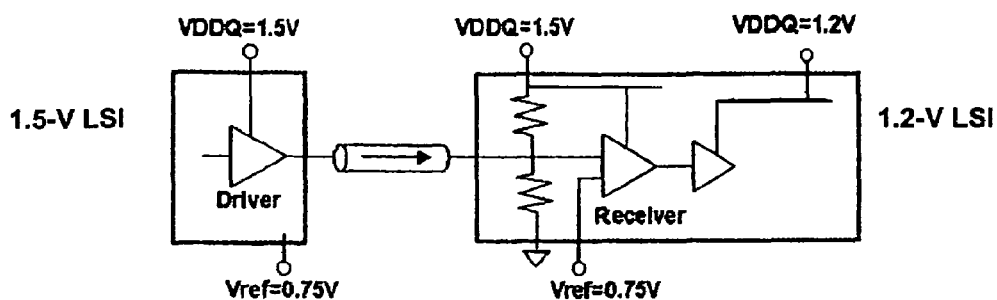
FIG. 2 is a block diagram of another arrangement of a conventional system which is required to transmit a signal between semiconductor integrated circuit devices that operate under different power supply voltages.

FIG. 9 is a block diagram of an arrangement of a first working example of a signal transmission system according to the present invention.

As shown in FIG. 9, the signal transmission system according to the first working example is of an arrangement wherein 1.5-V semiconductor integrated circuit device (LSI) 1 and 1.2-V semiconductor integrated circuit device (LSI) 2 are directly interconnected by bidirectional bus 3 which is a transmission line. 1.5-V LSI 1 has driver (D) 4, receiver (R) 5, resistors 8a and 8b forming a CTT termination, and switches 10a and 10b. 1.2-V LSI 2 has driver (D) 6, receiver (R) 7, resistors 9a and 9b that form a CTT termination, and switches 11a and 11b. In the signal transmission system according to the first working example, 1.5-V LSI 1 and 1.2-V LSI 2 are supplied with a common reference voltage Vref.

According to the first working example, for sending a signal from 1.5-V LSI 1 to 1.2-V LSI 2, the output of driver 6 of 1.2-V LSI 2 is set to a high impedance state, and switches 10a and 10b of 1.5-V LSI 1 are turned off. Conversely, for sending a signal from 1.2-V LSI 2 to 1.5-V LSI 1, the output of driver 4 of 1.5-V LSI 1 is set to a high impedance state, and switches 11a and 11b of 1.2-V LSI 2 are turned off. A reference voltage Vref1 to be referred to when a signal is to be sent from 1.2-V LSI 2 to 1.5-V LSI 1, and a reference voltage Vref2 to be referred to when a signal is to be sent from 1.5-V LSI 1 to 1.2-V LSI 2, are brought into conformity with each other. Specifically, they are set as Vref1=Vref2=0.25 (V1+V2) where V1 represents a higher power supply voltage VDDQ (1.5 V in FIG. 9) of power supply voltages VDDQ supplied to the two LSIs, and V2 represents a lower power supply voltage VDDQ (1.2 V in FIG. 9). Therefore, the reference voltage Vref1=Vref2=0.675 V.

The reference voltage Vref can be expressed using high and low levels of output signals from the LSIs. If the signal sent from 1.5-V LSI 1 has a high level VOH2 and a low level VOL2, then the reference voltage Vref2=0.5 (VOH2+VOL2). If the signal sent from 1.2-V LSI 2 has a high level VOH1 and a low level VOL1, then the reference voltage Vref1=0.5 (VOH1+VOL1). By thus setting the reference voltage Vref, two types of power supply voltages VDDQ and one type of reference voltage Vref are sufficient, and the reference voltage Vref can easily be generated.

While FIG. 9 shows an arrangement for sending and receiving a single-ended signal, an arrangement for sending and receiving a differential signal may be employed. In such an arrangement, the components shown in FIG. 9 may be provided for a true signal system and a bar signal system. Furthermore, as described later, a bridge termination (bridge terminating circuit) may be used between a true signal and a bar signal.

FIG. 10 is a circuit diagram of an arrangement of a first embodiment of a signal transmission system according to the present invention.

FIG. 10 shows a specific example of the signal transmission system according to the first working example, for sending and receiving a single-ended signal. FIG. 10(a) shows an equivalent circuit for sending a signal from 1.5-V LSI 1 to 1.2-V LSI 2, and FIG. 10(b) shows an equivalent circuit for sending a signal from 1.2-V LSI 2 to 1.5-V LSI 1.

In FIG. 10, switches that are turned off, receivers, and drivers that are set to a high impedance state on the signal reception side that do not contribute to the values of potentials, are omitted from the illustration, and the resistances of switches that are turned on, are included in the values of resistors 8a, 8b, 9a and 9b.

The driver for sending a signal comprises a pMOS and an nMOS transistors which are push-pull-connected. Bidirectional bus 3 which is a transmission line has a characteristic impedance Z0 of 40 ?, and the receiver for receiving a signal is CTT-terminated.

In the signal transmission system according to the first embodiment, for sending a signal from 1.5-V LSI 1, the values of resistors 9a and 9b forming a CTT termination on the signal reception side are set to 2Z0=80 ?. The value of the terminating resistor is the same as the value obtained when resistors 9a and 9b are connected parallel to each other, and is 40 ?. Therefore, the signal reception end and bidirectional bus 3 are impedance-matched.

The on resistance of the nMOS transistor of the driver is set to a value equal to or lower than the characteristic impedance of bidirectional bus 3, e.g., 20 ?, and the on resistance of the PMOS transistor of the driver is set to 25.45 ?. In this manner, VOH2=1.15 V, VOL2=0.2 V, and the reference voltage Vref2 is 0.675 V. In this case, since a signal amplitude value ? with respect to the reference voltage Vref2 is 0.475 V, the signal amplitude value is sufficiently maintained.

For sending a signal from 1.2-V LSI 2, the values of resistors 8a and 8b forming a CTT termination on the signal reception side are set to 2Z0= 80 ?. The value of the terminating resistor is the same as the value obtained when resistors 8a and 8b are connected parallel to each other, and is 40 ?. Therefore, the signal reception end and bidirectional bus 3 are impedance-matched.

The on resistance of the pMOS transistor of the driver is set to a value equal to or lower than the characteristic impedance of bidirectional bus 3, e.g., 20 ?, and the on resistance of the nMOS transistor of the driver is set to 26.67 ?. In this manner, VOH1=1.05 V, VOL2=0.3 V, and the reference voltage Vref1 is 0.675 V, which is in conformity with the value of Vref2. Since a signal amplitude value ? with respect to the reference voltage Vref1 is 0.375 V, the signal amplitude value is sufficiently maintained.

The path of return current of a signal flowing on bidirectional bus 3 is a ground plane which is common to 1.5-V LSI 1 and 1.2-V LSI 2. This makes it easy to design a printed board. If the power supply voltage VDDQ is used as the path of return current, then since the 1.5-V power supply and the 1.2-V power supply need to be used as the path of return current, problems arise which make the layout of interconnections difficult and increase the number of layers of the printed board. Therefore, it is preferable that the path of return current of a signal flowing on bidirectional bus 3 be a ground plane.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. Furthermore, because the reference voltage Vref is set to 0.25 (V1+V2), a reference voltage generating circuit for generating the reference voltage Vref can easily be arranged. Therefore, the cost of the system can be lowered. As the value of the reference voltage Vref does not deviate largely from the value of ½ of the power supply voltages VDDQ, a sufficient voltage is applied between the drain and source of the pMOS transistor and the nMOS transistor of each driver, enabling efficient operation of the pMOS and the nMOS transistors. Moreover, since their input/output capacities can be reduced, they can be used in a circuit which is required to operate at a high speed. 1.5-V LSI 1 and 1.2-V LSI 2 may be combined as DRAM and buffer, buffer and chipset, DRAM and chipset, etc. 1.5-V LSI 1 and 1.2-V LSI 2 may be installed on a DIMM (Dual In-line Memory Module) or a PCB, one of the LSIs may be installed on a DIMM and the other LSI on a PCB or a motherboard. They may be used in various applications.

In FIG. 10, an on-die termination disposed in the LSI is illustrated as the resistors for use as a termination. However, the resistors for use as a termination may be added to the LSI. In FIG. 10, the LSIs are interconnected point-to-point using the bidirectional bus. However, the system may be applied to a fly-by (or daisy-chain) bus configuration wherein a plurality of LSIs are connected in a transmission line, or an arrangement wherein a plurality of stubs are provided in a bus, with an LSI connected to each stub. These arrangements are also applicable to various embodiments to be described below.

Figure 11A:
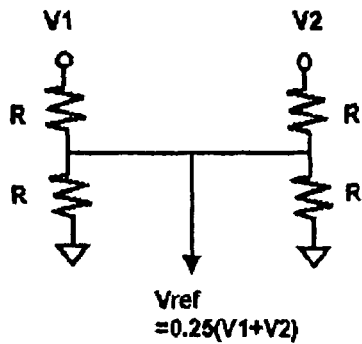
FIG. 11 is a circuit diagram of an arrangement of reference voltage generating circuits for use in the signal transmission system shown in FIG. 10.
Figure 11B:
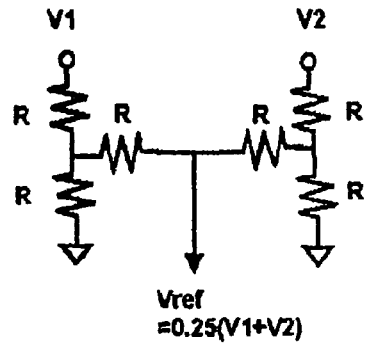

FIGS. 11A and 11B are circuit diagrams of arrangements of reference voltage generating circuits for use in the signal transmission system according to the first embodiment shown in FIG. 10.

FIGS. 11A and 11B show circuits for generating the reference voltage Vref1=0.25 (V1+V2). FIG. 11A shows a circuit for generating the reference voltage Vref using four resistors having the same value, and FIG. 11B shows a circuit for generating the reference voltage Vref using six resistors having the same value. Each of the resistors R can be selected depending on the varying tendency of its value. These simple arrangements make it possible to generate the reference voltage Vref.

Figure 12:
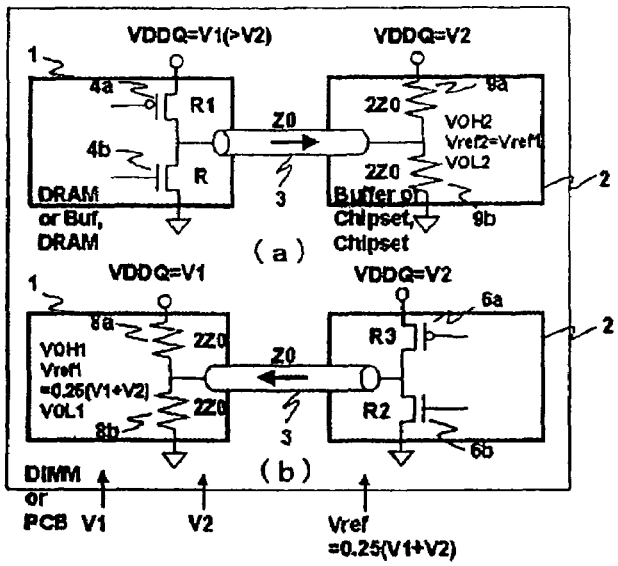
FIG. 12 is a circuit diagram of an arrangement of a generalized circuit of the signal transmission system according to the first embodiment shown in FIG. 10.

FIG. 12 shows a generalized circuit of the signal transmission system according to the first embodiment shown in FIG. 10.

FIG. 12(a) shows an equivalent circuit for sending a signal from LSI 1 having a power supply voltage VDDQ=V1 system to LSI 2 having a power supply voltage VDDQ=V2 system, and FIG. 12(b) shows an equivalent circuit for sending a signal from V2 LSI 2 to V1 LSI 1. In FIG. 12, V1>V2. Switches that are turned off, receivers, and drivers that are set to a high impedance state on the signal reception side that do not contribute to the values of potentials, are omitted from the illustration, and the resistances of switches that are turned on, are included in the values of the resistors forming the terminating resistor.

The driver for sending a signal comprises a pMOS and an nMOS transistors which are push-pull-connected. Bidirectional bus 3 which is a transmission line has a characteristic impedance Z0, and the receiver for receiving a signal is CTT-terminated.

For sending a signal from V1 LSI 1, the values of resistors 9a and 9b forming a CTT termination on the signal reception side are set to 2Z0. Since the value of the terminating resistor is the same as the value obtained when resistors 9a and 9b are connected parallel to each other, the signal reception end and bidirectional bus 3 are impedance-matched.

The on resistance of nMOS transistor 4b of the driver is set to a value equal to or lower than the characteristic impedance of bidirectional bus 3, i.e., R ?, and the on resistance of pMOS transistor 4a of the driver is set to R1 ? so that the reference voltage Vref=0.25 (V1+V2). At this time, R1 becomes:

$$R1=Z0(V2 \cdot Z0-V1 \cdot R-V1 \cdot Z0)/(V2 \cdot R-V1 \cdot Z0-V1 \cdot R)$$

The high level VOH2 and low level VOL2 of the transmission signal are given as:

$$VOH2=(V1-0.5V2)Z0/(R1+Z0)+0.5V2$$

$$VOL2=0.5V2 \cdot R/(Z0+R)$$

For sending a signal from V2 LSI 2, the values of resistors 8a and 8b forming a CTT termination on the signal reception side are set to 2Z0 as is the case with the foregoing operation. Since the value of the terminating resistor is the same as the value obtained when resistors 8a and 8b are connected parallel to each other, the signal reception end and bidirectional bus 3 are impedance-matched.

The on resistance of pMOS transistor 6a of the driver is set to a value equal to or lower than the characteristic impedance of bidirectional bus 3, i.e., R3 ?, and the on resistance of nMOS transistor 6b of the driver is set to R2 ? so that Vref=0.25 (V1+V2). At this time, R2 becomes:

$$R2=Z0(V1 \cdot Z0+V2 \cdot R3-V2 \cdot Z0)/(V1 \cdot R3+V2 \cdot Z0-V0-R3)$$

The high level VOH1 and low level VOL1 of the transmission signal are given as:

$$VOH1=(V2-0.5V1)Z0/(R3+Z0)+0.5V1$$

$$VOL1=0.5V1 \cdot R2/(Z0+R2)$$

The path of return current of a signal flowing on bidirectional bus 3 is a ground plane which is common to V1 LSI 1 and V2 LSI 2. This makes it easy to design a printed board. If the power supply voltage VDDQ is used as the path of return current, then since the V1 power supply and the V2 power supply need to be used as the path of return current, problems arise which make the layout of interconnections difficult and increase the number of layers of the printed board. Therefore, it is preferable that the path of return current of a signal flowing on bidirectional bus 3 be a ground plane. This also applies to the examples to be described below.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. Furthermore, because the reference voltage Vref is set to 0.25 (V1+V2), the reference voltage Vref can easily be generated. Therefore, the cost of the system can be lowered. As the value of the reference voltage Vref does not deviate largely from the value of ½ of the power supply voltages VDDQ, a sufficient potential is applied between the drain and source of the pMOS transistor and the nMOS transistor of each driver, enabling efficient operation of the pMOS and the nMOS transistors. Moreover, since their input/output capacities can be reduced, they can be used in a circuit which is required to operate at a high speed.

Figure 13:
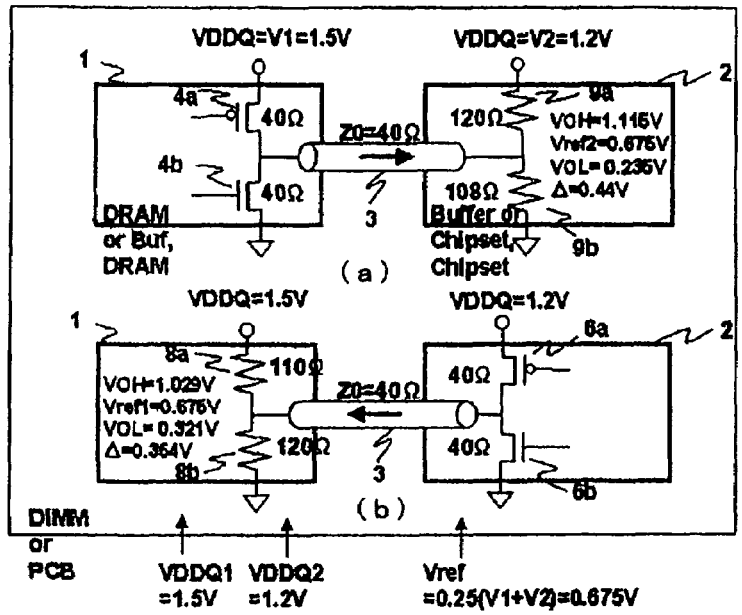
FIG. 13 is a circuit diagram of an arrangement of a second embodiment of a signal transmission system according to the present invention.

FIG. 13 is a circuit diagram of an arrangement of a second embodiment of a signal transmission system according to the present invention. FIG. 13 shows a specific example of the signal transmission system according to the first working example, for sending and receiving a single-ended signal. FIG. 13(a) shows an equivalent circuit for sending a signal from 1.5-V LSI 1 to 1.2-V LSI 2, and FIG. 13(b) shows an equivalent circuit for sending a signal from 1.2-V LSI 2 to 1.5-V LSI 1.

In FIG. 13, switches that are turned off, receivers, and drivers that are set to a high impedance state on the signal reception side that do not contribute to the values of potentials, are omitted from the illustration, and the resistances of switches that are turned on, are included in the values of resistors 8a, 8b, 9a and 9b.

The driver for sending a signal comprises a pMOS and an nMOS transistors which are push-pull-connected. Bidirectional bus 3 which is a transmission line has a characteristic impedance Z0 of 40 ?, and the receiver for receiving a signal is CTT-terminated.

In the signal transmission system according to the second embodiment, for sending a signal from 1.5-V LSI 1, the on resistance of pMOS transistor 4a of the driver and the on resistance of nMOS transistor 4b of the driver thereof are set to 40 ? in conformity with the characteristic impedance of bidirectional bus 3. According to the present embodiment, therefore, the on resistance of the driver and bidirectional bus 3 are impedance-matched.

The value of resistor 9a which terminates the reception side is set to a value equal to or higher than twice the characteristic impedance of bidirectional bus 3, e.g., 120 ?, and the value of resistor 9b is set to 108 ?. With these settings, VOH2=1.115 V, VOL2=0.235V, and the reference voltage Vref2 is 0.675 V. In this case, since a signal amplitude value ? with respect to the reference voltage Vref2 is 0.44 V, the signal amplitude value is sufficiently maintained.

For sending a signal from 1.2-V LSI 2, the on resistance of pMOS transistor 6a of the driver and the on resistance of nMOS transistor 6b of the driver thereof are set to 40 ? in conformity with the characteristic impedance of bidirectional bus 3. According to the present embodiment, therefore, the on resistance of the driver and bidirectional bus 3 are impedance-matched.

The value of resistor 8b which terminates the reception side is set to a value equal to or higher than twice the characteristic impedance of bidirectional bus 3, e.g., 120 ?, and the value of resistor 8a is set to 110 ?. With these settings, VOH1=1.029 V, VOL1=0.321 V, and the reference voltage Vref1=0.675 V. In this case, since a signal amplitude value ? with respect to the reference voltage Vref1 is 0.354 V, the signal amplitude value is sufficiently maintained.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. Furthermore, because the reference voltage Vref is set to 0.25 (V1+V2), the reference voltage Vref can easily be generated. Therefore, the cost of the system can be lowered. As the value of the reference voltage Vref does not deviate largely from the value of ½ of the power supply voltages VDDQ, a sufficient voltage is applied between the drain and source of the pMOS transistor and the nMOS transistor of each driver, enabling efficient operation of the pMOS and the nMOS transistors. Moreover, since their input/output capacities can be reduced, they can be used in a circuit which is required to operate at a high speed.

Figure 14:
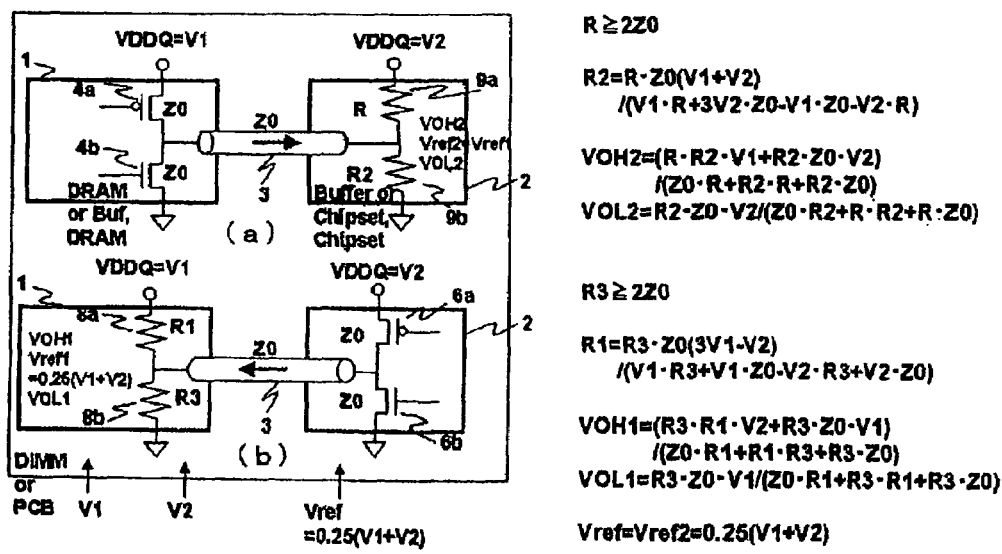
FIG. 14 is a circuit diagram of an arrangement of a generalized circuit of the signal transmission system according to the second embodiment shown in FIG. 13.

FIG. 14 shows a generalized circuit of the signal transmission system according to the second embodiment shown in FIG. 13.

FIG. 14(a) shows an equivalent circuit for sending a signal from LSI 1 having a power supply voltage VDDQ=V1 system to LSI 2 having a power supply voltage VDDQ=V2 system, and FIG. 14(b) shows an equivalent circuit for sending a signal from V2 LSI 2 to V1 LSI 1.

In FIG. 14, V1>V2. Switches that are turned off, receivers, and drivers that are set to a high impedance state on the signal reception side that do not contribute to the values of potentials, are omitted from the illustration, and the resistances of switches that are turned on, are included in the values of the resistors forming the terminating resistor.

The driver for sending a signal comprises a pMOS and an nMOS transistors which are push-pull-connected. Bidirectional bus 3 which is a transmission line has a characteristic impedance Z0, and the receiver for receiving a signal is CTT-terminated.

For sending a signal from V1 LSI 1, the on resistance of pMOS transistor 4a of the driver and the on resistance of nMOS transistor 4b of the driver thereof are set to Z0 in conformity with the characteristic impedance of bidirectional bus 3. According to the present embodiment, therefore, the on resistance of the driver and bidirectional bus 3 are impedance-matched.

The value of resistor 9a which terminates the reception side is set to a value equal to or higher than twice the characteristic impedance of bidirectional bus 3, e.g., R ?, and the value of resistor 9b is set to R2 ? so that the reference voltage Vref=0.25 (V1+V2). At this time, R2 becomes:

$$R2 = R \cdot Z0(V1+V2)/(V1 \cdot R + 3V2 \cdot Z0 - V1 \cdot Z0 - V2 \cdot R)$$

The high level VOH2 and low level VOL2 of the transmission signal are given as:

$$VOH2 = (R \cdot R2 \cdot V1 + R2 \cdot Z0 \cdot V2)/(Z0 \cdot R + R \cdot R2 + R2 \cdot Z0)$$

$$VOL2 = R2 \cdot Z0 \cdot V2/(Z0 \cdot R2 + R \cdot R2 + R \cdot Z0)$$

For sending a signal from V2 LSI 2, the on resistance of pMOS transistor 6a of the driver and the on resistance of nMOS transistor 6b of the driver thereof are set to Z0 in conformity with the characteristic impedance of bidirectional bus 3. According to the present embodiment, therefore, the on resistance of the driver and bidirectional bus 3 are impedance-matched.

The value of resistor 8b which terminates the reception side is set to a value equal to or higher than twice the characteristic impedance of bidirectional bus 3, e.g., R3 ?, and the value of resistor 8a is set to R1 ? so that the reference voltage Vref=0.25 (V1+V2). At this time, R1 becomes:

$$R1 = R3 \cdot Z0(3V1-V2)/(V1 \cdot R3 + V1 \cdot Z0 - V2 \cdot R3 + V2 \cdot Z0)$$

The high level VOH1 and low level VOL1 of the transmission signal are given as:

$$VOH1 = (R3 \cdot R1 \cdot V2 + R3 \cdot Z0 \cdot V1)/(Z0 \cdot R1 + R3 \cdot R1 + R3 \cdot Z0)$$

$$VOL1 = R3 \cdot Z0 \cdot V1/(Z0 \cdot R1 + R3 \cdot R1 + R3 \cdot Z0)$$

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. Furthermore, because the reference voltage Vref is set to 0.25 (V1+V2), the reference voltage Vref can easily be generated. Therefore, the cost of the system can be lowered. As the value of the reference voltage Vref does not deviate largely from the value of ½ of the power supply voltages VDDQ, a sufficient voltage is applied between the drain and source of the pMOS transistor and the nMOS transistor of each driver, enabling efficient operation of the pMOS and the nMOS transistors. Moreover, since their input/output capacities can be reduced, they can be used in a circuit which is required to operate at a high speed.

FIG. 15 is a circuit diagram of an arrangement of a third embodiment of a signal transmission system according to the present invention. FIG. 15 shows a specific example of the signal transmission system according to the first working example, for sending and receiving a single-ended signal. FIG. 15(a) shows an equivalent circuit for sending a signal from 1.5-V LSI 1 to 1.2-V LSI 2, and FIG. 15(b) shows an equivalent circuit for sending a signal from 1.2-V LSI 2 to 1.5-V LSI 1.

In FIG. 15, switches that are turned off, receivers, and drivers that are set to a high impedance state on the signal reception side that do not contribute to the values of potentials, are omitted from the illustration, and the resistances of switches that are turned on, are included in the values of resistors 8a, 8b, 9a and 9b.

The driver for sending a signal comprises a pMOS and an nMOS transistors which are push-pull-connected. Bidirectional bus 3 which is a transmission line has a characteristic impedance Z0 of 40 ?, and the receiver for receiving a signal is CTT-terminated.

In the signal transmission system according to the third embodiment, for sending a signal from 1.5-V LSI 1, the on resistance of pMOS transistor 4a of the driver and the on resistance of nMOS transistor 4b of the driver thereof are set to 40 ? in conformity with the characteristic impedance of bidirectional bus 3. The values of resistors 9a and 9b which terminate the reception side are set to a value which is twice the characteristic impedance of bidirectional bus 3, i.e., 80 ?. In this case, both the on resistance of the driver and the terminating resistor and bidirectional bus 3 are impedance-matched. With these settings, VOH2=1.05 V, VOL2=0.30 V, and the reference voltage Vref2 is 0.675 V. Consequently, since a signal amplitude value ? with respect to the reference voltage Vref2 is 0.375 V, the signal amplitude value is sufficiently maintained.

For sending a signal from 1.2-V LSI 2, the on resistance of PMOS transistor 6a of the driver and the on resistance of nMOS transistor 6b of the driver thereof are set to 40 ? in conformity with the characteristic impedance of bidirectional bus 3. The values of resistors 8a and 8b which terminate the reception side are set to a value which is twice the characteristic impedance of bidirectional bus 3, i.e., 80 ?. In this case, both the on resistance of the driver and the terminating resistor and bidirectional bus 3 are impedance-matched. With these settings, VOH1=0.975 V, VOL1=0.375 V, and the reference voltage Vref1 is 0.675 V. Consequently, since a signal amplitude value ? with respect to the reference voltage Vref1 is 0.30 V, the signal amplitude value is sufficiently maintained.

By thus setting the values of the terminating resistors and the on resistances of the drivers with respect to the characteristic impedance Z0 of the transmission line, the signal can be transmitted with good signal integrity. According to the present embodiment, inasmuch as the on resistance of each driver and the value of each terminating resistor match the transmission line, the signal integrity is particularly excellent. In addition, two types of power supply voltages VDDQ and one type of reference voltage Vref are sufficient. Furthermore, because the reference voltage Vref is set to 0.25 (V1+V2), the reference voltage Vref can easily be generated. Therefore, the cost of the system can be lowered. As the value of the reference voltage Vref does not deviate largely from the value of ½ of the power supply voltages VDDQ, a sufficient potential is applied between the drain and source of the PMOS transistor and the nMOS transistor of each driver, enabling efficient operation of the pMOS and the nMOS transistors. Moreover, since their input/output capacities can be reduced, they can be used in a circuit which is required to operate at a high speed.

FIG. 16 shows a generalized circuit of the signal transmission system shown in FIG. 15.

FIG. 16(a) shows an equivalent circuit for sending a signal from LSI 1 having a power supply voltage VDDQ=V1 system to LSI 2 having a power supply voltage VDDQ=V2 system, and FIG. 16(b) shows an equivalent circuit for sending a signal from V2 LSI 2 to V1 LSI 1. In FIG. 16, V1>V2. Switches that are turned off, receivers, and drivers that are set to a high impedance state on the signal reception side that do not contribute to the values of potentials, are omitted from the illustration, and the resistances of switches that are turned on, are included in the values of the resistors forming the terminating resistor.

The driver for sending a signal comprises a pMOS and an nMOS transistors which are push-pull-connected. Bidirectional bus 3 which is a transmission line has a characteristic impedance Z0, and the receiver for receiving a signal is CTT-terminated.

For sending a signal from V1 LSI 1, the on resistance of pMOS transistor 4a of the driver and the on resistance of nMOS transistor 4b of the driver thereof are set to Z0 in conformity with the characteristic impedance of bidirectional bus 3. The values of resistors 9a and 9b which terminate the reception side are set to a value which is twice the characteristic impedance of bidirectional bus 3, i.e., 2Z0. In this case, both the on resistance of the driver and the terminating resistor and bidirectional bus 3 are impedance-matched.

By thus setting the on resistance of the driver and the values of the resistors 9a and 9b, the high level VOH2 and low level VOL2 of the transmission signal and the reference voltage Vref2 are given as:

$VOH2=0.5V1+0.25V2$ $VOL2=0.25V2$ $Vref2=0.25(V1+V2)$

For sending a signal from V2 LSI 2, the on resistance of pMOS transistor 6a of the driver and the on resistance of nMOS transistor 6b of the driver thereof are set to Z0 in conformity with the characteristic impedance of bidirectional bus 3. The values of resistors 8a and 8b which terminate the reception side are set to a value which is twice the characteristic impedance of bidirectional bus 3, i.e., 2Z0. In this case, both the on resistance of the driver and the terminating resistor and bidirectional bus 3 are impedance-matched.

By thus setting the on resistance of the driver and the values of the resistors 8a and 8b, the high level VOH1 and low level VOL1 of the transmission signal and the reference voltage Vref1 are given as:

$VOH1=0.5V1+0.5V2$ $VOL2=0.25V1$ $Vref1=0.25(V1+V2)$

By thus setting the values of the terminating resistors and the on resistances of the drivers with respect to the characteristic impedance Z0 of the transmission line, the signal can be transmitted with good signal integrity. According to the present embodiment, inasmuch as the on resistance of each driver and the value of each terminating resistor match the transmission line, the signal integrity is particularly excellent. In addition, two types of power supply voltages VDDQ and one type of reference voltage Vref are sufficient. Furthermore, because the reference voltage Vref is set to 0.25 (V1+V2), the reference voltage Vref can easily be generated. Therefore, the cost of the system can be lowered. As the value of the reference voltage Vref does not deviate largely from the value of ½ of the power supply voltages VDDQ, a sufficient potential is applied between the drain and source of the PMOS transistor and the nMOS transistor of each driver, enabling efficient operation of the pMOS and the nMOS transistors. Moreover, since their input/output capacities can be reduced, they can be used in a circuit which is required to operate at a high speed.

Figure 17A:
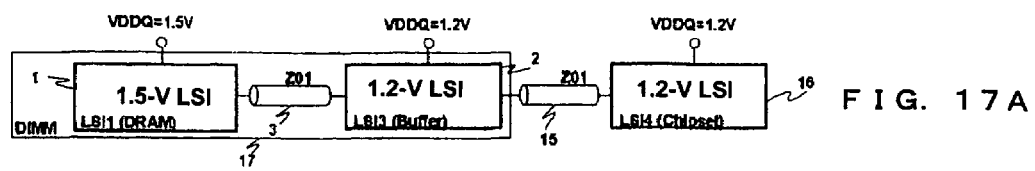
FIGS. 17A and 17B are block diagrams of an application of the signal transmission system according to the first working example shown in FIG. 9.
Figure 17B:
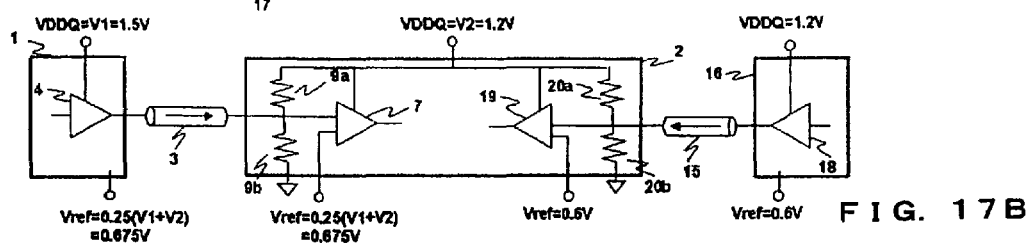

FIGS. 17A and 17B are block diagrams of an application of the signal transmission system according to the first working example shown in FIG. 9.

The signal transmission system shown in FIG. 17A is of an arrangement wherein 1.5-V semiconductor integrated circuit device (LSI) 1 and 1.2-V semiconductor integrated circuit device (LSI) 2 are directly interconnected by bidirectional bus 3 which is a transmission line, and 1.2-V semiconductor integrated circuit device (LSI) 2 and 1.2-V semiconductor integrated circuit device (LSI) 16 are directly interconnected by bidirectional bus 15 which is a transmission line. For example, 1.5-V LSI 1 and 1.2-V LSI 2 are installed on DIMM 17.

As shown in FIG. 17B, 1.5-V LSI 1 has driver (D) 4, and 1.2-V LSI 2 comprising receiver 7 for receiving a signal from 1.5-V LSI 1, resistors 8a and 8b forming a CTT termination, receiver 19 for receiving a signal from 1.2-V LSI 16, and resistors 20a and 20b forming a CTT termination. 1.2-V LSI 16 has driver (D) 18. In FIG. 17B, 1.2-V LSI 2 is shown as having only an arrangement for receiving signals from 1.5-V LSI 1 and 1.2-V LSI 16 for the sake of brevity. However, each LSI has an arrangement capable of bidirectionally transmitting signals.

Figure 3:
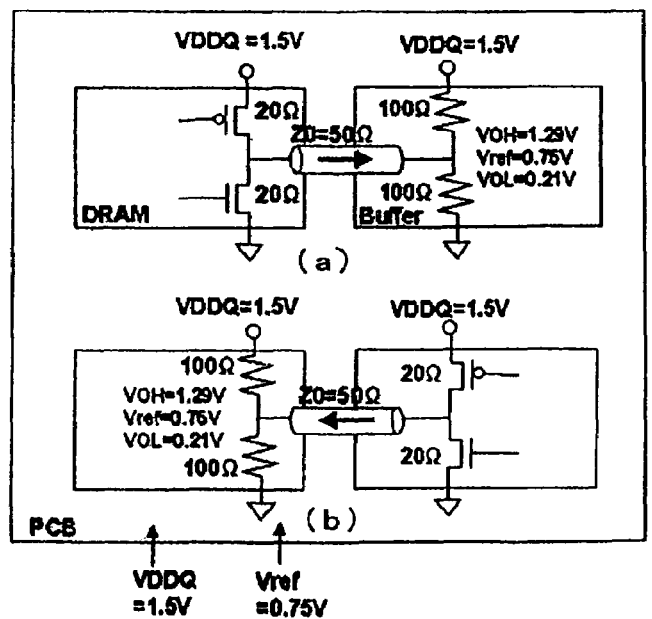
FIG. 3 is a circuit diagram of a specific arrangement of the signal transmission system shown in FIG. 2.
Figure 4:
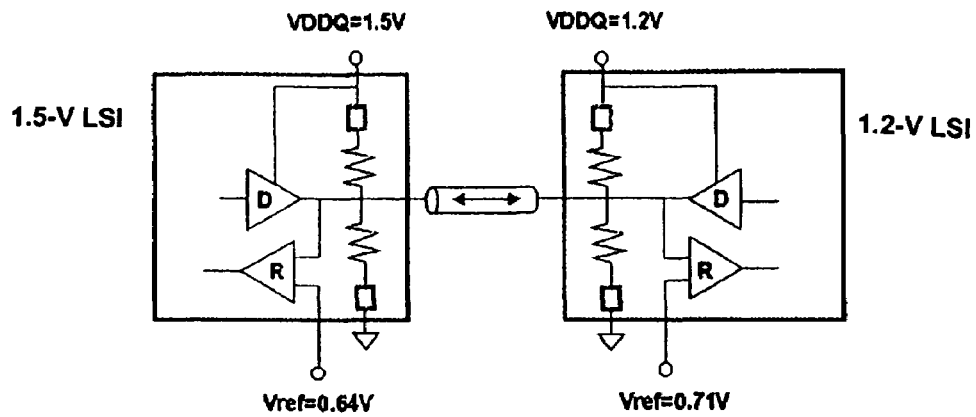
FIG. 4 is a block diagram of an arrangement of a conventional signal transmission system wherein semiconductor integrated circuit devices that operate under different power supply voltages are directly interconnected for bidirectionally transmitting a signal.
Figure 5:
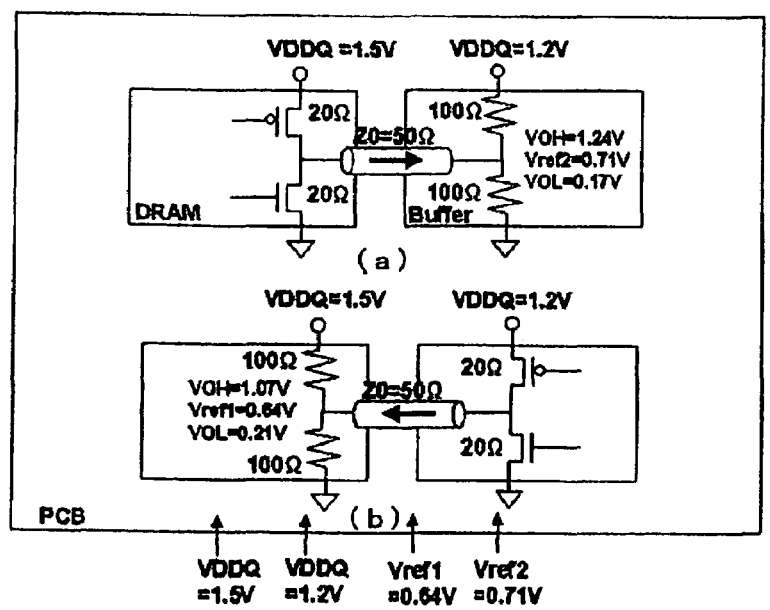
FIG. 5 is a circuit diagram of a specific arrangement of the signal transmission system shown in FIG. 4.
Figure 6:
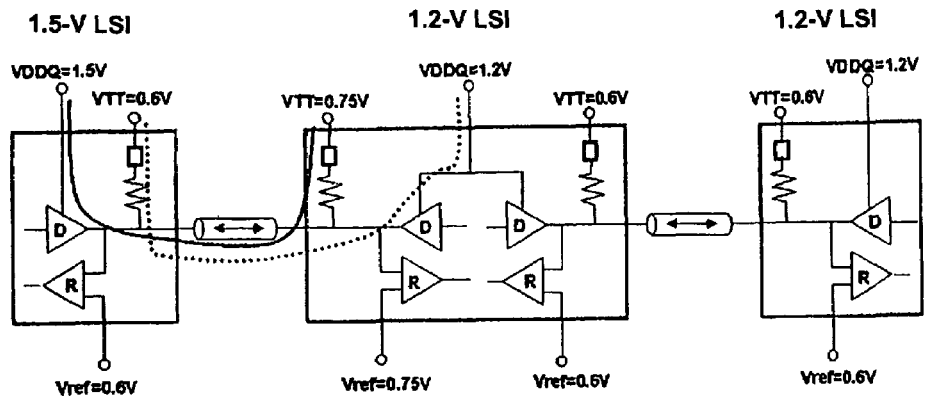
FIG. 6 is a block diagram of another arrangement of a conventional signal transmission system wherein semiconductor integrated circuit devices that operate under different power supply voltages are directly interconnected for bidirectionally transmitting a signal.

Between 1.2-V LSI 2 and 1.2-V LSI 16, for example, there may be transmitted a signal using the conventional signal transmission system shown in FIG. 3. However, since FIG. 3 shows an arrangement wherein the power supply voltage VDDQ is 1.5 V, the power supply voltage VDDQ may be replaced with 1.2 V in this embodiment. In that case, the value of the reference voltage Vref required for signal transmission is 0.6 V for both.

Between 1.5-V LSI 1 and 1.2-V LSI 12, there may be transmitted a signal using the signal transmission system according to the first working example. In that case, the value of the reference voltage Vref required for signal transmission is 0.675 V for both.

The signal transmission system shown in FIG. 17 is different from the conventional signal transmission system shown in FIG. 3 as to a process of setting the on resistance of the driver which sends a signal and the reference voltage Vref.

With this arrangement, two types of power supply voltages VDDQ and two types of reference voltages Vref are employed, so that the types of these voltages are fewer than heretofore. The reference voltages Vref can easily be generated. In the present working example, because there are two types of power supply voltages VDDQ supplied to DIMM 17, and many 1.2-V power supply LSIs can be used, the electric power of the DIMM and the electric power of the system can be reduced.

Figure 18A:
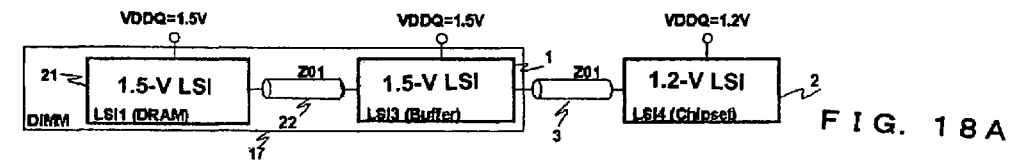
FIGS. 18A and 18B are block diagrams of another application of the signal transmission system according to the first working example shown in FIG. 9.
Figure 18B:
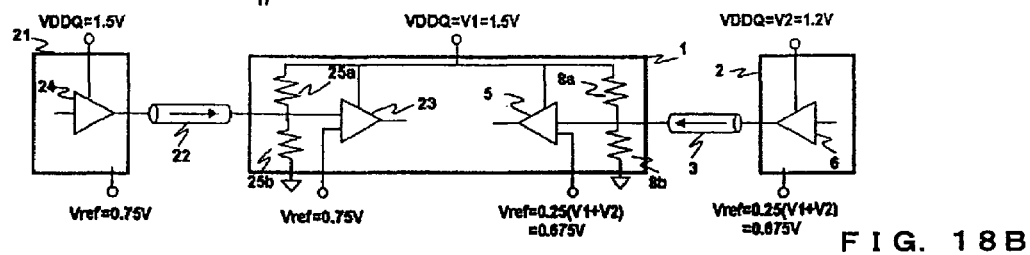

FIGS. 18A and 18B are block diagrams of an application of the signal transmission system according to the first working example shown in FIG. 9.

The signal transmission system shown in FIG. 18A is of an arrangement wherein 1.5-V semiconductor integrated circuit device (LSI) 1 and 1.2-V semiconductor integrated circuit device (LSI) 2 are directly interconnected by bidirectional bus 3 which is a transmission line, and 1.5-V semiconductor integrated circuit device (LSI) 1 and 1.5-V semiconductor integrated circuit device (LSI) 21 are directly interconnected by bidirectional bus 22 which is a transmission line. For example, 1.5-V LSI 1 and 1.5-V LSI 21 are installed on DIMM 17.

As shown in FIG. 18B, 1.5-V LSI 1 has receiver 23 and resistors 25a and 25b forming a CTT termination for receiving a signal from 1.5-V LSI 21, and receiver 5 and resistors 8a and 8b forming a CTT termination for receiving a signal from 1.2-V LSI 2. 1.5-V LSI 21 has driver 24, and 1.2-V LSI 2 has driver 6. In FIG. 18B, 1.5-V LSI 1 is shown as having only an arrangement for receiving signals from 1.5-V LSI 21 and 1.2-V LSI 11 for the sake of brevity. However, each LSI has an arrangement capable of bidirectionally transmitting signals.

Between 1.5-V LSI 21 and LSI 11, for example, there may be transmitted a signal using the conventional signal transmission system shown in FIG. 3. In that case, the value of the reference voltage Vref required for signal transmission is 0.75 V for both.

Between 1.5-V LSI 1 and 1.2-V LSI 12, there may be transmitted a signal using the signal transmission system according to the first working example. In that case, the value of the reference voltage Vref required for signal transmission is 0.675 V for both.

With this arrangement, two types of power supply voltages VDDQ and two type of reference voltages Vref are employed, so that the types of these voltages are fewer than heretofore. The reference voltages Vref can easily be generated. In the present working example, since there is one type of power supply voltage VDDQ supplied to DIMM 17, the number of layers of the DIMM substrate can be reduced.

Figure 19:
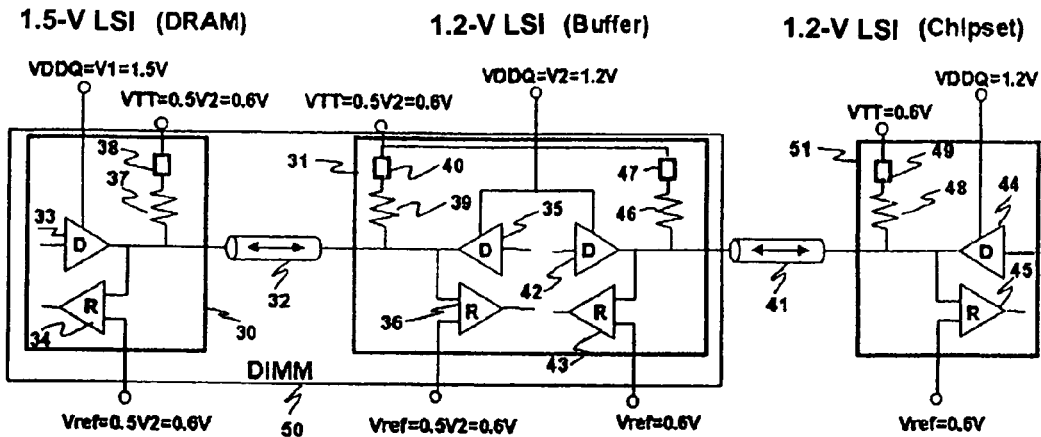
FIG. 19 is a block diagram of an arrangement of a second working example of a signal transmission system according to the present invention.

FIG. 19 is a block diagram of an arrangement of a second working example of a signal transmission system according to the present invention.

As shown in FIG. 19, the signal transmission system according to the second working example is of an arrangement wherein 1.5-V semiconductor integrated circuit device (LSI) 30 and 1.2-V semiconductor integrated circuit device (LSI) 31 are directly interconnected by bidirectional bus 32 which is a transmission line, and 1.2-V semiconductor integrated circuit device (LSI) 31 and 1.2-V semiconductor integrated circuit device (LSI) 51 are directly interconnected by bidirectional bus 41 which is a transmission line. For example, 1.5-V LSI 30 and 1.2-V LSI 31 are installed on DIMM 50.

1.5-V LSI 30 has driver (D) 33, receiver (R) 34, resistor 37 forming a VTT termination, and switch 38. 1.2-V LSI 31 has driver (D) 35 receiver (R) 36, resistor 39 forming a VTT termination, and switch 40 for sending a signal to and receiving a signal from 1.5-V LSI 30, and driver (D) 42, receiver (R) 43, resistor 46 forming a VTT termination, and switch 47 for sending a signal to and receiving a signal from 1.2-V LSI 51. 1.2-V LSI 51 has driver (D) 44, receiver (R) 45, resistor 48 forming a VTT termination, and switch 49.

In the signal transmission system according to this working example, since 1.2-V LSI 31 and LSI 51 transmit signals between LSIs that operate under the same power supply voltage VDDQ, the terminating voltage VTT is set to VTT=0.5V2=0.6 V where V2 represents a low VDDQ value, i.e., 1.2 V. 1.2-V LSI 31 which relays signals between 1.5-V LSI 30 and 1.2-V LSI 51 is supplied with a low VDDQ value.

With the above arrangement, for sending a signal from 1.5-V LSI 30 to 1.2-V LSI 31, the output of driver 35 of 1.2-V LSI 31 is set to a high impedance state, and switch 38 of 1.5-V LSI 30 is turned off. Conversely, for sending a signal from 1.2-V LSI 31 to 1.5-V LSI 30, the output of driver 33 of 1.5-V LSI 30 is set to a high impedance state, and switch 40 of 1.2-V LSI 31 is turned off. A reference voltage Vref1 to be referred to when a signal is to be sent from 1.2-V LSI 31 to 1.5-V LSI 30 and a reference voltage Vref2 to be referred to when a signal is to be sent from 1.5-V LSI 30 to 1.2-V LSI 31 are brought into conformity with each other. Specifically, they are set as Vref1= Vref2=0.5V2 where V2 represents a lower power supply voltage VDDQ (1.2 in FIG. 19) of power supply voltages VDDQ supplied to the two LSIs. Therefore, the reference voltage Vref1=Vref2=0.6 V.

Figure 7:
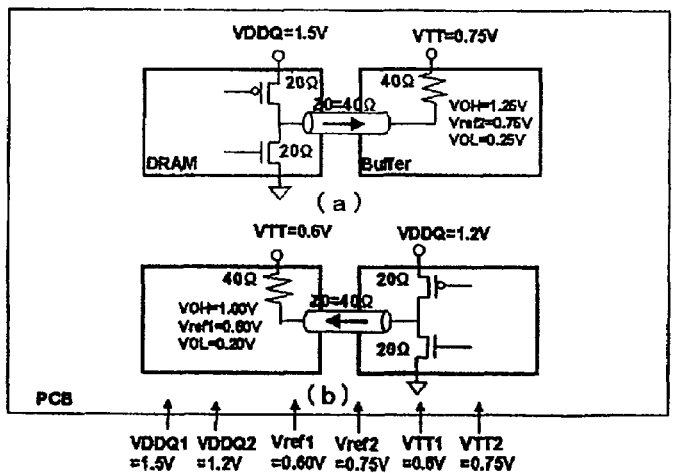
FIG. 7 is a circuit diagram of a specific arrangement of the signal transmission system shown in FIG. 6.
Figure 8:
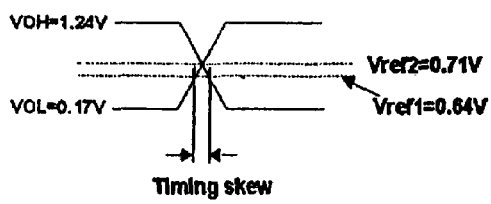
FIG. 8 is a waveform diagram illustrative of a problem of the signal transmission systems shown in FIGS. 4 and 6.

The reference voltage Vref can be expressed using high and low levels of output signals from the LSIs. If the signal sent from 1.5-V LSI 30 has a high level VOH2 and a low level VOL2, then the reference voltage Vref2 is 0.5 (VOH2+VOL2). If the signal sent from 1.2-V LSI 31 has a high level VOH1 and a low level VOL1, then the reference voltage Vref1 is 0.5 (VOH1+VOL1). Between 1.2-V LSI 31 and LSI 51, for example, there may be transmitted a signal using the conventional signal transmission system shown in FIG. 7(*b*). In that case, the value of the reference voltage Vref required for signal transmission is 0.6 V for both. By thus setting the reference voltage Vref, two types of power supply voltages VDDQ, one type of terminating voltage VTT, and one type of reference voltage Vref are sufficient, and the reference voltage Vref can easily be generated.

In the present working example, because there are two types of power supply voltages VDDQ supplied to DIMM 50, and many 1.2-V power supply LSIs can be used, the electric power of the DIMM and the electric power of the system can be reduced.

Figure 20:
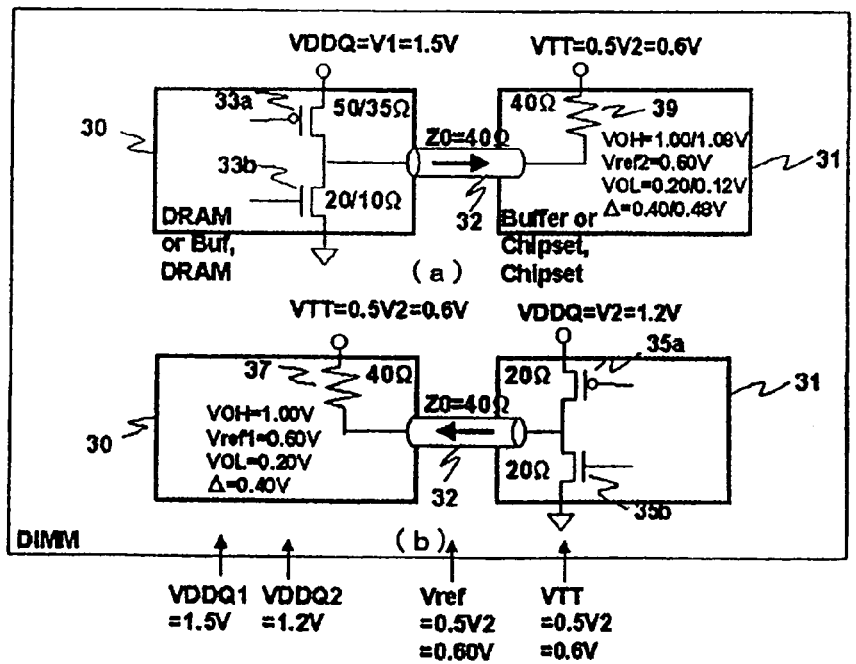
FIG. 20 is a circuit diagram of an arrangement of a fourth embodiment of a signal transmission system according to the present invention.

FIG. 20 is a circuit diagram of an arrangement of a fourth embodiment of a signal transmission system according to the present invention.

FIG. 20 shows a specific example of the signal transmission system according to the second working example, for sending and receiving a single-ended signal. FIG. 20 shows only a circuit between 1.5-V LSI 30 and 1.2-V LSI 31. The fourth embodiment is effective not only for transmitting signals between the three LSIs shown in FIG. 19, but also for transmitting signals between the two LSIs that operate under different power supply voltages as shown in FIG. 20. FIG. 20(a) shows an equivalent circuit for sending a signal from 1.5-V LSI 30 to 1.2-V LSI 31, and FIG. 20(b) shows an equivalent circuit for sending a signal from 1.2-V LSI 31 to 1.5-V LSI 30.

In FIG. 20, switches that are turned off, receivers, and drivers that are set to a high impedance state on the signal reception side that do not contribute to the values of potentials, are omitted from the illustration, and the resistances of switches that are turned on, are included in the values of resistors 37 and 39.

The driver for sending a signal comprises a pMOS and an nMOS transistors which are push-pull-connected. Bidirectional bus 32 which is a transmission line has a characteristic impedance Z0 of 40 ?, and the receiver for receiving a signal is VTT-terminated.

In the signal transmission system according to the fourth embodiment, for sending a signal from 1.5-V LSI 30, the value of resistor 39 forming a VTT termination on the signal reception side is set to 40 ?, which is the same as the characteristic impedance Z0 of bidirectional bus 32. In this case, the terminating resistor and bidirectional bus 32 are impedance-matched.

The on resistance of nMOS transistor 33b of the driver is set to a value equal to or lower than the characteristic impedance of bidirectional bus 32, e.g., 20 ?, and the on resistance of pMOS transistor 33a of the driver is set to 50 ?. In this manner, VOH2=1.00 V, VOL2=0.20 V, and the reference voltage Vref2 is 0.60 V. In this case, the value of the reference voltage Vref2 is ½ of the low VDDQ value (1.2 V). Since a signal amplitude value ? with respect to the reference voltage Vref2 is 0.40 V, the signal amplitude value is sufficiently maintained.

In the present embodiment, the on resistance of pMOS transistor 33a is greater than the characteristic impedance Z0 of bidirectional bus 32. By adjusting these values, the amplitude of the signal can be changed. If the signal amplitude is to be made greater, other values may be combined. For example, if the on resistance of pMOS transistor 33a=35 ? and the on resistance of nMOS transistor 33b=10 ?, then VOH2=1.08 V, VOL2=0.12 V, and the reference voltage Vref2 is 0.60 V.

For sending a signal from 1.2-V LSI 31, the value of resistor 37 forming a VTT termination on the signal reception side is set to 40 ?, which is the same as the characteristic impedance Z0 of bidirectional bus 32. In this case, the terminating resistor and bidirectional bus 32 are impedance-matched.

The on resistance of pMOS transistor 35a of the driver and the on resistance of nMOS transistor 35b of the driver thereof are set to a value equal to or lower than the characteristic impedance of bidirectional bus 32, e.g., 20 ?. In this manner, VOH1=1.00 V, VOL2=0.20 V, and the reference voltage Vref1 is 0.60 V, which is in conformity with the reference voltage Vref2. In this case, since a signal amplitude value ? with respect to the reference voltage Vref1 is 0.40 V, the signal amplitude value is sufficiently maintained.

In the present embodiment, the on resistance of pMOS transistor 33a is greater than the characteristic impedance Z0 of bidirectional bus 32. By adjusting these values, the amplitude of the signal can be changed. If the signal amplitude is to be made greater, other values may be combined. For example, if the on resistance of pMOS transistor 33a is 35 ? and the on resistance of nMOS transistor 33b is 10 ?, then VOH2=1.08 V, VOL2=0.12 V, and the reference voltage Vref2 is 0.60 V.

The path of return current of a signal flowing on bidirectional bus 32 is a ground plane which is common to 1.5-V LSI 30 and 1.2-V LSI 31. This makes it easy to design a printed board. If the power supply voltage VDDQ is used as the path of return current, then since the 1.5-V power supply and the 1.2-V power supply need to be used as the path of return current, problems arise which make the layout of interconnections difficult and increase the number of layers of the printed board. Therefore, it is preferable that the path of return current of a signal flowing on bidirectional bus 32 be a ground plane.

By thus setting the values of the terminating resistors and the on resistances of the drivers with respect to the characteristic impedance Z0 of the transmission line, the signal can be transmitted with good signal integrity. In addition, two types of power supply voltages VDDQ, one type of terminating voltage VTT, and one type of reference voltage Vref are sufficient. Furthermore, because the reference voltage Vref is set to 0.5V2, the reference voltage Vref can easily be generated. Therefore, the cost of the system can be lowered. As the value of the reference voltage Vref does not deviate largely from the value of ½ of the power supply voltages VDDQ, a sufficient voltage is applied between the drain and source of the pMOS transistor and the nMOS transistor of each driver, enabling efficient operation of the PMOS and the nMOS transistors. Moreover, since their input/output capacities can be reduced, they can be used in a circuit which is required to operate at a high speed.

FIG. 21 is a circuit diagram of an arrangement of a generalized circuit of the signal transmission system according to the fourth embodiment shown in FIG. 20.

FIG. 21(a) shows an equivalent circuit for sending a signal from LSI 30 having a power supply voltage VDDQ=V1 system to LSI 31 having a power supply voltage VDDQ=V2 system, and FIG. 21(b) shows an equivalent circuit for sending a signal from V2 LSI 31 to V1 LSI 30. In FIG. 21, V1>V2. Switches that are turned off, receivers, and drivers that are set to a high impedance state on the signal reception side that do not contribute to the values of potentials, are omitted from the illustration, and the resistances of switches that are turned on, are included in the values of the resistors forming the terminating resistor.

The driver for sending a signal comprises a pMOS and an nMOS transistors which are push-pull-connected. Bidirectional bus 32 which is a transmission line has a characteristic impedance Z0, and the receiver for receiving a signal is VTT-terminated.

For sending a signal from V1 LSI 30, the value of resistor 39 forming a VTT termination on the signal reception side is set to a value which is the same as the characteristic impedance Z0 of bidirectional bus 32. In this case, the terminating resistor and bidirectional bus 32 are impedance-matched.

The on resistance of nMOS transistor 33b of the driver is set to a value equal to or lower than the characteristic impedance of bidirectional bus 32, e.g., R ?, and the on resistance of pMOS transistor 33a of the driver is set to R1 ? so that the reference voltage Vref2=0.5V2. At this time, R1 becomes:

$$R1 = 2V1(R+Z0)/V2 - (2Z0+R)$$

The high level VOH2 and low level VOL2 of the transmission signal are given as:

$$VOH2=(V2 \cdot Z0+0.5V2 \cdot R)/(R+Z0)$$

$$VOL2=0.5V2 \cdot R/(R+Z0)$$

For sending a signal from V2 LSI 31, the value of resistor 37 forming a VTT termination on the signal reception side is set to a value which is the same as the characteristic impedance Z0 of bidirectional bus 32. In this case, the terminating resistor and bidirectional bus 32 are impedance-matched.

The on resistance of PMOS transistor 33a of the driver and the on resistance of nMOS transistor 35b of the driver thereof are set to a value equal to or lower than the characteristic impedance of bidirectional bus 32, e.g., R2 Ω. At this time, the reference voltage Vref1 becomes:

$$Vref1=0.5V2$$

The high level VOH1 and low level VOL1 of the transmission signal are given as:

$$VOH1=(V2 \cdot Z0+0.5V2 \cdot R2)/(R2+Z0)$$

$$VOL1=0.5V2 \cdot R2/(R2+Z0)$$

By thus setting the values of the terminating resistors and the on resistances of the drivers with respect to the characteristic impedance Z0 of the transmission line, the signal can be transmitted with good signal integrity. In addition, two types of power supply voltages VDDQ, one type of terminating voltage VTT, and one type of reference voltage Vref are sufficient. Furthermore, because the reference voltage Vref is set to 0.5V2, reference voltage Vref can easily be generated. Therefore, the cost of the system can be lowered. As the value of the reference voltage Vref does not deviate largely from the value of ½ of the power supply voltages VDDQ, a sufficient potential is applied between the drain and source of the pMOS transistor and the nMOS transistor of each driver, enabling efficient operation of the PMOS and the nMOS transistors. Moreover, since their input/output capacities can be reduced, they can be used in a circuit which is required to operate at a high speed.

FIG. 22 is a circuit diagram of an arrangement of a fifth embodiment of a signal transmission system according to the present invention.

FIG. 22 shows a circuit example for transmitting a single-ended signal between 1.5-V LSI 55 and 1.2-V LSI 56. FIG. 22(a) shows an equivalent circuit for sending a signal from 1.5-V LSI 55 to 1.2-V LSI 56, and FIG. 22(b) shows an equivalent circuit for sending a signal from 1.2-V LSI 56 to 1.5-V LSI 55.

In FIG. 22, switches that are turned off, receivers, and drivers that are set to a high impedance state on the signal reception side that do not contribute to the values of potentials, are omitted from the illustration, and the resistances of switches that are turned on, are included in the values of resistors 60a, 60b, 62a and 62b.

The driver for sending a signal comprises a PMOS and an nMOS transistors which are push-pull-connected. Bidirectional bus 57 which is a transmission line has a characteristic impedance Z0 of 40 Ω, and the receiver for receiving a signal is CTT-terminated.

In the signal transmission system according to the fifth embodiment, for sending a signal from 1.5-V LSI 55, the on resistance of the pMOS transistor 59a of the driver and the on resistance of nMOS transistor 59b of the driver thereof are set to 40 Ω, which is the same as the characteristic impedance of bidirectional bus 57. In this case, the on resistance of the driver and bidirectional bus 57 are impedance-matched.

The value of resistor 60a forming the CTT termination on the signal reception side is set to a value equal to or higher than 2Z0 of bidirectional bus 57, e.g., 120 Ω, and the value of resistor 60b is set to 97.78 Ω. In this manner, VOH2=1.09 V, VOL2=0.23 V, and the reference voltage Vref2 is 0.66 V. In this case, since a signal amplitude value ? with respect to the reference voltage Vref2 is 0.43 V, the signal amplitude value is sufficiently maintained.

For sending a signal from 1.2-V LSI 56, the on resistance of pMOS transistor 61a of the driver and the on resistance of nMOS transistor 61b of the driver thereof are set to 40 Ω, which is the same as the characteristic impedance of bidirectional bus 57. In this case, the on resistance of the driver and bidirectional bus 57 are impedance-matched.

The value of resistor 62b forming the CTT termination on the signal reception side is set to a value equal to or higher than 2Z0 of bidirectional bus 57, e.g., 120 Ω, and the value of resistor 62a is also set to 120 Ω. In this manner, VOH2=1.02 V, VOL2=0.30 V, and the reference voltage Vref1 is 0.66 V which is in conformity with the reference voltage Vref2. In this case, since a signal amplitude value ? with respect to the reference voltage Vref1 is 0.36 V, the signal amplitude value is sufficiently maintained.

The path of return current of a signal flowing on bidirectional bus 57 is a ground plane which is common to 1.5-V LSI 55 and 1.2-V LSI 56. This makes it easy to design a printed board. If the power supply voltage VDDQ is used as the path of return current, then since the 1.5-V power supply and the 1.2-V power supply need to be used as the path of return current, problems arise which make the layout of interconnections difficult and increase the number of layers of the printed board. Therefore, it is preferable that the path of return current of a signal flowing on bidirectional bus 57 be a ground plane. This holds true for the examples below, and will not be described below.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. In the present embodiment, though the reference voltage generating circuit is of a somewhat complex arrangement, the minimum amplitude of the transmission signal can be slightly greater than with the second embodiment. Furthermore, as the value of the reference voltage Vref does not deviate largely from the value of ½ of the power supply voltages VDDQ, a sufficient potential is applied between the drain and source of the pMOS transistor and the nMOS transistor of each driver, enabling efficient operation of the pMOS and the nMOS transistors. Moreover, since their input/output capacities can be reduced, they can be used in a circuit which is required to operate at a high speed.

Figure 23:
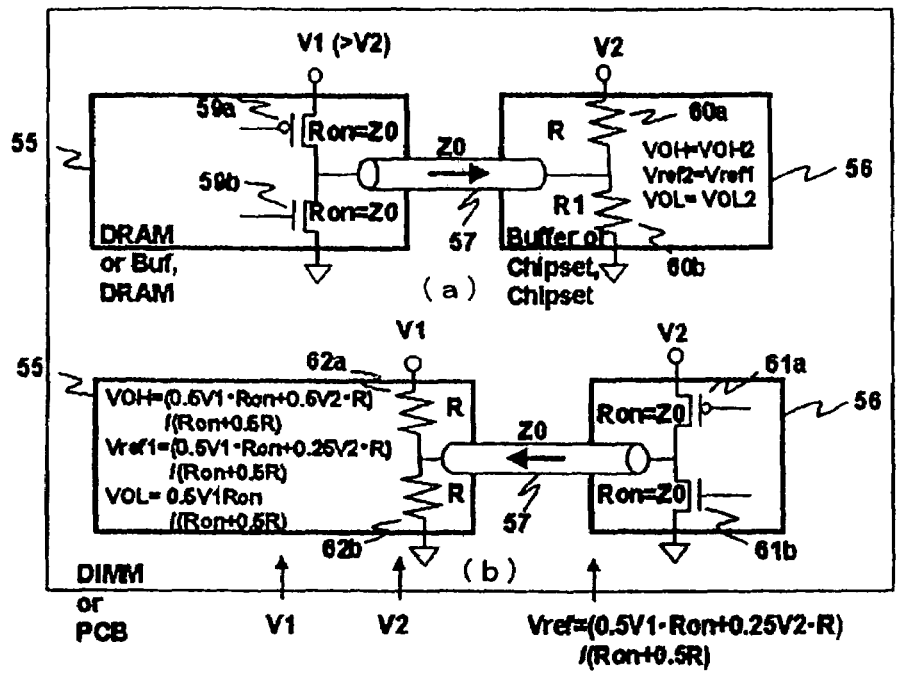
FIG. 23 is a circuit diagram of an arrangement of a generalized circuit of the signal transmission system according to the fifth embodiment shown in FIG. 22.

FIG. 23 is a circuit diagram of an arrangement of a generalized circuit of the signal transmission system according to the fifth embodiment shown in FIG. 22.

FIG. 23(a) shows an equivalent circuit for sending a signal from LSI 55 having a power supply voltage VDDQ=V1 system to LSI 56 having a power supply voltage VDDQ=V2 system, and FIG. 23(b) shows an equivalent circuit for sending a signal from V2 LSI 56 to V1 LSI 55. In FIG. 23, V1>V2. Switches that are turned off, receivers, and drivers that are set to a high impedance state on the signal reception side that do not contribute to the values of potentials, are omitted from the illustration, and the resistances of switches that are turned on, are included in the values of the resistors forming the terminating resistor.

The driver for sending a signal comprises a pMOS and an nMOS transistors which are push-pull-connected. Bidirectional bus 57 which is a transmission line has a characteristic impedance Z0, and the receiver for receiving a signal is CTT-terminated.

For sending a signal from V1 LSI 55, the on resistance of the pMOS transistor 59a of the driver and the on resistance of nMOS transistor 59b of the driver thereof are set to Z0, which is the same as the characteristic impedance of bidirectional bus 57. In this case, the on resistance of the driver and bidirectional bus 57 are impedance-matched.

The value of resistor 60a forming a CTT termination on the signal reception side is set to a value equal to or higher than 2Z0 of bidirectional bus 57, e.g., R ?, and the value of resistor 60b is set to R1 ?.

R1 satisfies the following equation:

$$R1=2R \cdot Z0(V1 \cdot Z0+0.5V2 \cdot R)/\\(V2 \cdot R \cdot Z0+R \cdot R \cdot V1+4Z0 \cdot Z0 \cdot V2-R \cdot R \cdot V2-2Z0 \cdot Z0 \cdot V1)$$

Thus, $$VOH2=(R \cdot R \cdot V1+R1 \cdot Z0 \cdot V2)/(R \cdot R1+R1 \cdot Z0+R \cdot Z0)$$

$$VOL2=R1 \cdot Z0 \cdot V2/(R \cdot R1+R \cdot Z0+R1 \cdot Z0)$$

$$Vref2=(0.5V1 \cdot Z0+0.25V2 \cdot R)/(Z0+0.5R)$$

For sending a signal from V2 LSI 56, the on resistance of the pMOS transistor 61a of the driver and the on resistance of nMOS transistor 61b of the driver thereof are set to Z0, which is the same as the characteristic impedance of bidirectional bus 57. In this case, the on resistance of the driver and bidirectional bus 57 are impedance-matched.

The value of resistor 62b forming a CTT termination on the signal reception side is set to a value equal to or higher than 2Z0 of bidirectional bus 57, e.g., R ?, and the value of resistor 62a is also set to R ?.

Thus, $$VOH1=(0.5V1 \cdot Z0+0.5V2 \cdot R)/(Z0+0.5R)$$

$$VOL1=0.5V1 \cdot Z0/(Z0+0.5R)$$

$$Vref1=(0.5V1 \cdot Z0+0.25V2 \cdot R)/(Z0+0.5R)$$

The value of Vref1 is the same as the value of Vref2.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. In the present embodiment, though the reference voltage generating circuit is of a somewhat complex arrangement, the minimum amplitude of the transmission signal can be slightly greater than with the example shown in FIG. 14. Furthermore, as the value of the reference voltage Vref does not deviate largely from the value of ½ of the power supply voltages VDDQ, a sufficient potential is applied between the drain and source of the pMOS transistor and the nMOS transistor of each driver, enabling efficient operation of the PMOS and the nMOS transistors. Moreover, since their input/output capacities can be reduced, they can be used in a circuit which is required to operate at a high speed.

Figure 24:
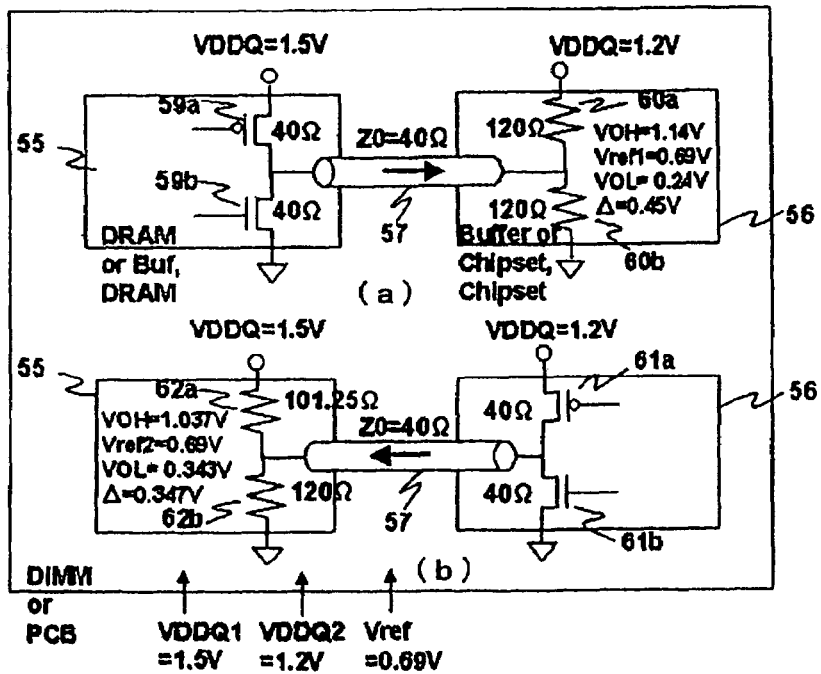
FIG. 24 is a circuit diagram of an arrangement of a sixth embodiment of a signal transmission system according to the present invention.

FIG. 24 is a circuit diagram of an arrangement of a sixth embodiment of a signal transmission system according to the present invention.

FIG. 24 shows a circuit example for transmitting a single-ended signal between 1.5-V LSI 55 and 1.2-V LSI 56. FIG. 24(a) shows an equivalent circuit for sending a signal from 1.5-V LSI 55 to 1.2-V LSI 56, and FIG. 24(b) shows an equivalent circuit for sending a signal from 1.2-V LSI 56 to 1.5-V LSI 55.

In FIG. 24, switches that are turned off, receivers, and drivers that are set to a high impedance state on the signal reception side that do not contribute to the values of potentials, are omitted from the illustration, and the resistances of switches that are turned on, are included in the values of resistors 60a, 60b, 62a and 62b.

The driver for sending a signal comprises a pMOS and an nMOS transistors which are push-pull-connected. Bidirectional bus 57 which is a transmission line has a characteristic impedance Z0 of 40 ?, and the receiver for receiving a signal is CTT-terminated.

In the signal transmission system according to the sixth embodiment, for sending a signal from 1.5-V LSI 55, the on resistance of the pMOS transistor 59a of the driver and the on resistance of nMOS transistor 59b of the driver thereof are set to 40 ?, which is the same as the characteristic impedance of bidirectional bus 57. In this case, the on resistance of the driver and bidirectional bus 57 are impedance-matched.

The value of resistor 60a and the value of resistor 60b forming a CTT termination on the signal reception side are set to a value equal to or higher than 2Z0 of bidirectional bus 57, e.g., 120 ?. In this manner, VOH2= 1.14 V, VOL2=0.24 V, and the reference voltage Vref2 is 0.69 V. In this case, since a signal amplitude value ? with respect to the reference voltage Vref2 is 0.45 V, the signal amplitude value is sufficiently maintained.

For sending a signal from 1.2-V LSI 56, the on resistance of the pMOS transistor 61a of the driver and the on resistance of nMOS transistor 61b of the driver thereof are set to 40 ?, which is the same as the characteristic impedance of bidirectional bus 57. In this case, the on resistance of the driver and bidirectional bus 57 are impedance-matched.

The value of resistor 62b forming a CTT termination on the signal reception side is set to a value equal to or higher than 2Z0 of bidirectional bus 57, e.g., 120 ?, and the value of resistor 62a is set to 101.25 ?. In this manner, VOH1=1.037 V, VOL1=0.343 V, and the reference voltage Vref1 is 0.69 V, which is in conformity with the reference voltage Vref2. In this case, since a signal amplitude value ? with respect to the reference voltage Vref1 is 0.347 V, the signal amplitude value is sufficiently maintained.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. In the present embodiment, though the reference voltage generating circuit is of a somewhat complex arrangement, since the value of the reference voltage Vref can be set to a slightly higher value, the input circuit for receiving a signal with an nMOS transistor can possibly be designed with ease. Furthermore, as the value of the reference voltage Vref does not deviate largely from the value of ½ of the power supply voltages VDDQ, a sufficient potential is applied between the drain and source of the pMOS transistor and the nMOS transistor of each driver, enabling efficient operation of the pMOS and the nMOS transistors. Moreover, since their input/output capacities can be reduced, they can be used in a circuit which is required to operate at a high speed.

The sixth embodiment is identical in arrangement to the second embodiment (FIG. 13) and the fifth embodiment (FIG. 22) in that it has a driver which is CTT-terminated and push-pull-connected that has an on resistance equal to the characteristic impedance Z0 of the transmission line. Therefore, these embodiments can also be realized by making the value of the terminating resistor variable.

Figure 25:
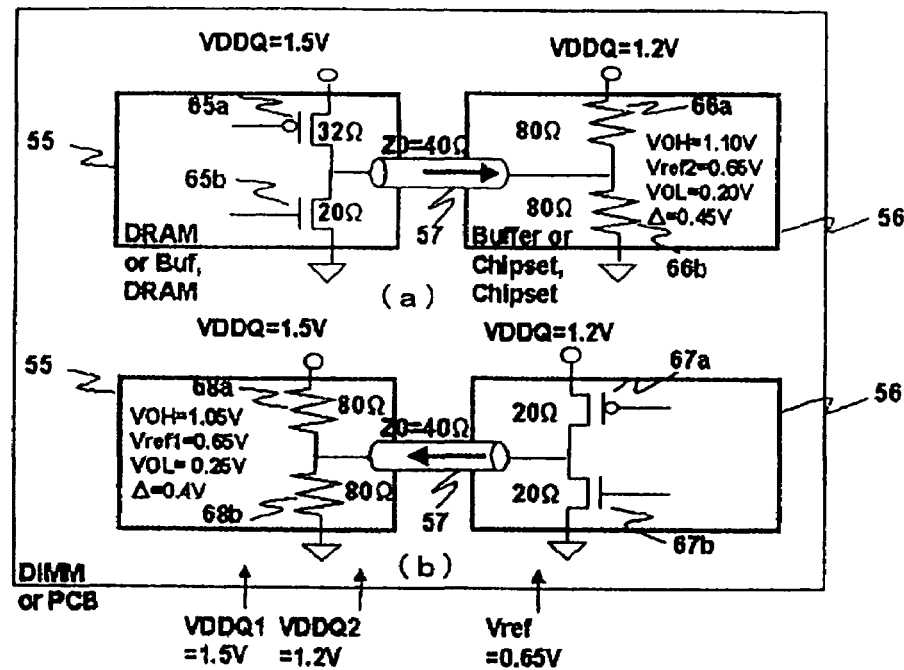
FIG. 25 is a circuit diagram of an arrangement of a seventh embodiment of a signal transmission system according to the present invention.

FIG. 25 is a circuit diagram of an arrangement of a seventh embodiment of a signal transmission system according to the present invention.

FIG. 25 shows a circuit example for transmitting a single-ended signal between 1.5-V LSI 55 and 1.2-V LSI 56. FIG. 25(*a*) shows an equivalent circuit for sending a signal from 1.5-V LSI 55 to 1.2-V LSI 56, and FIG. 25(*b*) shows an equivalent circuit for sending a signal from 1.2-V LSI 56 to 1.5-V LSI 55.

In FIG. 25, switches that are turned off, receivers, and drivers that are set to a high impedance state on the signal reception side that do not contribute to the values of potentials, are omitted from the illustration, and the resistances of switches that are turned on, are included in the values of resistors 66*a*, 66*b*, 68*a* and 68*b*.

The driver for sending a signal comprises a pMOS and an nMOS transistors which are push-pull-connected. Bidirectional bus 57 which is a transmission line has a characteristic impedance Z0 of 40 ?, and the receiver for receiving a signal is CTT-terminated.

In the signal transmission system according to the seventh embodiment, for sending a signal from 1.5-V LSI 55, the value of resistor 66*a* and the value of resistor 66*b* forming a CTT termination on the signal reception side are set to 80 ? which is equal to 2Z0 of bidirectional bus 57. Since the value of the terminating resistor is the same as the value obtained when resistors 66*a* and 66*b* are connected parallel to each other, the terminating resistor and bidirectional bus 57 are impedance-matched.

The on resistance of nMOS transistor 65*b* of the driver is set to a value equal to or lower than the characteristic impedance Z0 of bidirectional bus 57, e.g., 20 ?, and the on resistance of pMOS transistor 65*a* of the driver is set to 32 ?. In this manner, VOH2=1.10 V, VOL2=0.20 V, and the reference voltage Vref2 is 0.65 V. In this case, since a signal amplitude value ? with respect to the reference voltage Vref2 is 0.45 V, the signal amplitude value is sufficiently maintained.

For sending a signal from 1.2-V LSI 56, the on resistance of the pMOS transistor 68*a* and the on resistance of nMOS transistor 68*b* forming a CTT termination on the signal reception side are set to 80 ?, which is the same as 2Z0 of bidirectional bus 57. Since the value of the terminating resistor is the same as the value obtained when resistors 68*a* and 68*b* are connected parallel to each other, the terminating resistor and bidirectional bus 57 are impedance-matched.

The on resistance of nMOS transistor 67*b* of the driver and the on resistance of PMOS transistor 67*a* of the driver thereof are set to a value equal to or lower than the characteristic impedance Z0 of bidirectional bus 57, e.g., 20 ?. In this manner, VOH1=1.05 V, VOL1=0.25 V, and the reference voltage Vref1 is 0.65 V, which is in conformity with the reference voltage Vref2. In this case, since a signal amplitude value ? with respect to the reference voltage Vref1 is 0.40 V, the signal amplitude value is sufficiently maintained.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. In the present embodiment, though the reference voltage generating circuit is of a somewhat complex arrangement, the minimum amplitude of the transmission signal can be slightly greater than with the example shown in FIG. 10. Furthermore, as the value of the reference voltage Vref does not deviate largely from the value of ½ of the power supply voltages VDDQ, a sufficient potential is applied between the drain and source of the pMOS transistor and the nMOS transistor of each driver, enabling efficient operation of the pMOS and the nMOS transistors. Moreover, since their input/output capacities can be reduced, they can be used in a circuit which is required to operate at a high speed.

Figure 26:
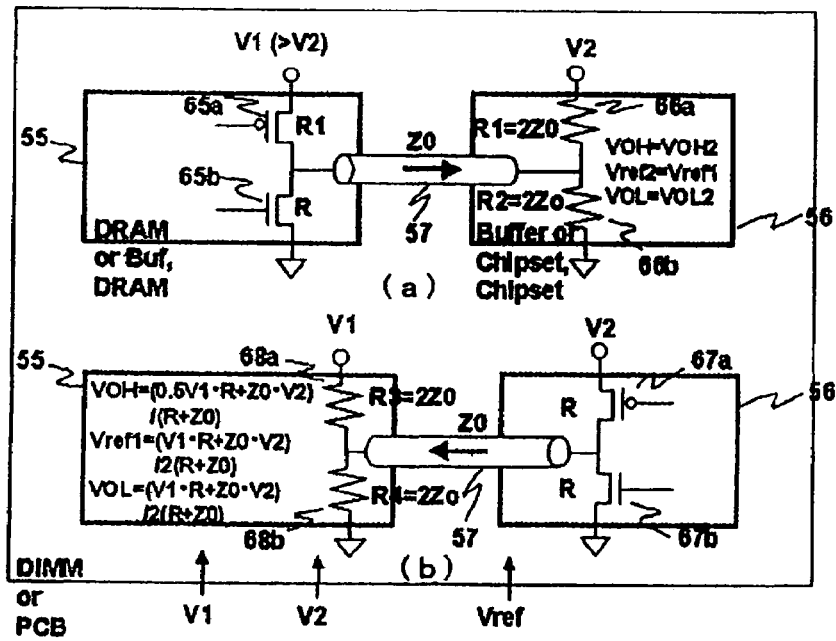
FIG. 26 is a circuit diagram of an arrangement of a generalized circuit of the signal transmission system according to the seventh embodiment shown in FIG. 25.

FIG. 26 is a circuit diagram of an arrangement of a generalized circuit of the signal transmission system according to the seventh embodiment shown in FIG. 25.

FIG. 26(*a*) shows an equivalent circuit for sending a signal from LSI 55 having a power supply voltage VDDQ=V1 system to LSI 56 having a power supply voltage VDDQ=V2 system, and FIG. 26(*b*) shows an equivalent circuit for sending a signal from V2 LSI 56 to V1 LSI 55. In FIG. 26, V1>V2. Switches that are turned off, receivers, and drivers that are set to a high impedance state on the signal reception side that do not contribute to the values of potentials, are omitted from the illustration, and the resistances of switches that are turned on, are included in the values of the resistors forming the terminating resistor.

The driver for sending a signal comprises a pMOS and an nMOS transistors which are push-pull-connected. Bidirectional bus 57 which is a transmission line has a characteristic impedance Z0, and the receiver for receiving a signal is CTT-terminated.

For sending a signal from 1.5-V LSI 55, the value of resistor 66*a* and the value of resistor 66*b* forming a CTT termination on the signal reception side are set to 2Z0. Since the value of the terminating resistor is the same as the value obtained when resistors 66*a* and 66*b* are connected parallel to each other, the terminating resistor and bidirectional bus 57 are impedance-matched.

The on resistance of nMOS transistor 65*b* of the driver is set to a value equal to or lower than the characteristic impedance of bidirectional bus 57, e.g., R ?, and the on resistance of pMOS transistor 65*a* of the driver is set to R1 ?. At this time, R1 becomes:

$$R1 = (V1 \cdot Z0 \cdot Z0 - V2 \cdot Z0 \cdot Z0 + 0.5 V2 \cdot Z0 \cdot R)/(V1 \cdot R + 0.5 V \cdot Z0 - V2 \cdot R)$$

Thus, $$VOH2 = (0.5 V2 \cdot R1 + V1 \cdot Z0)/(R1 + Z0)$$

$$VOL2 = 0.5 V2 \cdot R/(R + Z0)$$

$$Vref2 = (V1 \cdot R + Z0 \cdot V2)/2(Z0 + R)$$

For sending a signal from 1.2-V LSI 56, the value of resistor 68*a* and the value of resistor 68*b* forming a CTT termination on the signal reception side are set to 2Z0. Since the value of the terminating resistor is the same as the value obtained when resistors 68*a* and 68*b* are connected parallel to each other, the signal reception end and bidirectional bus 57 are impedance-matched.

The on resistance of nMOS transistor 67*b* of the driver and the on resistance of pMOS transistor 67*a* of the driver thereof are set to a value equal to or lower than the characteristic impedance Z0 of bidirectional bus 57, e.g., R ?. Thus, $$VOH1 = (0.5V1 \cdot R + V2 \cdot Z0)/(R+Z0)$$

$$VOL1 = (V1 \cdot R + Z0 \cdot V2)/2(R+Z0)$$

$$Vref1 = (V1 \cdot R + Z0 \cdot V2)/2(Z0+R)$$

The value of Vref1 is the same as the value of Vref2.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. In the present embodiment, though the reference voltage generating circuit is of a somewhat complex arrangement, the minimum amplitude of the transmission signal can be slightly greater than with the example shown in FIG. 12. Furthermore, as the value of the reference voltage Vref does not deviate largely from the value of ½ of the power supply voltages VDDQ, a sufficient potential is applied between the drain and source of the pMOS transistor and the nMOS transistor of each driver, enabling efficient operation of the PMOS and the nMOS transistors. Moreover, since their input/output capacities can be reduced, they can be used in a circuit which is required to operate at a high speed.

FIG. 25 shows an example wherein the value of the reference voltage Vref is unified into 0.65 V. However, it can be unified into 0.7 V, for example, by adjusting the on resistance of the driver.

The seventh embodiment is identical in arrangement to the first embodiment (FIG. 10) in that it has a driver which is CTT-terminated and push-pull-connected that has an on resistance equal to the characteristic impedance of the transmission line. Therefore, these embodiments can also be realized by making the value of the on resistance of the driver variable.

Each of the above embodiments represents an arrangement wherein the on resistance of the driver is in conformity with the characteristic impedance of the transmission line or an arrangement wherein the value of the terminating resistor is in conformity with the characteristic impedance of the transmission line. However, both the arrangements may be combined with each other. Specifically, for sending a signal from the 1.5-V LSI, the on resistance of the driver may be in conformity with the characteristic impedance of the transmission line, and for sending a signal from the 1.2-V LSI, the value of the terminating resistor may be in conformity with the characteristic impedance of the transmission line, or vice versa. Furthermore, the value of the reference voltage Vref may be the same in each LSI.

FIG. 27 is a circuit diagram of an arrangement of an eighth embodiment of a signal transmission system according to the present invention.

FIG. 27 shows a circuit example for transmitting a single-ended signal between 1.5-V LSI 70 and 1.2-V LSI 71. FIG. 27(*a*) shows an equivalent circuit for sending a signal from 1.5-V LSI 70 to 1.2-V LSI 71, and FIG. 27(*b*) shows an equivalent circuit for sending a signal from 1.2-V LSI 71 to 1.5-V LSI 70.

In FIG. 27, switches that are turned off, receivers, and drivers that are set to a high impedance state on the signal reception side that do not contribute to the values of potentials, are omitted from the illustration, and the resistances of switches that are turned on, are included in the values of resistors 74 and 76.

The driver for sending a signal comprises a PMOS and an nMOS transistors which are push-pull-connected. Bidirectional bus 72 which is a transmission line has a characteristic impedance Z0 of 40 ?, and the receiver for receiving a signal is VTT-terminated.

0.6 V, which is ½ of the power supply voltage VDDQ (1.2 V) of 1.2-V LSI 71 on the reception side, is supplied as VTT which is used for sending a signal from 1.5-V LSI 70. 0.75 V, which is ½ of the power supply voltage VDDQ (1.5 V) of 1.5-V LSI 70 on the reception side, is supplied as VTT which is used for sending a signal from 1.2-V LSI 71.

In the signal transmission system according to the eighth embodiment, for sending a signal from 1.5-V LSI 70, the value of resistor 74 forming a VTT termination on the signal reception side is set to 40 ? which is the same as the characteristic impedance of bidirectional bus 72. Therefore, the terminating resistor and bidirectional bus 72 are impedance-matched.

The on resistance of nMOS transistor 73*b* of the driver is set to a value equal to or lower than the characteristic impedance of bidirectional bus 72, e.g., 20 ?, and the on resistance of pMOS transistor 73*a* of the driver is set to 25.45 ?. In this manner, VOH2=1.15 V, VOL2=0.20 V, and the reference voltage Vref2 is 0.675 V. In this case, since a signal amplitude value ? with respect to the reference voltage Vref2 is 0.475 V, the signal amplitude value is sufficiently maintained.

Alternatively, the on resistance of nMOS transistor 73*b* of the driver is set to a value equal to or lower than the characteristic impedance of bidirectional bus 72, e.g., 40 ?, and the on resistance of pMOS transistor 73*a* of the driver is also set to 40 ?. In this manner, VOH2=1.05 V, VOL2=0.30 V, and the reference voltage Vref2 is 0.675 V. In this case, since a signal amplitude value ? with respect to the reference voltage Vref2 is 0.375 V, the signal amplitude value is sufficiently maintained.

For sending a signal from 1.2-V LSI 71, the value of resistor 76 forming a VTT termination on the signal reception side is set to 40 ?, which is the same as the characteristic impedance of bidirectional bus 72. Therefore, the terminating resistor and bidirectional bus 72 are impedance-matched.

The on resistance of pMOS transistor 75*a* of the driver is set to a value equal to or lower than the characteristic impedance of bidirectional bus 72, e.g., 20 ?, and the on resistance of nMOS transistor 75*b* of the driver is set to 26.67 ?. In this manner, VOH1=1.05 V, VOL1=0.30 V, and the reference voltage Vref1 is 0.675 V, which is in conformity with the value of the reference voltage Vref2. In this case, since a signal amplitude value ? with respect to the reference voltage Vref1 is 0.375 V, the signal amplitude value is sufficiently maintained.

Alternatively, the on resistance of pMOS transistor 75*a* of the driver is set to a value equal to or lower than the characteristic impedance of bidirectional bus 72, e.g., 40 ?, and the on resistance of nMOS transistor 75*b* of the driver is set to 40 ?. In this manner, VOH1=0.975 V, VOL1=0.375 V, and the reference voltage Vref1 is 0.675 V, which is in conformity with the value of the reference voltage Vref2. In this case, since a signal amplitude value ? with respect to the reference voltage Vref1 is 0.30 V, the signal amplitude value is sufficiently maintained.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. In the present embodiment, furthermore, because the reference voltage Vref is set as Vref=0.25 (V1+V2), the reference voltage Vref can easily be generated. Therefore, the cost of the system can be lowered. Though two types of terminating voltages VTT are required in the present embodiment, no electric power is consumed at the terminating voltages VTT when the driver is in a high impedance state. Furthermore, as the value of the reference voltage Vref does not deviate largely from the value of ½ of the power supply voltages VDDQ, a sufficient potential is applied between the drain and source of the PMOS transistor and the nMOS transistor of each driver, enabling efficient operation of the pMOS and the nMOS transistors. Moreover, since their input/output capacities can be reduced, they can be used in a circuit which is required to operate at a high speed.

FIG. 28 is a circuit diagram of an arrangement of a generalized circuit of the signal transmission system according to the eighth embodiment shown in FIG. 27.

FIG. 28(a) shows an equivalent circuit for sending a signal from LSI 70 having a power supply voltage VDDQ=V1 system to LSI 71 having a power supply voltage VDDQ=V2 system, and FIG. 28(b) shows an equivalent circuit for sending a signal from V2 LSI 71 to V1 LSI 70. In FIG. 28, V1>V2. Switches that are turned off, receivers, and drivers that are set to a high impedance state on the signal reception side that do not contribute to the values of potentials, are omitted from the illustration, and the resistances of switches that are turned on, are included in the values of the resistors forming the terminating resistor.

The driver for sending a signal comprises a pMOS and an nMOS transistors which are push-pull-connected. Bidirectional bus 72 which is a transmission line has a characteristic impedance Z0, and the receiver for receiving a signal is VTT-terminated.

0.5V2, which is ½ of the power supply voltage VDDQ (V2) of V2 LSI 71 on the reception side, is supplied as VTT which is used for sending a signal from V1 LSI 70. 0.5V1, which is ½ of the power supply voltage VDDQ (V1) of V1 LSI 70 on the reception side, is supplied as VTT which is used for sending a signal from V2 LSI 71.

For sending a signal from V1 LSI 70, the value of resistor 74 forming a VTT termination on the signal reception side is set to Z0, which is the same as the characteristic impedance of bidirectional bus 72. Therefore, the terminating resistor and bidirectional bus 72 are impedance-matched.

The on resistance of nMOS transistor 73b of the driver is set to a value equal to or lower than the characteristic impedance Z0 of bidirectional bus 72, e.g., R ?, and the on resistance of pMOS transistor 73a of the driver is set to R1 ? so that Vref=0.25 (V1+V2). At this time, R1 becomes:

$R1=Z0(V2 \cdot Z0-V1 \cdot R-V1 \cdot Z0)/(V2 \cdot R-V1 \cdot Z0-V1 \cdot R)$

The high level VOH2 and low level VOL2 of the transmission signal are given as:

$VOH2=(V1-0.5V2)Z0/(R1+Z0)+0.5V2$ $VOL2=0.5V2 \cdot R/(Z0+R)$

Alternatively, the on resistance of nMOS transistor 73b of the driver is set to Z0 which is the same as the characteristic impedance Z0 of bidirectional bus 72, and the on resistance of pMOS transistor 73a of the driver is set to Z0 so that Vref=0.25 (V1+V2). At this time, the high level VOH2 and low level VOL2 of the transmission signal are given as:

$VOH2=0.5V1+0.25V2$ $VOL2=0.25V2$

For sending a signal from V2 LSI 71, the value of resistor 76 forming a VTT termination on the signal reception side is set to Z0, which is the same as the characteristic impedance of bidirectional bus 72. Therefore, the terminating resistor and bidirectional bus 72 are impedance-matched.

The on resistance of pMOS transistor 75a of the driver is set to a value equal to or lower than the characteristic impedance Z0 of bidirectional bus 72, e.g., R3 ?, and the on resistance of nMOS transistor 75b of the driver is set to R2 ? so that Vref=0.25 (V1+V2). At this time, R2 becomes:

$R2=Z0(V1 \cdot Z0+V2 \cdot R3-V2 \cdot Z0)/(V1 \cdot R3+V2 \cdot Z0-V2 \cdot R3)$ The high level VOH1 and low level VOL1 of the transmission signal are given as:

$VOH1=(V2-0.5V1)Z0/(R3+Z0)+0.5V1$ $VOL1=0.5V1 \cdot R2/(Z0+R2)$

Alternatively, the on resistance of pMOS transistor 75a of the driver is set to a value equal to or lower than the characteristic impedance Z0 of bidirectional bus 72, and the on resistance of nMOS transistor 75b of the driver is set to Z0 so that Vref=0.25 (V1+V2). At this time, the high level VOH1 and low level VOL1 of the transmission signal are given as:

$VOH1=0.25V1+0.5V2$ $VOL1=0.25V1$

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. Because the reference voltage Vref is set as Vref= 0.25 (V1+V2), the reference voltage Vref can easily be generated. Therefore, the cost of the system can be lowered. Though two types of terminating voltages VTT are required in the present embodiment, no electric power is consumed at the terminating voltages VTT when the driver is in a high impedance state. Furthermore, as the value of the reference voltage Vref does not deviate largely from the value of ½ of the power supply voltages VDDQ, a sufficient potential is applied between the drain and source of the pMOS transistor and the nMOS transistor of each driver, enabling efficient operation of the pMOS and the nMOS transistors. Moreover, since their input/output capacities can be reduced, they can be used in a circuit which is required to operate at a high speed.

Figure 29:
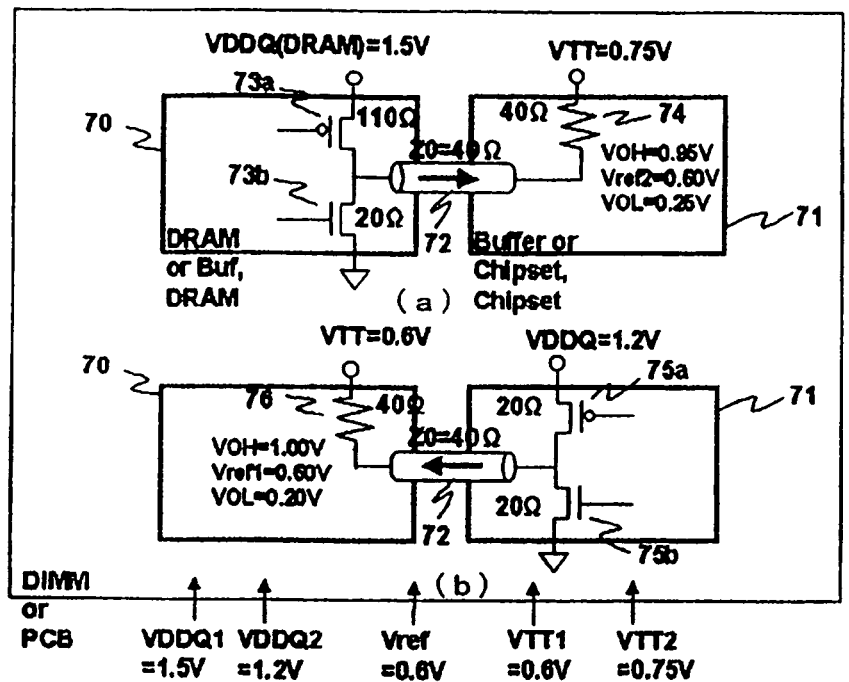
FIG. 29 is a circuit diagram of an arrangement of a ninth embodiment of a signal transmission system according to the present invention.

FIG. 29 is a circuit diagram of an arrangement of a ninth embodiment of a signal transmission system according to the present invention.

FIG. 29 shows a circuit example for transmitting a single-ended signal between 1.5-V LSI 70 and 1.2-V LSI 71. FIG. 29(a) shows an equivalent circuit for sending a signal from 1.5-V LSI 70 to 1.2-V LSI 71, and FIG. 29(b) shows an equivalent circuit for sending a signal from 1.2-V LSI 71 to 1.5-V LSI 70.

In FIG. 29, switches that are turned off, receivers, and drivers that are set to a high impedance state on the signal reception side that do not contribute to the values of potentials, are omitted from the illustration, and the resistances of switches that are turned on, are included in the values of resistors 74 and 76.

The driver for sending a signal comprises a pMOS and an nMOS transistors which are push-pull-connected. Bidirectional bus 72 which is a transmission line has a characteristic impedance Z0 of 40 ?, and the receiver for receiving a signal is VTT-terminated. Moreover, 0.6 V, which is ½ of the power supply voltage VDDQ (1.2 V) of 1.2-V LSI 71 on the reception side, is supplied as VTT which is used for sending a signal from 1.5-V LSI 70. 0.75 V, which is ½ of the power supply voltage VDDQ (1.5 V) of 1.5-V LSI 70 on the reception side, is supplied as VTT which is used for sending a signal from 1.2-V LSI 71.

In the signal transmission system according to the ninth embodiment, for sending a signal from 1.5-V LSI 70, the value of resistor 74 forming a VTT termination on the signal reception side is set to 40 ? which is the same as the characteristic impedance of bidirectional bus 72. Therefore, the terminating resistor and bidirectional bus 72 are impedance-matched.

The on resistance of nMOS transistor 73b of the driver is set to a value equal to or lower than the characteristic impedance of bidirectional bus 72, e.g., 20 ?, and the on resistance of pMOS transistor 73a of the driver is set to 110 ?. In this manner, VOH2=0.95 V, VOL2=0.25 V, and the reference voltage Vref2 is 0.6 V. In this case, since a signal amplitude value ? with respect to the reference voltage Vref2 is 0.35 V, the signal amplitude value is sufficiently maintained.

For sending a signal from 1.2-V LSI 71, the value of resistor 76 forming a VTT termination on the signal reception side is set to 40 ?, which is the same as the characteristic impedance of bidirectional bus 72. Therefore, the terminating resistor and bidirectional bus 72 are impedance-matched.

The on resistance of pMOS transistor 75a of the driver is set to a value equal to or lower than the characteristic impedance of bidirectional bus 72, e.g., 20 ?, and the on resistance of nMOS transistor 75b of the driver is also set to 20 ?. In this manner, VOH1=1.00 V, VOL1=0.20 V, and the reference voltage Vref1 is 0.6 V, which is in conformity with the value of the reference voltage Vref2. In this case, since a signal amplitude value ? with respect to the reference voltage Vref1 is 0.4 V, the signal amplitude value is sufficiently maintained.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. In the present embodiment, furthermore, because the reference voltage Vref is set as Vref=0.5V2, the reference voltage Vref can easily be generated. Therefore, the cost of the system can be lowered. Though two types of terminating voltages VTT are required in the present embodiment, no electric power is consumed at the terminating voltages VTT when the driver is in a high impedance state. Furthermore, as the value of the reference voltage Vref does not deviate largely from the value of ½ of the power supply voltages VDDQ, a sufficient potential is applied between the drain and source of the pMOS transistor and the nMOS transistor of each driver, enabling efficient operation of the pMOS and the nMOS transistors. Moreover, since their input/output capacities can be reduced, they can be used in a circuit which is required to operate at a high speed.

Figure 30:
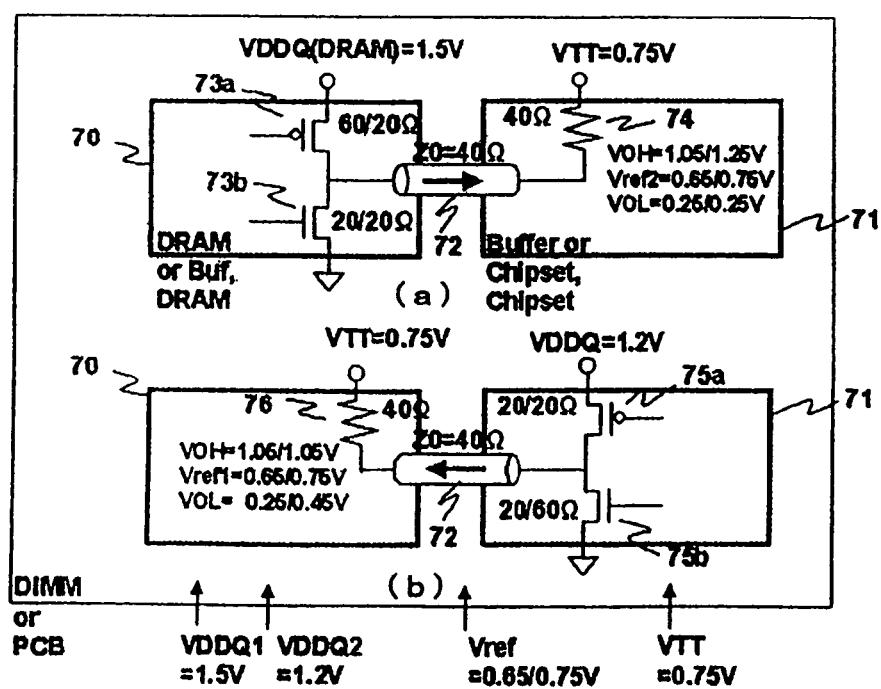
FIG. 30 is a circuit diagram of an arrangement of a tenth embodiment of a signal transmission system according to the present invention.

FIG. 30 is a circuit diagram of an arrangement of a tenth embodiment of a signal transmission system according to the present invention.

FIG. 30 shows a circuit example for transmitting a single-ended signal between 1.5-V LSI 70 and 1.2-V LSI 71. FIG. 30(*a*) shows an equivalent circuit for sending a signal from 1.5-V LSI 70 to 1.2-V LSI 71, and FIG. 30(*b*) shows an equivalent circuit for sending a signal from 1.2-V LSI 71 to 1.5-V LSI 70.

In FIG. 30, switches that are turned off, receivers, and drivers that are set to a high impedance state on the signal reception side that do not contribute to the values of potentials, are omitted from the illustration, and the resistances of switches that are turned on, are included in the values of resistors 74 and 76.

The driver for sending a signal comprises a PMOS and an nMOS transistors which are push-pull-connected. Bidirectional bus 72 which is a transmission line has a characteristic impedance Z0 of 40 ?, and the receiver for receiving a signal is VTT-terminated. Moreover, 1.5-V LSI 70 and 1.2-V LSI 71 are supplied with 0.75 V, which is ½ of the high VDDQ value (1.2 V), as the terminating voltage VTT.

In the signal transmission system according to the tenth embodiment, for sending a signal from 1.5-V LSI 70, the value of resistor 74 forming a VTT termination on the signal reception side is set to 40 ? which is the same as the characteristic impedance of bidirectional bus 72. Therefore, the terminating resistor and bidirectional bus 72 are impedance-matched.

The on resistance of nMOS transistor 73b of the driver is set to a value equal to or lower than the characteristic impedance of bidirectional bus 72, e.g., 20 ?, and the on resistance of pMOS transistor 73a of the driver is set to 60 ?. In this manner, VOH2=1.05 V, VOL2=0.25 V, and the reference voltage Vref2 is 0.65 V. In this case, since a signal amplitude value ? with respect to the reference voltage Vref2 is 0.4 V, the signal amplitude value is sufficiently maintained.

For sending a signal from 1.2-V LSI 71, the value of resistor 76 forming a VTT termination on the signal reception side is set to 40 ?, which is the same as the characteristic impedance of bidirectional bus 72. Therefore, the terminating resistor and bidirectional bus 72 are impedance-matched.

The on resistance of pMOS transistor 75a of the driver is set to a value equal to or lower than the characteristic impedance of bidirectional bus 72, e.g., 20 ?, and the on resistance of nMOS transistor 75b of the driver is also set to 20 ?. In this manner, VOH1=1.05 V, VOL1=0.25 V, and the reference voltage Vref1 is 0.6 V, which is in conformity with the value of the reference voltage Vref2. In this case, since a signal amplitude value ? with respect to the reference voltage Vref1 is 0.4 V, the signal amplitude value is sufficiently maintained.

In the present embodiment, the value of the reference voltage Vref can be set to 0.75 V by adjusting the values of the on resistances of the drivers to 73a=73b=75a=20 ?, 75b=60 ?. In this case, the present embodiment can be used as a system including another LSI for sending a signal to and receiving a signal from 1.5-V LSI 70.

For example, in the signal transmission system according to the second embodiment shown in FIG. 19, the LSI disposed in an intermediate position is supplied with the low VDDQ value. In the present invention, the LSI disposed in an intermediate position can be supplied with the high VDDQ value.

By thus setting the values of the terminating resistors and the on resistances of the drivers with respect to the characteristic impedance Z0 of the transmission line, the signal can be transmitted with good signal integrity. In addition, two types of power supply voltages VDDQ, one type of terminating voltage VTT, and one type of reference voltage Vref are sufficient. In the present embodiment, furthermore, because the reference voltage Vref is set as Vref=0.5V1, the reference voltage Vref can easily be generated. Therefore, the cost of the system can be lowered. No electric power is consumed at the terminating voltages VTT when the driver is in a high impedance state. Furthermore, as the value of the reference voltage Vref does not deviate largely from the value of ½ of the power supply voltages VDDQ, a sufficient potential is applied between the drain and source of the PMOS transistor and the nMOS transistor of each driver, enabling efficient operation of the pMOS and the nMOS transistors. Moreover, since their input/output capacities can be reduced, they can be used in a circuit which is required to operate at a high speed.

Figure 31:
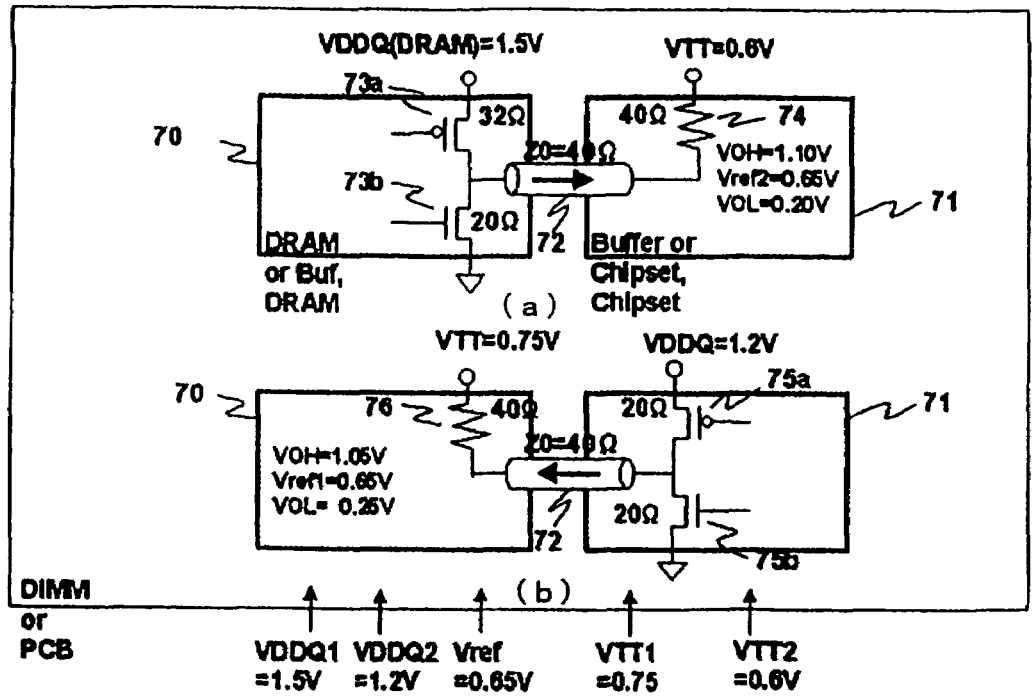
FIG. 31 is a circuit diagram of an arrangement of an eleventh embodiment of a signal transmission system according to the present invention.

FIG. 31 is a circuit diagram of an arrangement of an eleventh embodiment of a signal transmission system according to the present invention.

FIG. 31 shows a circuit example for transmitting a single-ended signal between 1.5-V LSI 70 and 1.2-V LSI 71. FIG. 31(a) shows an equivalent circuit for sending a signal from 1.5-V LSI 70 to 1.2-V LSI 71, and FIG. 31(b) shows an equivalent circuit for sending a signal from 1.2-V LSI 71 to 1.5-V LSI 70.

In FIG. 31, switches that are turned off, receivers, and drivers that are set to a high impedance state on the signal reception side that do not contribute to the values of potentials, are omitted from the illustration, and the resistances of switches that are turned on, are included in the values of resistors 74 and 76.

The driver for sending a signal comprises a pMOS and an nMOS transistors which are push-pull-connected. Bidirectional bus 72 which is a transmission line has a characteristic impedance Z0 of 40 ?, and the receiver for receiving a signal is VTT-terminated. Moreover, 0.6 V, which is ½ of the power supply voltage VDDQ (1.2 V) of 1.2-V LSI 71 on the reception side, is supplied as VTT which is used for sending a signal from 1.5-V LSI 70. 0.75 V, which is ½ of the power supply voltage VDDQ (1.5 V) of 1.5-V LSI 70 on the reception side, is supplied as VTT which is used for sending a signal from 1.2-V LSI 71.

In the signal transmission system according to the eleventh embodiment, for sending a signal from 1.5-V LSI 70, the value of resistor 74 forming a VTT termination on the signal reception side is set to 40 ? which is the same as the characteristic impedance of bidirectional bus 72. Therefore, the terminating resistor and bidirectional bus 72 are impedance-matched.

The on resistance of nMOS transistor 73b of the driver is set to a value equal to or lower than the characteristic impedance of bidirectional bus 72, e.g., 20 ?, and the on resistance of pMOS transistor 73a of the driver is set to 32 ?. In this manner, VOH2=1.10 V, VOL2=0.2 V, and the reference voltage Vref2 is 0.65 V. In this case, since a signal amplitude value ? with respect to the reference voltage Vref2 is 0.45 V, the signal amplitude value is sufficiently maintained.

For sending a signal from 1.2-V LSI 71, the value of resistor 76 forming a VTT termination on the signal reception side is set to 40 ?, which is the same as the characteristic impedance of bidirectional bus 72. Therefore, the terminating resistor and bidirectional bus 72 are impedance-matched.

The on resistance of pMOS transistor 75a of the driver and the on resistance of nMOS transistor 75b of the driver are set to a value equal to or lower than the characteristic impedance of bidirectional bus 72, e.g., 20 ?. In this manner, VOH1=1.05 V, VOL1=0.25 V, and the reference voltage Vref1 is 0.65 V, which is in conformity with the value of the reference voltage Vref2. In this case, since a signal amplitude value ? with respect to the reference voltage Vref1 is 0.40 V, the signal amplitude value is sufficiently maintained.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. In the present embodiment, though the reference voltage generating circuit is of a somewhat complex arrangement, the minimum amplitude of the transmission signal can be slightly greater than with the eighth embodiment shown in FIG. 27. Furthermore, though two types of terminating voltages VTT are required in the present embodiment, no electric power is consumed at the terminating voltages VTT when the driver is in a high impedance state. Furthermore, as the value of the reference voltage Vref does not deviate largely from the value of ½ of the power supply voltages VDDQ, a sufficient potential is applied between the drain and source of the pMOS transistor and the nMOS transistor of each driver, enabling efficient operation of the pMOS and the nMOS transistors. Moreover, since their input/output capacities can be reduced, they can be used in a circuit which is required to operate at a high speed.

Figure 32:
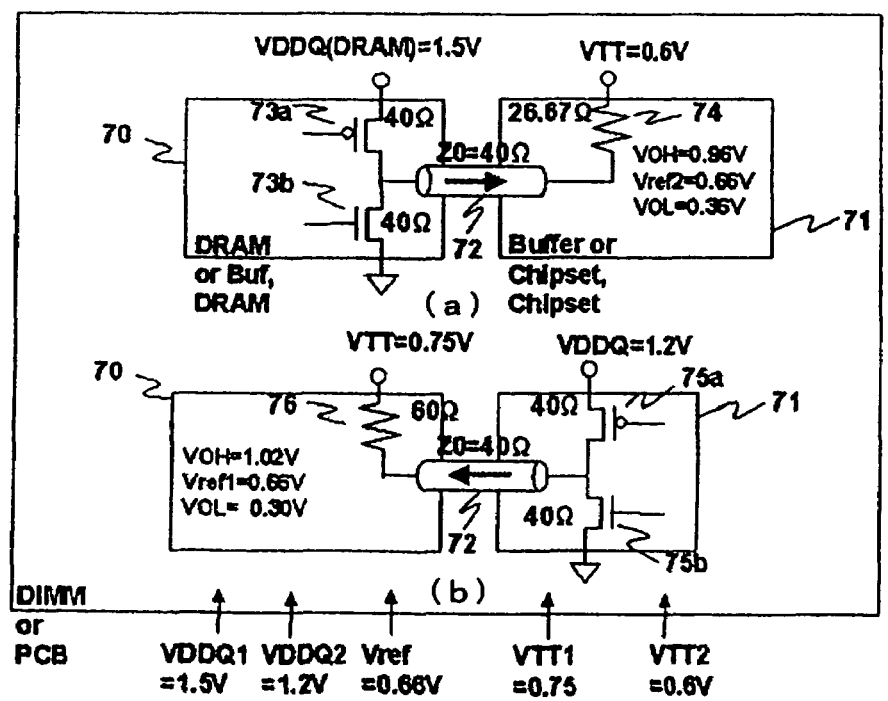
FIG. 32 is a circuit diagram of an arrangement of a twelfth embodiment of a signal transmission system according to the present invention.

FIG. 32 is a circuit diagram of an arrangement of a twelfth embodiment of a signal transmission system according to the present invention.

FIG. 32 shows a circuit example for transmitting a single-ended signal between 1.5-V LSI 70 and 1.2-V LSI 71. FIG. 32(a) shows an equivalent circuit for sending a signal from 1.5-V LSI 70 to 1.2-V LSI 71, and FIG. 32(b) shows an equivalent circuit for sending a signal from 1.2-V LSI 71 to 1.5-V LSI 70.

In FIG. 32, switches that are turned off, receivers, and drivers that are set to a high impedance state on the signal reception side that do not contribute to the values of potentials, are omitted from the illustration, and the resistances of switches that are turned on, are included in the values of resistors 74 and 76.

The driver for sending a signal comprises a pMOS and an nMOS transistors which are push-pull-connected. Bidirectional bus 72 which is a transmission line has a characteristic impedance Z0 of 40 ?, and the receiver for receiving a signal is VTT-terminated. Moreover, 0.6 V, which is ½ of the power supply voltage VDDQ (1.2 V) of 1.2-V LSI 71 on the reception side, is supplied as VTT which is used for sending a signal from 1.5-V LSI 70. 0.75 V, which is ½ of the power supply voltage VDDQ (1.5 V) of 1.5-V LSI 70 on the reception side, is supplied as VTT which is used for sending a signal from 1.2-V LSI 71.

In the signal transmission system according to the twelfth embodiment, for sending a signal from 1.5-V LSI 70, the on resistance of pMOS transistor 73a of the driver and the on resistance of nMOS transistor 73b of the driver are set to 40 ? which is the same as the characteristic impedance of bidirectional bus 72. Therefore, the on resistance of the driver and bidirectional bus 72 are impedance-matched.

For example, the value of resistor 74 forming a VTT termination on the signal reception side is set to 26.67 ?. In this manner, VOH2=0.96 V, VOL2=0.36 V, and the reference voltage Vref2 is 0.66 V. In this case, since a signal amplitude value ? with respect to the reference voltage Vref2 is 0.33 V, the signal amplitude value is sufficiently maintained.

For sending a signal from 1.2-V LSI 71, the on resistance of pMOS transistor 75a of the driver and the on resistance of nMOS transistor 75b of the driver are set to 40 ? which is the same as the characteristic impedance of bidirectional bus 72. Therefore, the on resistance of the driver and bidirectional bus 72 are impedance-matched.

For example, the value of resistor 76 forming a VTT termination on the signal reception side is set to 60 ?. In this manner, VOH1=1.02 V, VOL1=0.30 V, and the reference voltage Vref1 is 0.66 V, which is in conformity with the value of the reference voltage Vref2. In this case, since a signal amplitude value ? with respect to the reference voltage Vref1 is 0.36 V, the signal amplitude value is sufficiently maintained.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. Though two types of terminating voltages VTT are required in the present embodiment, no electric power is consumed at the terminating voltages VTT when the driver is in a high impedance state. Furthermore, as the value of the reference voltage Vref does not deviate largely from the value of ½ of the power supply voltages VDDQ, a sufficient potential is applied between the drain and source of the PMOS transistor and the nMOS transistor of each driver, enabling efficient operation of the pMOS and the nMOS transistors. Moreover, since their input/output capacities can be reduced, they can be used in a circuit which is required to operate at a high speed.

Figure 33:
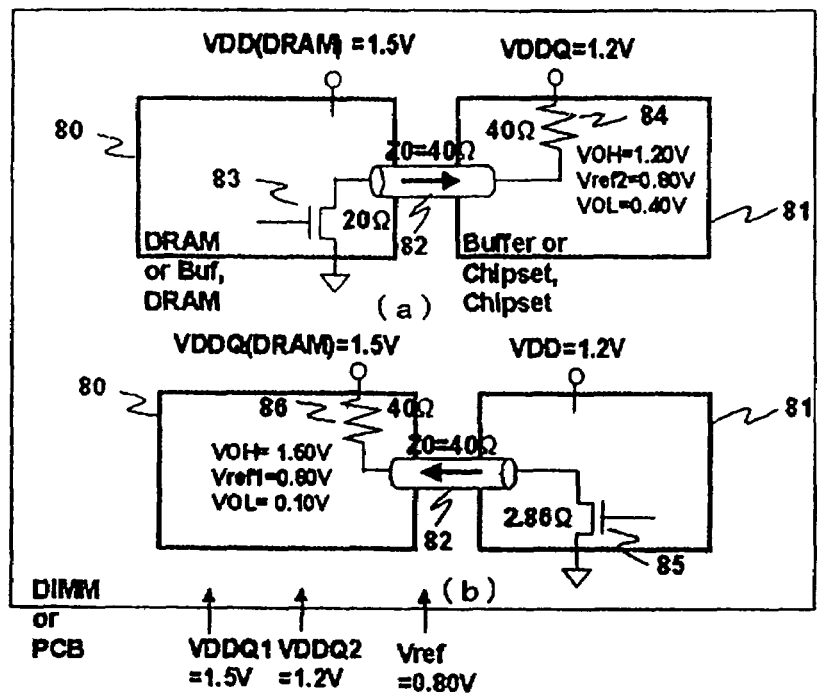
FIG. 33 is a circuit diagram of an arrangement of a thirteenth embodiment of a signal transmission system according to the present invention.

FIG. 33 is a circuit diagram of an arrangement of a thirteenth embodiment of a signal transmission system according to the present invention.

FIG. 33 shows a circuit example for transmitting a single-ended signal between 1.5-V LSI 80 and 1.2-V LSI 81. FIG. 33(a) shows an equivalent circuit for sending a signal from 1.5-V LSI 80 to 1.2-V LSI 81, and FIG. 33(b) shows an equivalent circuit for sending a signal from 1.2-V LSI 81 to 1.5-V LSI 80.

In FIG. 33, switches that are turned off, receivers, and drivers that are set to a high impedance state on the signal reception side that do not contribute to the values of potentials, are omitted from the illustration, and the resistances of switches that are turned on, are included in the values of resistors 84 and 86.

The driver for sending a signal is an open drain circuit comprising an nMOS transistor (open drain configuration). Bidirectional bus 82 which is a transmission line has a characteristic impedance Z0 of 40 ?, and the receiver for receiving a signal is VTT-terminated. Moreover, 1.2 V, which is the power supply voltage VDDQ of 1.2-V LSI 81 on the reception side, is supplied as VTT which is used for sending a signal from 1.5-V LSI 80. 1.5 V, which is the power supply voltage VDDQ of 1.5-V LSI 80 on the reception side, is supplied as VTT which is used for sending a signal from 1.2-V LSI 81.

In the signal transmission system according to the thirteenth embodiment, for sending a signal from 1.5-V LSI 80, the value of resistor 84 forming a VTT termination on the signal reception side is set to 40 ? which is the same as the characteristic impedance of bidirectional bus 82. Therefore, the terminating resistor and bidirectional bus 82 are impedance-matched.

The on resistance of nMOS transistor 83 of the driver is set to a value equal to or lower than the characteristic impedance of bidirectional bus 82, e.g., 20 ?. In this manner, VOH2=1.2 V, VOL2=0.40 V, and the reference voltage Vref2 is 0.80 V. In this case, since a signal amplitude value ? with respect to the reference voltage Vref2 is 0.40 V, the signal amplitude value is sufficiently sufficiently.

For sending a signal from 1.2-V LSI 81, the value of resistor 86 forming a VTT termination on the signal reception side is set to 40 ?, which is the same as the characteristic impedance of bidirectional bus 82. Therefore, the terminating resistor and bidirectional bus 82 are impedance-matched.

For example, the on resistance of nMOS transistor 85 of the driver is set to 2.86 ?. In this manner, VOH1=1.50 V, VOL1=0.10 V, and the reference voltage Vref1 is 0.80 V, which is in conformity with the value of the reference voltage Vref2. In this case, since a signal amplitude value ? with respect to the reference voltage Vref1 is 0.70 V, the signal amplitude value is sufficiently maintained.

If the path of return current of a signal flowing on bidirectional bus 82 is a ground plane which is common to 1.5-V LSI 80 and 1.2-V LSI 81, then a printed board can easily be designed. If the power supply voltage VDDQ is used as the path of return current, then since the 1.5-V power supply and the 1.2-V power supply need to be used as the path of return current, problems arise which make the layout of interconnections difficult and increase the number of layers of the printed board. Therefore, it is preferable that the path of return current of a signal flowing on bidirectional bus 82 be a ground plane.

By thus providing the VTT termination connected to the power supply voltage VDDQ and the open drain driver, and setting the values of the terminating resistors and the on resistances of the drivers as described above with respect to the characteristic impedance Z0 of the transmission line, the signal can be transmitted with good signal integrity. In the present embodiment, two types of power supply voltages VDDQ and one type of reference voltages Vref are sufficient. In addition, since the reference voltage Vref is 0.8 V=(⅔)V2, the reference voltage Vref can easily be generated. Thus, the cost of the system is lowered. Furthermore, no electric power is consumed at the terminating voltages VTT when the driver is in a high impedance state. Furthermore, since a sufficient potential is applied between the drain and source of the nMOS transistor of each driver, the nMOS transistor operates efficiently. Moreover, since its input/output capacity can be reduced, it can be used in a circuit which is required to operate at a high speed. As the value of the reference voltage Vref is large, the receiver can be designed with ease.

Figure 34:
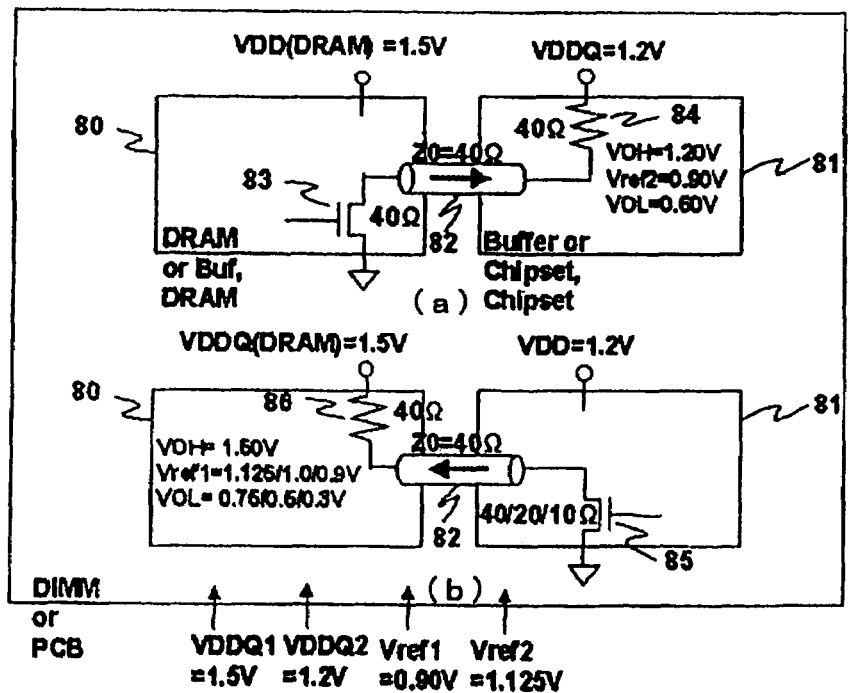
FIG. 34 is a circuit diagram of an arrangement of a fourteenth embodiment of a signal transmission system according to the present invention.

FIG. 34 is a circuit diagram of an arrangement of a fourteenth embodiment of a signal transmission system according to the present invention.

FIG. 34 shows a circuit example for transmitting a single-ended signal between 1.5-V LSI 80 and 1.2-V LSI 81. FIG. 34(a) shows an equivalent circuit for sending a signal from 1.5-V LSI 80 to 1.2-V LSI 81, and FIG. 34(b) shows an equivalent circuit for sending a signal from 1.2-V LSI 81 to 1.5-V LSI 80.

In FIG. 34, switches that are turned off, receivers, and drivers that are set to a high impedance state on the signal reception side that do not contribute to the values of potentials, are omitted from the illustration, and the resistances of switches that are turned on, are included in the values of resistors 84 and 86.

The driver for sending a signal is an open drain circuit comprising an nMOS transistor. Bidirectional bus 82 which is a transmission line has a characteristic impedance Z0 of 40 ?, and the receiver for receiving a signal is VTT-terminated. Moreover, 1.2 V, which is the same as the power supply voltage VDDQ of 1.2-V LSI 81 on the reception side, is supplied as VTT which is used for sending a signal from 1.5-V LSI 80. 1.5 V, which is the same as the power supply voltage VDDQ of 1.5-V LSI 80 on the reception side, is supplied as VTT which is used for sending a signal from 1.2-V LSI 81.

In the signal transmission system according to the fourteenth embodiment, for sending a signal from 1.5-V LSI 80, the value of resistor 84 forming a VTT termination on the signal reception side is set to 40 Ω which is the same as the characteristic impedance of bidirectional bus 82. Therefore, the terminating resistor and bidirectional bus 82 are impedance-matched.

The on resistance of nMOS transistor 83 of the driver is set to a value equal to or lower than the characteristic impedance of bidirectional bus 82, e.g., 40 Ω. In this manner, $VOH2=1.2$ V, $VOL2=0.60$ V, and the reference voltage Vref2 is 0.90 V. In this case, since a signal amplitude value ? with respect to the reference voltage Vref2 is 0.30 V, the signal amplitude value is sufficiently maintained. The value of an input level (0.25 V) with respect to the reference voltage Vref, which is provided for by SSTL-1.8, for example, may be used as a guide indicative of ?.

For sending a signal from 1.2-V LSI 81, the value of resistor 86 forming a VTT termination on the signal reception side is set to 40 Ω, which is the same as the characteristic impedance of bidirectional bus 82. Therefore, the terminating resistor and bidirectional bus 82 are impedance-matched.

The on resistance of nMOS transistor 85 of the driver is set to a value equal to or lower than the characteristic impedance Z0 of bidirectional bus 82, e.g., 40 Ω. In this manner, $VOH1=1.50$ V, $VOL1=0.75$ V, and the reference voltage Vref1 is 1.125 V. In this case, since a signal amplitude value ? with respect to the reference voltage Vref1 is 0.375 V, the signal amplitude value is sufficiently maintained.

In the present embodiment, the reference voltage Vref1 and the reference voltage Vref2 are not in conformity with each other. However, since there are two types of power supply voltages VDDQ and two types of reference voltages Vref, the types of power supplies may be relatively few.

By thus providing the VTT termination connected to the power supply voltage VDDQ and the open drain driver, and setting the values of the terminating resistors and the on resistances of the drivers as described above with respect to the characteristic impedance Z0 of the transmission line, the signal can be transmitted with good signal integrity. Two types of power supply voltages VDDQ and two types of reference voltages Vref are sufficient. In addition, since the reference voltage Vref2 is 0.6V1 (0.9 V) or (¾)V2, the reference voltage Vref2 can easily be generated.

The reference voltage Vref1 is 1.125 V. If the reference voltage Vref1 is to be generated with ease, then the on resistance of nMOS transistor 85 of the driver may be set to 20 Ω. In this case, as $VOH1=1.5$ V, $VOL1=0.5$ V, and the reference voltage Vref1 is (⅔)V1, it is easy to generate the reference voltage Vref 1. If the reference voltage Vref1 and the reference voltage Vref2 are to be in conformity with each other, then the on resistance of nMOS transistor 85 of the driver may be set to 10 Ω. In this case, as $VOH1=1.5$ V, $VOL1=0.3$ V, and the reference voltage Vref1 is 0.9V. Since this value is 0.6V1 or (⅗)V2, it can easily be generated. Thus, the cost of the system is lowered. Furthermore, no electric power is consumed at the terminating voltages VTT when the driver is in a high impedance state. Furthermore, since a sufficient potential is applied between the drain and source of the nMOS transistor of each driver, the nMOS transistor operates efficiently. Moreover, since its input/output capacity can be reduced, it can be used in a circuit which is required to operate at a high speed. As the value of the reference voltage Vref is large, the receiver can be designed with ease.

Figure 35:
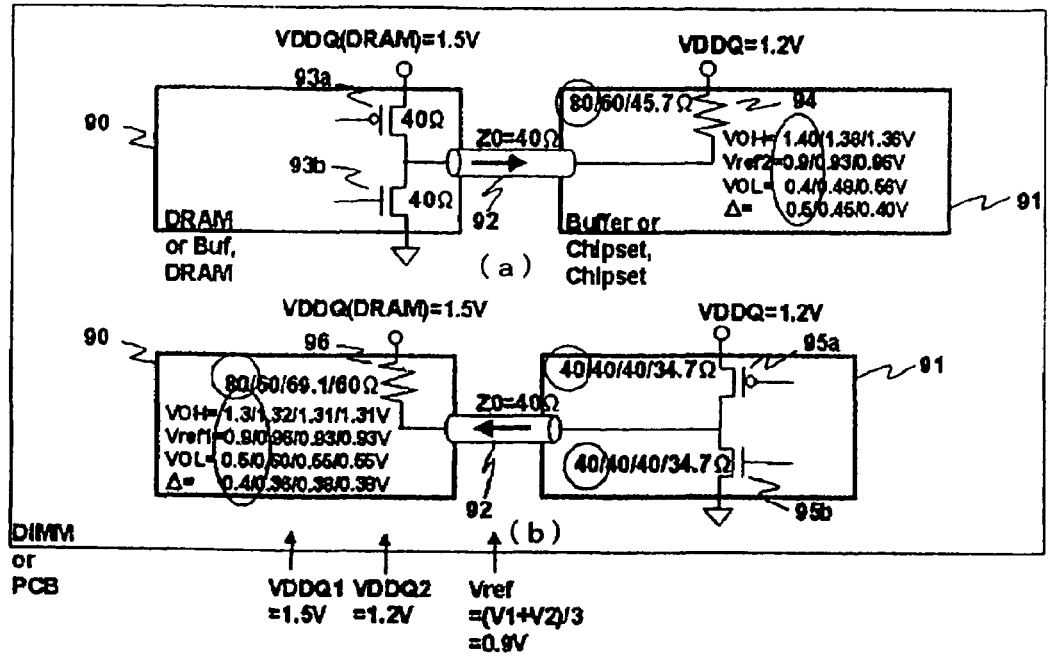
FIG. 35 is a circuit diagram of an arrangement of a fifteenth embodiment of a signal transmission system according to the present invention.

FIG. 35 is a circuit diagram of an arrangement of a fifteenth embodiment of a signal transmission system according to the present invention.

FIG. 35 shows a circuit example for transmitting a single-ended signal between 1.5-V LSI 90 and 1.2-V LSI 91. FIG. 35(*a*) shows an equivalent circuit for sending a signal from 1.5-V LSI 90 to 1.2-V LSI 91, and FIG. 35(*b*) shows an equivalent circuit for sending a signal from 1.2-V LSI 91 to 1.5-V LSI 90.

In FIG. 35, switches that are turned off, receivers, and drivers that are set to a high impedance state on the signal reception side that do not contribute to the values of potentials, are omitted from the illustration, and the resistances of switches that are turned on, are included in the values of resistors 94 and 96.

The driver for sending a signal comprises a pMOS and an nMOS transistors which are push-pull-connected. Bidirectional bus 92 which is a transmission line has a characteristic impedance Z0 of 40 Ω, and the receiver for receiving a signal is VTT-terminated. Moreover, 1.2 V, which is the same as the power supply voltage VDDQ of 1.2-V LSI 91 on the reception side, is supplied as VTT which is used for sending a signal from 1.5-V LSI 90. 1.5 V, which is the same as the power supply voltage VDDQ of 1.5-V LSI 90 on the reception side, is supplied as VTT which is used for sending a signal from 1.2-V LSI 91.

In the signal transmission system according to the fifteenth embodiment, for sending a signal from 1.5-V LSI 90, the on resistance of the pMOS transistor 93*a* of the driver and the on resistance of nMOS transistor 93*b* of the driver thereof are set to 40 Ω, which is the same as the characteristic impedance of bidirectional bus 92. Consequently, the on resistance of the driver and bidirectional bus 92 are impedance-matched.

The value of resistor 94 forming a VTT termination on the signal reception side is set to a value equal to or higher than the characteristic impedance of bidirectional bus 92, e.g., 2Z0=80 Ω. In this manner, $VOH2=1.40$ V, $VOL2=0.40$ V, and the reference voltage Vref2 is 0.9 V. In this case, since a signal amplitude value ? with respect to the reference voltage Vref2 is 0.50 V, the signal amplitude value is sufficiently maintained.

While the value of resistor 94 may be set to 60 Ω or the like, the value of resistor 94 should preferably be set to 2Z0 (80 Ω) in order to facilitate the generation of the reference voltage Vref2. At this time, the reference voltage Vref2 is obtained as (V1+V2)/3.

For sending a signal from 1.2-V LSI 91, the on resistance of the pMOS transistor 95*a* of the driver and the on resistance of nMOS transistor 95*b* of the driver thereof are set to 40 Ω, which is the same as the characteristic impedance of bidirectional bus 92. Therefore, the on resistance of the driver and bidirectional bus 92 are impedance-matched.

The value of resistor 96 forming a VTT terminal on the signal reception side is set to a value equal to or higher than the characteristic impedance of bidirectional bus 92, e.g., 2Z0=80 Ω. In this manner, $VOH1=1.30$ V, $VOL1=0.50$ V, and the reference voltage Vref1 is 0.9 V, which is in conformity with the value of the reference voltage Vref2. In this case, since a signal amplitude value ? with respect to the reference voltage Vref1 is 0.40 V, the signal amplitude value is sufficiently maintained.

While the value of resistor 96 may be set to 69.1 Ω or the like, the value of resistor 96 should preferably be set to 2Z0 (80 Ω) in order to facilitate the generation of the reference voltage Vref1. At this time, the reference voltage Vref1 is obtained according to (V1+V2)/3.

In the present embodiment, the path of return current of a signal flowing on bidirectional bus 92 is a ground plane which is common to 1.5-V LSI 90 and 1.2-V LSI 91. This allows a printed board to be easily designed. If the power supply voltage VDDQ is used as the path of return current, then since the 1.5-V power supply and the 1.2-V power supply need to be used as the path of return current, problems arise which make the layout of interconnections difficult and increase the number of layers of the printed board. Therefore, it is preferable that the path of return current of a signal flowing on bidirectional bus 92 be a ground plane.

By thus providing the VTT termination connected to the power supply voltage VDDQ and the push-pull driver, and setting the values of the terminating resistors and the on resistances of the drivers as described above with respect to the characteristic impedance Z0 of the transmission line, the signal can be transmitted with good signal integrity. Two types of power supply voltages VDDQ and one type of reference voltage Vref are sufficient. In addition, since the reference voltage Vref is set to (V1+V2)/3 in the present embodiment, the reference voltage Vref can easily be generated. Thus, the cost of the system is lowered. Furthermore, no electric power is consumed at the terminating voltages VTT when the driver is in a high impedance state. In the present embodiment, while the value of the reference voltage Vref deviates slightly from the value of ½ of the power supply voltages VDDQ, it does not pose a significant problem.

Figure 36:
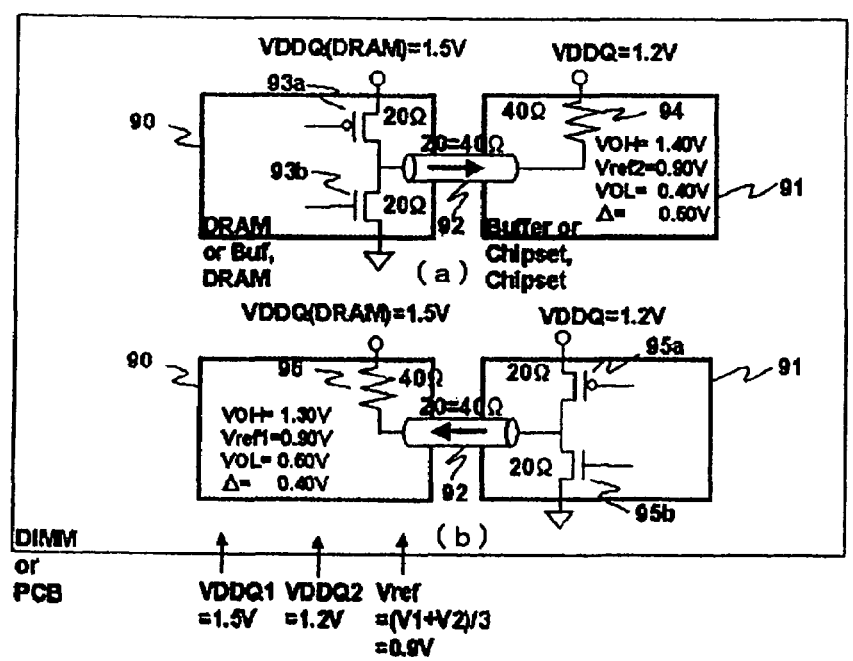
FIG. 36 is a circuit diagram of an arrangement of a sixteenth embodiment of a signal transmission system according to the present invention.

FIG. 36 is a circuit diagram of an arrangement of a sixteenth embodiment of a signal transmission system according to the present invention.

FIG. 36 shows a circuit example for transmitting a single-ended signal between 1.5-V LSI 90 and 1.2-V LSI 91. FIG. 36(a) shows an equivalent circuit for sending a signal from 1.5-V LSI 90 to 1.2-V LSI 91, and FIG. 36(b) shows an equivalent circuit for sending a signal from 1.2-V LSI 91 to 1.5-V LSI 90.

In FIG. 36, switches that are turned off, receivers, and drivers that are set to a high impedance state on the signal reception side that do not contribute to the values of potentials, are omitted from the illustration, and the resistances of switches that are turned on, are included in the values of resistors 94 and 96.

The driver for sending a signal comprises a pMOS and an nMOS transistors which are push-pull-connected. Bidirectional bus 92 which is a transmission line has a characteristic impedance Z0 of 40 Ω, and the receiver for receiving a signal is VTT-terminated. Moreover, 1.2 V, which is the same as the power supply voltage VDDQ supplied to 1.2-V LSI 91 on the reception side, is supplied as VTT which is used for sending a signal from 1.5-V LSI 90. 1.5 V, which is the same as the power supply voltage VDDQ supplied to 1.5-V LSI 90 on the reception side, is supplied as VTT which is used for sending a signal from 1.2-V LSI 91.

In the signal transmission system according to the sixteenth embodiment, for sending a signal from 1.5-V LSI 90, the value of resistor 94 forming a VTT termination on the signal reception side is set to 40 Ω which is the same as the characteristic impedance of bidirectional bus 92. Consequently, the terminating resistor and bidirectional bus 92 are impedance-matched.

The on resistance of the pMOS transistor 93a of the driver and the on resistance of nMOS transistor 93b of the driver thereof are set to 20 Ω, which is ½ of the characteristic impedance Z0 of bidirectional bus 92. In this manner, VOH2=1.40 V, VOL2=0.40 V, and the reference voltage Vref2 is 0.9 V. In this case, since a signal amplitude value Δ with respect to the reference voltage Vref2 is 0.50 V, the signal amplitude value is sufficiently maintained. At this time, the reference voltage Vref2 is obtained as (V1+V2)/3.

For sending a signal from 1.2-V LSI 91, the value of resistor 96 forming a VTT termination on the signal reception side is set to 40 Ω which is the same as the characteristic impedance of bidirectional bus 92. Consequently, the terminating resistor and bidirectional bus 92 are impedance-matched.

The on resistance of the pMOS transistor 95a of the driver and the on resistance of nMOS transistor 95b of the driver thereof are set to 20 Ω, which is ½ of the characteristic impedance Z0 of bidirectional bus 92. In this manner, VOH1=1.30 V, VOL1=0.50 V, and the reference voltage Vref1 is 0.9 V, which is in conformity with the reference voltage Vref2. In this case, since a signal amplitude value Δ with respect to the reference voltage Vref1 is 0.40 V, the signal amplitude value is sufficiently maintained. At this time, the reference voltage Vref1 is obtained as (V1+V2)/3.

By thus providing the VTT termination connected to the power supply voltage VDDQ and the push-pull driver, and setting the values of the terminating resistors and the on resistances of the drivers as described above with respect to the characteristic impedance Z0 of the transmission line, the signal can be transmitted with good signal integrity. Two types of power supply voltages VDDQ and one type of reference voltage Vref are sufficient. In addition, since the reference voltage Vref is set to (V1+V2)/3 in the present embodiment, the reference voltage Vref can easily be generated. Thus, the cost of the system is lowered. Furthermore, no electric power is consumed at the terminating voltages VTT when the driver is in a high impedance state. In the present embodiment, while the value of the reference voltage Vref deviates slightly from the value of ½ of the power supply voltages VDDQ, it does not pose a significant problem.

Figure 37:
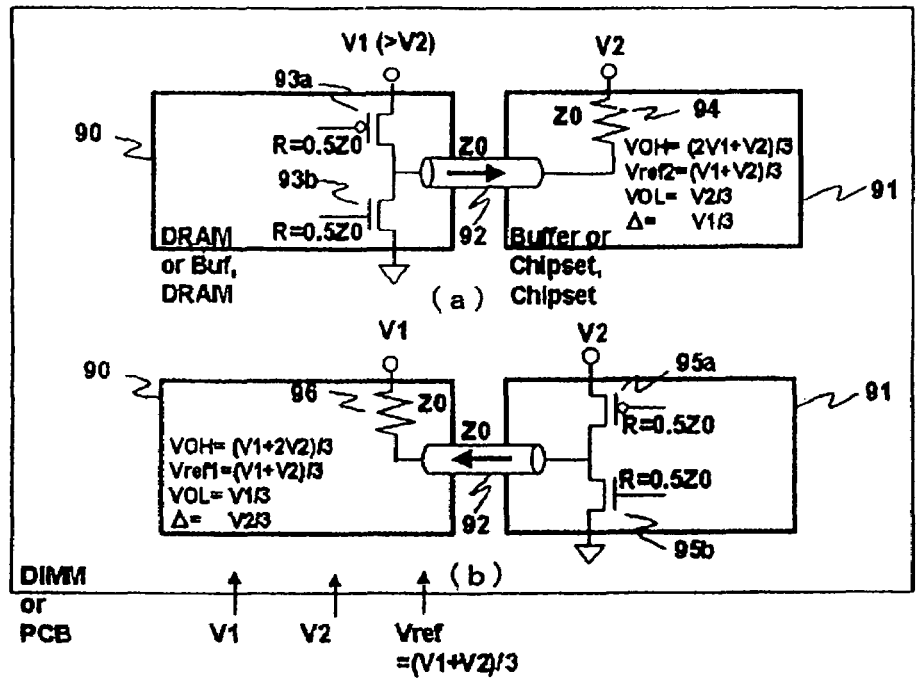
FIG. 37 is a circuit diagram of an arrangement of a generalized circuit of the signal transmission system according to the sixteenth embodiment shown in FIG. 36.

FIG. 37 is a circuit diagram of an arrangement of a generalized circuit of the signal transmission system according to the sixteenth embodiment shown in FIG. 36.

FIG. 37(a) shows an equivalent circuit for sending a signal from LSI 90 having a power supply voltage VDDQ=V1 system to LSI 91 having a power supply voltage VDDQ=V2 system, and FIG. 37(b) shows an equivalent circuit for sending a signal from V2 LSI 91 to V1 LSI 90.

In FIG. 37, V1>V2. Switches that are turned off, receivers, and drivers that are set to a high impedance state on the signal reception side that do not contribute to the values of potentials, are omitted from the illustration, and the resistances of switches that are turned on, are included in the values of the resistors forming the terminating resistor.

The driver for sending a signal comprises a pMOS and an nMOS transistors which are push-pull-connected. Bidirectional bus 92 which is a transmission line has a characteristic impedance Z0, and the receiver for receiving a signal is VTT-terminated. V2, which is the same as the power supply voltage VDDQ supplied to LSI 91 on the reception side, is supplied as VTT which is used for sending a signal from V1 LSI 90. V1, which is the same as the power supply voltage VDDQ of LSI 90 on the reception side, is supplied as VTT which is used for sending a signal from V2 LSI 91.

For sending a signal from V1 LSI 90, the value of resistor 94 forming a VTT termination on the signal reception side is set to Z0 which is the same as the characteristic impedance of bidirectional bus 92. Consequently, the terminating resistor and bidirectional bus 92 are impedance-matched.

The on resistance of the pMOS transistor 93a of the driver and the on resistance of nMOS transistor 93b of the driver thereof are set to ½ of the characteristic impedance Z0 of bidirectional bus 92. Thus, $$VOH2=(2V1+V2)/3$$

$$VOL2=V2/3$$

$$Vref2=(V1+V2)/3$$

For sending a signal from V2 LSI 91, the value of resistor 96 forming a VTT termination on the signal reception side is set to Z0 which is the same as the characteristic impedance of bidirectional bus 92. Consequently, the terminating resistor and bidirectional bus 92 are impedance-matched.

The on resistance of the pMOS transistor 95a of the driver and the on resistance of nMOS transistor 95b of the driver thereof are set to ½ of the characteristic impedance Z0 of bidirectional bus 92. Thus, $$VOH=(V1+2V2)/3$$

$$VOL1=V1/3$$

$$Vref1(V1+V2)/3$$

Vre1 is in conformity with Vref2.

By thus providing the VTT termination connected to the power supply voltage VDDQ and the push-pull driver, and setting the values of the terminating resistors and the on resistances of the drivers as described above with respect to the characteristic impedance Z0 of the transmission line, the signal can be transmitted with good signal integrity. Two types of power supply voltages VDDQ and one type of reference voltage Vref are sufficient. In addition, since the reference voltage Vref is set to (V1+V2)/3 in the present embodiment, the reference voltage Vref can easily be generated. Thus, the cost of the system is lowered. Furthermore, no electric power is consumed at the terminating voltages VTT when the driver is in a high impedance state. In the present embodiment, while the value of the reference voltage Vref deviates slightly from the value of ½ of the power supply voltages VDDQ, it does not pose a significant problem.

FIG. 38 is a circuit diagram of an arrangement of reference voltage generating circuits for use in the signal transmission system shown in FIG. 37.

Figure 38A:
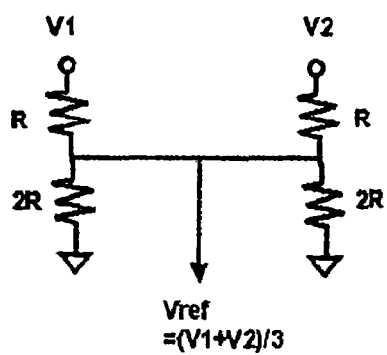
FIG. 38 is a circuit diagram of an arrangement of reference voltage generating circuits for use in the signal transmission system shown in FIG. 37.
Figure 38B:
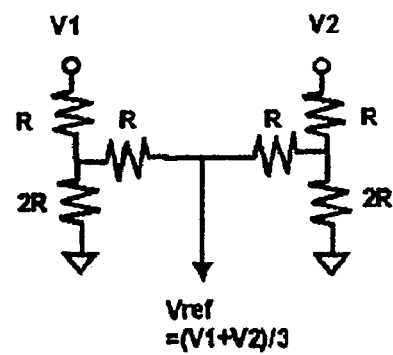

FIG. 38 shows circuits for generating Vref=(V1+V2)/3 as the reference voltage Vref. FIG. 38A shows an example for generating the reference voltage Vref using two resistors having a value R and two resistors having a value 2R, and FIG. 38B shows an example for generating the reference voltage Vref using four resistors having a value R and two resistors having a value 2R. Each of the resistors R can be selected depending on the varying tendency of its value. These simple arrangements make it possible to generate the reference voltage Vref.

Figure 39:
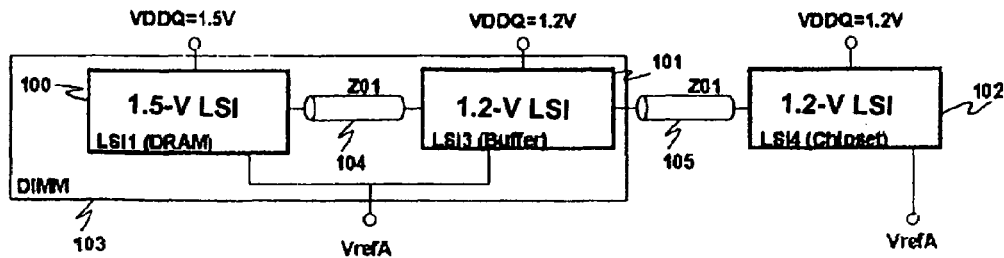
FIG. 39 is a block diagram of an arrangement of a third working example of a signal transmission system according to the present invention.

FIG. 39 is a block diagram of an arrangement of a third working example of a signal transmission system according to the present invention.

As shown in FIG. 39, the signal transmission system according to the third working example is of an arrangement wherein 1.5-V semiconductor integrated circuit device (LSI) 100 and 1.2-V semiconductor integrated circuit device (LSI) 101 are directly interconnected by bidirectional bus 104 which is a transmission line, and 1.2-V semiconductor integrated circuit device (LSI) 101 and 1.2-V semiconductor integrated circuit device (LSI) 102 are directly interconnected by bidirectional bus 105 which is a transmission line. For example, 1.5-V LSI 100 and 1.2-V LSI 101 are installed on DIMM 103.

Each of LSI 100, LSI 101 and LSI 102 has a driver, a receiver, a terminating resistor, and a switch for turning on and off the terminating resistor, not shown.

In the signal transmission system according to this working example, reference voltages VrefA supplied to the respective LSIs have the same value, which is set to 0.6V1 or the like to make it easy to generate the reference voltage VrefA. Since the entire system has two types of power supply voltages VDQ and one type of reference voltage VrefA, the cost of the system is lowered. In the present working example, though two types of power supply voltages VDDQ are supplied to DIMM 103, the electric power of the DIMM and the electric power of the system are reduced. The LSIs may be installed on a common PCB.

Figure 40:
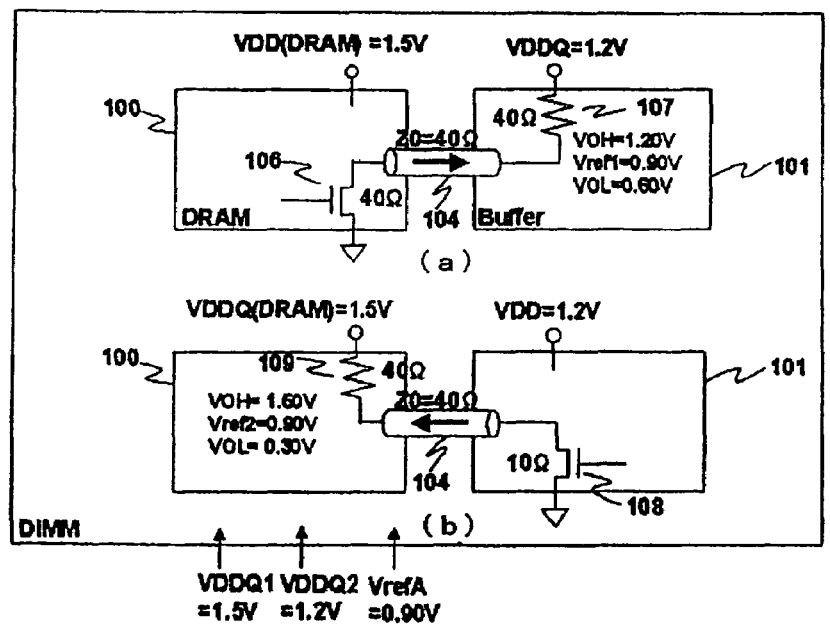
FIG. 40 is a circuit diagram of an arrangement of a seventeenth embodiment of a signal transmission system according to the present invention.

FIG. 40 is a circuit diagram of an arrangement of a seventeenth embodiment of a signal transmission system according to the present invention. FIG. 40 shows a specific example of the signal transmission system according to the third working example, for sending and receiving a single-ended signal, wherein the reference voltage VrefA of the signal transmission system shown in FIG. 39 is set to 0.9 V. FIG. 40 shows a circuit example for transmitting a signal between 1.5-V LSI 100 and 1.2-V LSI 101. FIG. 40(*a*) shows an equivalent circuit for sending a signal from 1.5-V LSI 100 to 1.2-V LSI 101, and FIG. 40(*b*) shows an equivalent circuit for sending a signal from 1.2-V LSI 101 to 1.5-V LSI 100.

In FIG. 40, switches that are turned off, receivers, and drivers that are set to a high impedance state on the signal reception side that do not contribute to the values of potentials, are omitted from the illustration, and the resistances of switches that are turned on, are included in the values of resistors 107 and 109.

The driver for sending a signal is an open drain circuit comprising an nMOS transistor. Bidirectional bus 104 which is a transmission line has a characteristic impedance Z0 of 40 ?, and the receiver for receiving a signal is VrT-terminated. Moreover, 1.2 V, which is the same as the power supply voltage VDDQ of 1.2-V LSI 101 on the reception side, is supplied as VTT which is used for sending a signal from 1.5-V LSI 100. 1.5 V, which is the same as the power supply voltage VDDQ of 1.5-V LSI 100 on the reception side, is supplied as VTT which is used for sending a signal from 1.2-V LSI 101.

In the signal transmission system according to the seventeenth embodiment, for sending a signal from 1.5-V LSI 100, the value of resistor 107 forming a VTT termination on the signal reception side is set to 40 ?, which is the same as the characteristic impedance of bidirectional bus 104. Therefore, the terminating resistor and bidirectional bus 104 are impedance-matched.

The on resistance of nMOS transistor 106 of the driver is set to 40 ? which is the same as the characteristic impedance of bidirectional bus 104. In this manner, VOH2=1.20 V, VOL2=0.60 V, and the reference voltage Vref2 is 0.90 V. In this case, since a signal amplitude value ? with respect to the reference voltage Vref2 is 0.30 V, the signal amplitude value is sufficiently maintained. The reference voltage Vref2 is obtained as ¾ (V2).

For sending a signal from 1.2-V LSI 101, the value of resistor 109 forming a VTT termination on the signal reception side is set to 40 Ω, which is the same as the characteristic impedance of bidirectional bus 104. Therefore, the terminating resistor and bidirectional bus 104 are impedance-matched.

For example, the on resistance of nMOS transistor 108 of the driver is set to 10 Ω. In this manner, VOH1=1.50 V, VOL1=0.30 V, and the reference voltage Vref1 is 0.90 V, which is in conformity with the reference voltage Vref2. In this case, since a signal amplitude value ? with respect to the reference voltage Vref1 is 0.60 V, the signal amplitude value is sufficiently maintained.

The path of return current of a signal flowing on bidirectional bus 104 is a ground plane which is common to 1.5-V LSI 100 and 1.2-V LSI 101. This makes it easy to design a printed board. If the power supply voltage VDDQ is used as the path of return current, then since the 1.5-V power supply and the 1.2-V power supply need to be used as the path of return current, problems arise which make the layout of interconnections difficult and increase the number of layers of the printed board. Therefore, it is preferable that the path of return current of a signal flowing on bidirectional bus 104 be a ground plane.

By thus providing the VTT termination connected to the power supply voltage VDDQ and the open drain driver, and setting the values of the terminating resistors and the on resistances of the drivers as described above with respect to the characteristic impedance Z0 of the transmission line, the signal can be transmitted with good signal integrity. Two types of power supply voltages VDDQ and one type of reference voltage Vref are sufficient. In addition, since the reference voltage Vref is 0.75V2 (=0.9 V), the reference voltage Vref can easily be generated. Thus, the cost of the system is lowered.

Furthermore, since the value of the reference voltage Vref is set to a value higher than ½ of the power supply voltage VDDQ, a sufficient potential is applied between the drain and source of the nMOS transistor of each driver, the nMOS transistor operates efficiently. Moreover, since its input/output capacity can be reduced, it can be used in a circuit which is required to operate at a high speed. As the value of the reference voltage Vref is large, the receiver can be designed with ease.

FIG. 41 is a circuit diagram of an arrangement of an eighteenth embodiment of a signal transmission system according to the present invention. FIG. 41 shows a specific example of the signal transmission system according to the third working example, for sending and receiving a single-ended signal, wherein the reference voltage VrefA of the signal transmission system shown in FIG. 39 is set to 0.9 V. FIG. 41 shows a circuit example for transmitting a signal between 1.2-V LSI 101 and 1.2-V LSI 102. FIG. 41(*a*) shows an equivalent circuit for sending a signal from 1.2-V LSI 101 to 1.2-V LSI 102, and FIG. 41(*b*) shows an equivalent circuit for sending a signal from 1.2-V LSI 102 to 1.2-V LSI 101.

In FIG. 41, switches that are turned off, receivers, and drivers that are set to a high impedance state on the signal reception side that do not contribute to the values of potentials, are omitted from the illustration, and the resistances of switches that are turned on, are included in the values of resistors 111 and 113.

The driver for sending a signal is an open drain circuit comprising an nMOS transistor. Bidirectional bus 105 which is a transmission line has a characteristic impedance Z0 of 40 Ω, and the receiver for receiving a signal is VTT-terminated. The terminating voltage VTT is 1.2 V for both.

In the signal transmission system according to the eighteenth embodiment, for sending a signal from 1.2-V LSI 101, the value of resistor 111 forming a VTT termination on the signal reception side is set to 40 Ω, which is the same as the characteristic impedance of bidirectional bus 105. Therefore, the terminating resistor and bidirectional bus 105 are impedance-matched.

The on resistance of nMOS transistor 110 of the driver is set to 40 Ω which is the same as the characteristic impedance of bidirectional bus 105. In this manner, VOH2=1.20 V, VOL2=0.60 V, and the reference voltage Vref2 is 0.90 V. In this case, since a signal amplitude value ? with respect to the reference voltage Vref2 is 0.30 V, the signal amplitude value is sufficiently maintained. The reference voltage Vref2 is obtained as 3V2/4.

For sending a signal from 1.2-V LSI 102, the value of resistor 113 forming a VTT termination on the signal reception side is set to 40 Ω, which is the same as the characteristic impedance of bidirectional bus 105. Therefore, the terminating resistor and bidirectional bus 105 are impedance-matched.

The on resistance of nMOS transistor 112 of the driver is set to 40 Ω, which is the same as the characteristic impedance of bidirectional bus 105. In this manner, VOH1=1.20 V, VOL1=0.60 V, and the reference voltage Vref1 is 0.90 V, which is in conformity with the reference voltage Vref2. In this case, since a signal amplitude value ? with respect to the reference voltage Vref1 is 0.30 V, the signal amplitude value is sufficiently maintained. The reference voltage Vref2 is obtained as 3V2/4.

By thus providing the VTT termination connected to the power supply voltage VDDQ and the open drain driver, and setting the values of the terminating resistors and the on resistances of the drivers as described above with respect to the characteristic impedance Z0 of the transmission line, the signal can be transmitted with good signal integrity. The circuit arrangements shown in FIGS. 40 and 41 make it possible to realize the signal transmission system shown in FIG. 39 which has one type of reference voltage VrefA (=0.9 V).

FIG. 42 is a circuit diagram of an arrangement of a nineteenth embodiment of a signal transmission system according to the present invention. FIG. 42 shows a specific example of the signal transmission system according to the third working example, for sending and receiving a single-ended signal, wherein the reference voltage VrefA of the signal transmission system shown in FIG. 39 is set to 0.6 V. FIG. 42 shows a circuit example for transmitting a signal between 1.5-V LSI 100 and 1.2-V LSI 101. FIG. 42(*a*) shows an equivalent circuit for sending a signal from 1.5-V LSI 100 to 1.2-V LSI 101, and FIG. 42(*b*) shows an equivalent circuit for sending a signal from 1.2-V LSI 101 to 1.5-V LSI 100.

In FIG. 42, switches that are turned off, receivers, and drivers that are set to a high impedance state on the signal reception side that do not contribute to the values of potentials, are omitted from the illustration, and the resistances of switches that are turned on, are included in the values of resistors 115*a*, 115*b*, 117*a* and 117*b*.

The driver for sending a signal comprises a pMOS and an nMOS transistors which are push-pull-connected. Bidirectional bus 104 which is a transmission line has a characteristic impedance Z0 of 40 Ω, and the receiver for receiving a signal is CTT-terminated.

In the signal transmission system according to the nineteenth embodiment, for sending a signal from 1.5-V LSI 100, the values of resistors 115*a* and 115*b* forming a CTT termination on the signal reception side are set to 2Z0=80 ?. The value of the terminating resistor is the same as the value obtained when resistors 115*a* and 115*b* are connected parallel to each other, and is 40 ?. Therefore, the terminating resistor end and bidirectional bus 104 are impedance-matched.

The on resistance of pMOS transistor 114*a* of the driver is set to a value equal to or lower than the characteristic impedance of bidirectional bus 104, e.g., 40 ?, and the on resistance of nMOS transistor 114*b* of the driver is set to 13.33 ?. In this manner, VOH2=1.05 V, VOL2=0.15 V, and the reference voltage Vref2 is 0.60 V. In this case, since a signal amplitude value ? with respect to the reference voltage Vref2 is 0.45 V, the signal amplitude value is sufficiently maintained.

For sending a signal from 1.2-V LSI 101, the values of resistors 117*a* and 117*b* forming a CTT termination on the signal reception side are set to 2Z0=80 ?. The value of the terminating resistor is the same as the value obtained when resistors 117*a* and 117*b* are connected parallel to each other, and is 40 ?. Therefore, the terminating resistor end and bidirectional bus 104 are impedance-matched.

The on resistance of pMOS transistor 116*a* of the driver is set to a value equal to or lower than the characteristic impedance of bidirectional bus 104, e.g., 40 ?, and the on resistance of nMOS transistor 114*b* of the driver is set to 17.14 ?. In this manner, VOH1=0.975 V, VOL1=0.225 V, and the reference voltage Vref1 is 0.60 V, which is in conformity with the value of reference voltage Vref2. In this case, since a signal amplitude value ? with respect to the reference voltage Vref1 is 0.375 V, the signal amplitude value is sufficiently maintained.

The path of return current of a signal flowing on bidirectional bus 104 is a ground plane which is common to 1.5-V LSI 100 and 1.2-V LSI 101, as with the other embodiments.

By thus setting the values of the terminating resistors and the on resistances of the drivers with respect to the characteristic impedance Z0 of the transmission line, the signal can be transmitted with good signal integrity. In addition, two types of power supply voltages VDDQ and one type of reference voltage Vref are sufficient. Furthermore, because the reference voltage Vref is set to 0.5V2, the reference voltage Vref can easily be generated. Therefore, the cost of the system can be lowered. As the value of the reference voltage Vref does not deviate largely from the value of ½ of the power supply voltages VDDQ, a sufficient potential is applied between the drain and source of the pMOS transistor and the nMOS transistor of each driver, enabling efficient operation of the pMOS and the nMOS transistors. Moreover, since their input/output capacities can be reduced, they can be used in a circuit which is required to operate at a high speed.

FIG. 43 is a circuit diagram of an arrangement of a twentieth embodiment of a signal transmission system according to the present invention. FIG. 43 shows a specific example of the signal transmission system according to the third working example, for sending and receiving a single-ended signal, wherein the reference voltage VrefA of the signal transmission system shown in FIG. 39 is set to 0.6 V. FIG. 43 shows a circuit example for transmitting a signal between 1.2-V LSI 101 and 1.2-V LSI 102. FIG. 43(*a*) shows an equivalent circuit for sending a signal from 1.2-V LSI 101 to 1.2-V LSI 102, and FIG. 43(*b*) shows an equivalent circuit for sending a signal from 1.2-V LSI 102 to 1.2-V LSI 101.

In FIG. 43, switches that are turned off, receivers, and drivers that are set to a high impedance state on the signal reception side the do not contribute to the values of potentials, are omitted from the illustration, and the resistances of switches that are turned on, are included in the values of resistors 119*a*, 119*b*, 121*a* and 121*b*.

The driver for sending a signal comprises a pMOS and an nMOS transistors which are push-pull-connected. Bidirectional bus 105 which is a transmission line has a characteristic impedance Z0 of 40 ?, and the receiver for receiving a signal is CTT-terminated.

In the signal transmission system according to the twentieth embodiment, for sending a signal from 1.2-V LSI 101, the values of resistors 119*a* and 119*b* forming a CTT termination on the signal reception side are set to 2Z0= 80 ?. The value of the terminating resistor is the same as the value obtained when resistors 119*a* and 119*b* are connected parallel to each other, and is 40 ?. Therefore, the terminating resistor end and bidirectional bus 105 are impedance-matched.

The on resistance of PMOS transistor 118*a* of the driver and the on resistance of nMOS transistor 118*b* of the driver are set to a value equal to or lower than the characteristic impedance of bidirectional bus 105, e.g., 20 ?. In this manner, VOH2=1.00 V, VOL2=0.20 V, and the reference voltage Vref2 is 0.60 V. In this case, since a signal amplitude value ? with respect to the reference voltage Vref2 is 0.40 V, the signal amplitude value is sufficiently maintained.

For sending a signal from 1.2-V LSI 102, the values of resistors 121*a* and 121*b* forming a CTT termination on the signal reception side are set to 2Z0=80 ?. The value of the terminating resistor is the same as the value obtained when resistors 121*a* and 121*b* are connected parallel to each other, and is 40 ?. Therefore, the terminating resistor end and bidirectional bus 105 are impedance-matched.

The on resistance of PMOS transistor 120*a* of the driver and the on resistance of nMOS transistor 120*b* of the driver are set to a value equal to or lower than the characteristic impedance of bidirectional bus 105, e.g., 20 ?. In this manner, VOH1=1.00 V, VOL1=0.20 V, and the reference voltage Vref1 is 0.60 V, which is in conformity with the value of reference voltage Vref2. In this case, since a signal amplitude value ? with respect to the reference voltage Vref1 is 0.40 V, the signal amplitude value is sufficiently maintained.

By thus setting the values of the terminating resistors and the on resistances of the drivers with respect to the characteristic impedance Z0 of the transmission line, the signal can be transmitted with good signal integrity.

The circuit arrangements shown in FIGS. 42 and 43 make it possible to realize the signal transmission system shown in FIG. 39 which has one type of reference voltage VrefA (=0.6 V).

FIG. 44 is a circuit diagram of an arrangement of a twenty-first embodiment of a signal transmission system according to the present invention. FIG. 44 shows a specific example of the signal transmission system according to the third working example, for sending and receiving a single-ended signal, wherein the reference voltage VrefA of the signal transmission system shown in FIG. 39 is set to 0.675 V. FIG. 44 shows a circuit example for transmitting a signal between 1.2-V LSI 101 and 1.2-V LSI 102. The arrangement of the embodiments shown in FIG. 10, FIG. 13, and FIG. 15, for example, may be used for signal transmission between 1.5-V LSI 100 and 1.2-V LSI 101. FIG. 44(*a*) shows an equivalent circuit for sending a signal from 1.2-V LSI 101 to 1.2-V LSI 102, and FIG. 44(*b*) shows an equivalent circuit for sending a signal from 1.2-V LSI 102 to 1.2-V LSI 101.

In FIG. 44, switches that are turned off, receivers, and drivers that are set to a high impedance state on the signal reception side that do not contribute to the values of potentials, are omitted from the illustration, and the resistances of switches that are turned on, are included in the values of resistors 119*a*, 119*b*, 121*a* and 121*b*.

The driver for sending a signal comprises a pMOS and an nMOS transistors which are push-pull-connected. Bidirectional bus 105 which is a transmission line has a characteristic impedance Z0 of 40 ?, and the receiver for receiving a signal is CTT-terminated.

In the signal transmission system according to the twenty-first embodiment, for sending a signal from 1.2-V LSI 101, the values of resistors 119*a* and 119*b* forming a CTT termination on the signal reception side are set to 2Z0=80 ?. The value of the terminating resistor is the same as the value obtained when resistors 119*a* and 119*b* are connected parallel to each other, and is 40 ?. Therefore, the terminating resistor end and bidirectional bus 105 are impedance-matched.

The on resistance of nMOS transistor 118*b* of the driver is set to a value equal to or lower than the characteristic impedance of bidirectional bus 105, e.g., 40 ?, and the on resistance of pMOS transistor 118*a* of the driver is set to 13.33 ?. In this manner, VOH2=1.05 V, VOL2=0.30 V, and the reference voltage Vref2 is 0.675 V. In this case, since a signal amplitude value ? with respect to the reference voltage Vref2 is 0.375 V, the signal amplitude value is sufficiently maintained.

For sending a signal from 1.2-V LSI 102, the values of resistors 121*a* and 121*b* forming a CTT termination on the signal reception side are set to 2Z0=80 ?. The value of the terminating resistor is the same as the value obtained when resistors 121*a* and 121*b* are connected parallel to each other, and is 40 ?. Therefore, the terminating resistor end and bidirectional bus 105 are impedance-matched.

The on resistance of nMOS transistor 120*b* of the driver is set to a value equal to or lower than the characteristic impedance of bidirectional bus 105, e.g., 40 ?, and the on resistance of pMOS transistor 120*a* of the driver is set to 13.33 ?. In this manner, VOH1=1.05 V, VOL1=0.30 V, and the reference voltage Vref1 is 0.675 V, which is in conformity with the value of reference voltage Vref2. In this case, since a signal amplitude value ? with respect to the reference voltage Vref1 is 0.375 V, the signal amplitude value is sufficiently maintained.

By thus setting the values of the terminating resistors and the on resistances of the drivers with respect to the characteristic impedance Z0 of the transmission line, the signal can be transmitted with good signal integrity.

The circuit arrangements shown in FIGS. 10 and 44 make it possible to realize the signal transmission system shown in FIG. 39 which has one type of reference voltage VrefA (=0.675 V).

Figure 45:
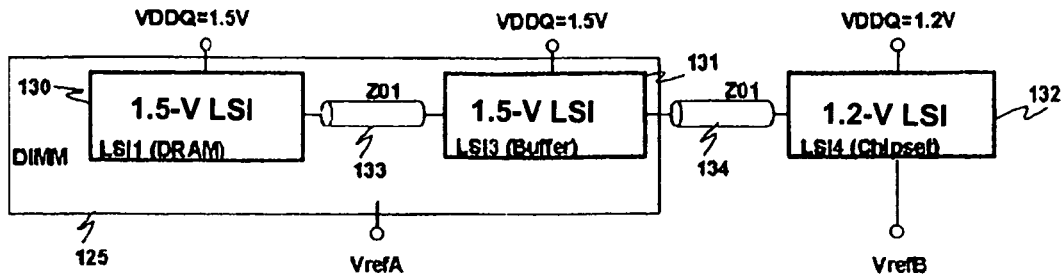
FIG. 45 is a block diagram of an arrangement of a fourth working example of a signal transmission system according to the present invention.

FIG. 45 is a block diagram of an arrangement of a fourth working example of a signal transmission system according to the present invention.

As shown in FIG. 45, the signal transmission system according to the fourth working example is of an arrangement wherein 1.5-V semiconductor integrated circuit device (LSI) 130 and 1.5-V semiconductor integrated circuit device (LSI) 131 are directly interconnected by bidirectional bus 133 which is a transmission line, and 1.5-V semiconductor integrated circuit device (LSI) 131 and 1.2-V semiconductor integrated circuit device (LSI) 132 are directly interconnected by bidirectional bus 134 which is a transmission line. For example, 1.5-V LSI 130 and 1.5-V LSI 131 are installed on DIMM 125.

Each of LSI 130, LSI 131 and LSI 132 has a driver, a receiver, a terminating resistor, and a switch for turning on and off the terminating resistor, not shown.

In the signal transmission system according to this working example, reference voltages VrefA and VrefB supplied to the respective LSIs should preferably have the same value, which is set to 0.6V1 or the like to make it easy to generate the reference voltage VrefA. Since the entire system has two types of power supply voltages VDQ and one type of reference voltage VrefA, the cost of the system is lowered. In the present working example, one type of power supply voltage VDDQ is supplied to DIMM 125, the number of layers of the DIMM substrate is reduced and so is the cost. The LSIs may be installed on a common PCB.

Figure 46:
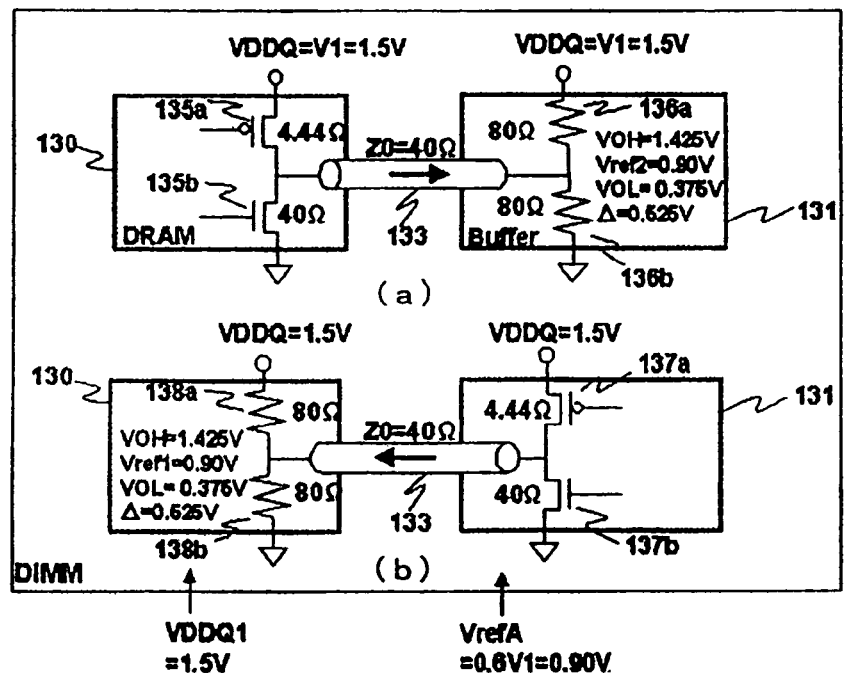
FIG. 46 is a circuit diagram of an arrangement of a twenty-second embodiment of a signal transmission system according to the present invention.

FIG. 46 is a circuit diagram of an arrangement of a twenty-second embodiment of a signal transmission system according to the present invention. FIG. 46 shows a specific example of the signal transmission system according to the fourth working example, for sending and receiving a single-ended signal, wherein the reference voltage of the signal transmission system shown in FIG. 45 is set to VrefA=VrefB=0.9 V. FIG. 46 shows a circuit example for transmitting a signal between 1.5-V LSI 130 and 1.5-V LSI 131. FIG. 46(*a*) shows an equivalent circuit for sending a signal from 1.5-V LSI 130 to 1.5-V LSI 131, and FIG. 46(*b*) shows an equivalent circuit for sending a signal from 1.5-V LSI 131 to 1.5-V LSI 130.

In FIG. 46, switches that are turned off, receivers, and drivers that are set to a high impedance state on the signal reception side that do not contribute to the values of potentials, are omitted from the illustration, and the resistances of switches that are turned on, are included in the values of resistors 136*a*, 136*b*, 138*a* and 138*b*.

The driver for sending a signal comprises a pMOS and an nMOS transistors which are push-pull-connected. Bidirectional bus 133 which is a transmission line has a characteristic impedance Z0 of 40 ?, and the receiver for receiving a signal is CTT-terminated. The driver may be of an open drain configuration, rather than a push-pull configuration.

In the signal transmission system according to the twenty-second embodiment, for sending a signal from 1.5-V LSI 130, the values of resistors 136*a* and 136*b* forming a CTT termination on the signal reception side are set to 2Z0=80 ?. The value of the terminating resistor is the same as the value obtained when resistors 136*a* and 136*b* are connected parallel to each other, and is 40 ?. Therefore, the terminating resistor end and bidirectional bus 133 are impedance-matched.

The on resistance of pMOS transistor 135*a* of the driver is set to 4.44 ?, for example, and the on resistance of nMOS transistor 135*b* of the driver is set to 40 ?. In this manner, VOH2=1.425 V, VOL2=0.375 V, and the reference voltage Vref2 is 0.90 V. In this case, since a signal amplitude value ? with respect to the reference voltage Vref2 is 0.525 V, the signal amplitude value is sufficiently maintained.

For sending a signal from 1.5-V LSI 131, the values of resistors 138*a* and 138*b* forming a CTT termination on the signal reception side are set to 2Z0=80 ?. The value of the terminating resistor is the same as the value obtained when resistors 138*a* and 138*b* are connected parallel to each other, and is 40 ?. Therefore, the terminating resistor end and bidirectional bus 133 are impedance-matched.

The on resistance of pMOS transistor 137a of the driver is set to 4.44 Ω, for example, and the on resistance of nMOS transistor 137b of the driver is set to 40 Ω. In this manner, VOH1=1.425 V, VOL1=0.375 V, and the reference voltage Vref1 is 0.90 V, which is in conformity with the value of reference voltage Vref2. In this case, since a signal amplitude value ? with respect to the reference voltage Vref1 is 0.525 V, the signal amplitude value is sufficiently maintained.

By thus setting the values of the terminating resistors and the on resistances of the drivers with respect to the characteristic impedance Z0 of the transmission line, the signal can be transmitted with good signal integrity.

The seventeenth embodiment shown in FIG. 40, for example, may be employed for signal transmission between 1.5-V LSI 131 and 1.2-V LSI 132.

The circuit arrangements shown in FIGS. 46 and 40 make it possible to realize the signal transmission system shown in FIG. 45 which has one type of reference voltage VrefA (=VrefB=0.9 V).

Figure 47:
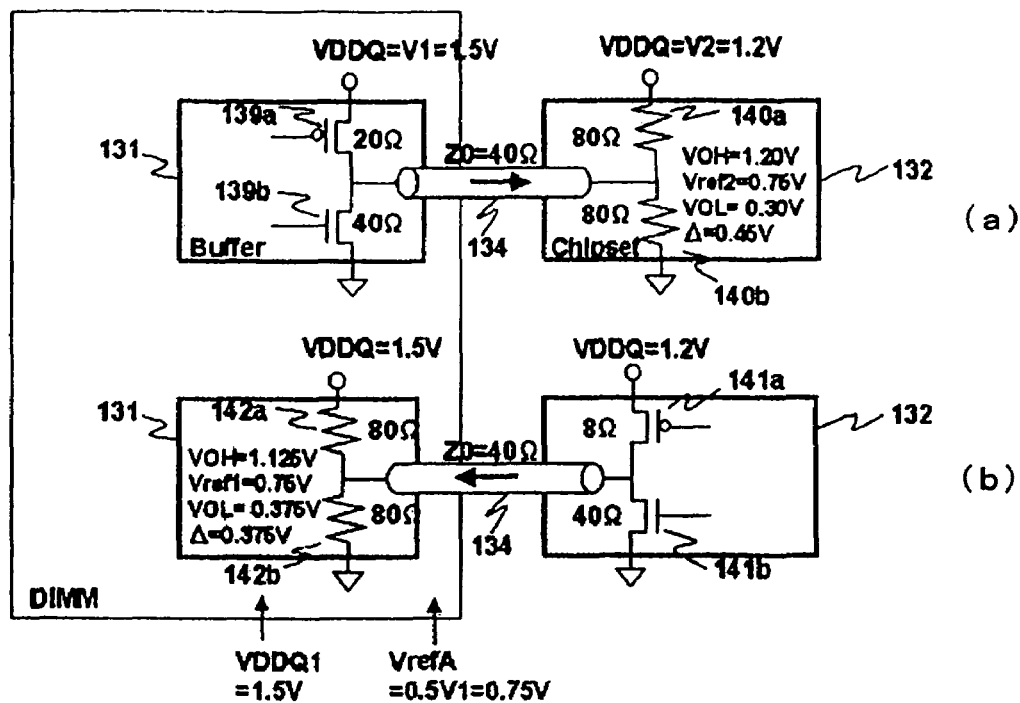
FIG. 47 is a circuit diagram of an arrangement of a twenty-third embodiment of a signal transmission system according to the present invention.

FIG. 47 is a circuit diagram of an arrangement of a twenty-third embodiment of a signal transmission system according to the present invention. FIG. 47 shows a specific example of the signal transmission system according to the fourth working example, for sending and receiving a single-ended signal, wherein the reference voltage of the signal transmission system shown in FIG. 45 is set to VrefA=VrefB=0.75 V. FIG. 47 shows a circuit example for transmitting a signal between 1.5-V LSI 131 and 1.2-V LSI 132. FIG. 47(a) shows an equivalent circuit for sending a signal from 1.5-V LSI 131 to 1.2-V LSI 132, and FIG. 47(b) shows an equivalent circuit for sending a signal from 1.2-V LSI 132 to 1.5-V LSI 131.

In FIG. 47, switches that are turned off, receivers, and drivers that are set to a high impedance state on the signal reception side that do not contribute to the values of potentials, are omitted from the illustration, and the resistances of switches that are turned on, are included in the values of resistors 140a, 140b, 142a and 142b.

The driver for sending a signal comprises a pMOS and an nMOS transistors which are push-pull-connected. Bidirectional bus 134 which is a transmission line has a characteristic impedance Z0 of 40 Ω, and the receiver for receiving a signal is CTT-terminated.

In the signal transmission system according to the twenty-third embodiment, for sending a signal from 1.5-V LSI 131, the values of resistors 140a and 140b forming a CTT termination on the signal reception side are set to 2Z0=80 Ω. The value of the terminating resistor is the same as the value obtained when resistors 140a and 140b are connected parallel to each other, and is 40 Ω. Therefore, the terminating resistor end and bidirectional bus 134 are impedance-matched.

The on resistance of pMOS transistor 139a of the driver is set to 20 Ω, for example, and the on resistance of nMOS transistor 139b of the driver is set to 40 Ω. In this manner, VOH2=1.20 V, VOL2=0.30 V, and the reference voltage Vref2 is 0.75 V. In this case, since a signal amplitude value ? with respect to the reference voltage Vref2 is 0.45 V, the signal amplitude value is sufficiently maintained.

For sending a signal from 1.2-V LSI 132, the values of resistors 142a and 142b forming a CTT termination on the signal reception side are set to 2Z0=80 Ω. The value of the terminating resistor is the same as the value obtained when resistors 142a and 142b are connected parallel to each other, and is 40 Ω. Therefore, the terminating resistor end and bidirectional bus 134 are impedance-matched.

The on resistance of pMOS transistor 141a of the driver is set to 8 Ω, for example, and the on resistance of nMOS transistor 141b of the driver is set to 40 Ω. In this manner, VOH1=1.125 V, VOL1=0.375 V, and the reference voltage Vref1 is 0.75 V, which is in conformity with the value of reference voltage Vref2. In this case, since a signal amplitude value ? with respect to the reference voltage Vref1 is 0.375 V, the signal amplitude value is sufficiently maintained.

By thus setting the values of the terminating resistors and the on resistances of the drivers with respect to the characteristic impedance Z0 of the transmission line, the signal can be transmitted with good signal integrity.

The twentieth embodiment shown in FIG. 43, for example, may be employed for signal transmission between 1.5-V LSI 130 and 1.5-V LSI 131. However, each power supply voltage VDDQ is 1.5 V.

A circuit arrangement for supplying 1.5 V as the power supply voltage VDDQ to the embodiment shown in FIG. 43 and the circuit arrangement shown in FIG. 47 make it possible to realize the signal transmission system shown in FIG. 45 which has one type of reference voltage VrefA (=VrefB= 0.75 V).

Figure 48:
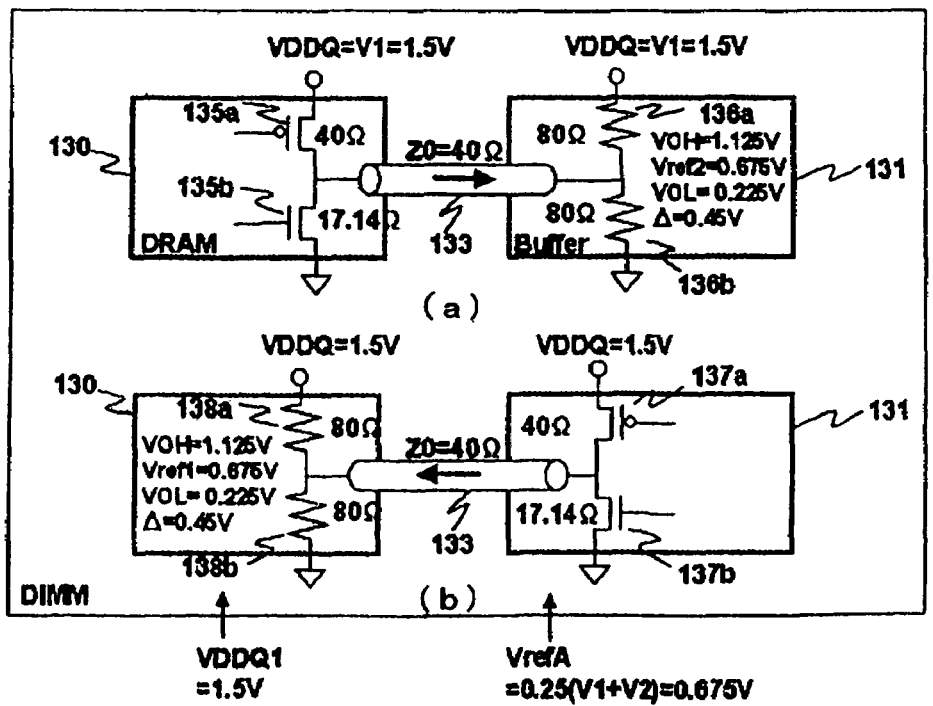
FIG. 48 is a circuit diagram of an arrangement of a twenty-fourth embodiment of a signal transmission system according to the present invention.

FIG. 48 is a circuit diagram of an arrangement of a twenty-fourth embodiment of a signal transmission system according to the present invention. FIG. 48 shows a specific example of the signal transmission system according to the fourth working example, for sending and receiving a single-ended signal, wherein the reference voltage of the signal transmission system shown in FIG. 45 is set to VrefA=VrefB=0.675 V. FIG. 48 shows a circuit example for transmitting a signal between 1.5-V LSI 130 and 1.5-V LSI 131. FIG. 48(a) shows an equivalent circuit for sending a signal from 1.5-V LSI 130 to 1.5-V LSI 131, and FIG. 48(b) shows an equivalent circuit for sending a signal from 1.5-V LSI 131 to 1.5-V LSI 130.

In FIG. 48, switches that are turned off, receivers, and drivers that are set to a high impedance state on the signal reception side that do not contribute to the values of potentials, are omitted from the illustration, and the resistances of switches that are turned on, are included in the values of resistors 136a, 136b, 139a and 139b.

The driver for sending a signal comprises a pMOS and an nMOS transistors which are push-pull-connected. Bidirectional bus 133 which is a transmission line has a characteristic impedance Z0 of 40 Ω, and the receiver for receiving a signal is CTT-terminated.

In the signal transmission system according to the twenty-fourth embodiment, for sending a signal from 1.5-V LSI 130, the values of resistors 136a and 136b forming a CTT termination on the signal reception side are set to 2Z0=80 Ω. The value of the terminating resistor is the same as the value obtained when resistors 136a and 136b are connected parallel to each other, and is 40 Ω. Therefore, the terminating resistor end and bidirectional bus 133 are impedance-matched.

The on resistance of pMOS transistor 135a of the driver is set to 40 Ω, for example, and the on resistance of nMOS transistor 135b of the driver is set to 17.14 Ω. In this manner, VOH2=1.125 V, VOL2=0.225 V, and the reference voltage Vref2 is 0.675 V. In this case, since a signal amplitude value ? with respect to the reference voltage Vref2 is 0.45 V, the signal amplitude value is sufficiently maintained.

For sending a signal from 1.5-V LSI 131, the values of resistors 138a and 138b forming a CTT termination on the signal reception side are set to 2Z0=80 Ω. The value of the terminating resistor is the same as the value obtained when resistors 136a and 136b are connected parallel to each other, and is 40 ?. Therefore, the terminating resistor end and bidirectional bus 133 are impedance-matched.

The on resistance of pMOS transistor 137a of the driver is set to 40 ?, for example, and the on resistance of nMOS transistor 137b of the driver is set to 17.14 ?. In this manner, VOH1=1.125 V, VOL1=0.225 V, and the reference voltage Vref1 is 0.675 V, which is in conformity with the value of reference voltage Vref2. In this case, since a signal amplitude value ? with respect to the reference voltage Vref1 is 0.45 V, the signal amplitude value is sufficiently maintained.

By thus setting the values of the terminating resistors and the on resistances of the drivers with respect to the characteristic impedance Z0 of the transmission line, the signal can be transmitted with good signal integrity.

The first embodiment (FIG. 10), the second embodiment (FIG. 13), or the third embodiment (FIG. 15), for example, may be employed for signal transmission between 1.5-V LSI 131 and 1.2-V LSI 132.

The circuit arrangement shown in the twenty-fourth embodiment (FIG. 48), and the circuit arrangement shown in the first embodiment (FIG. 10), the second embodiment (FIG. 13), or the third embodiment (FIG. 15) make it possible to realize the signal transmission system shown in FIG. 45 which has one type of reference voltage VrefA (=VrefB=0.675 V).

Figure 49A:
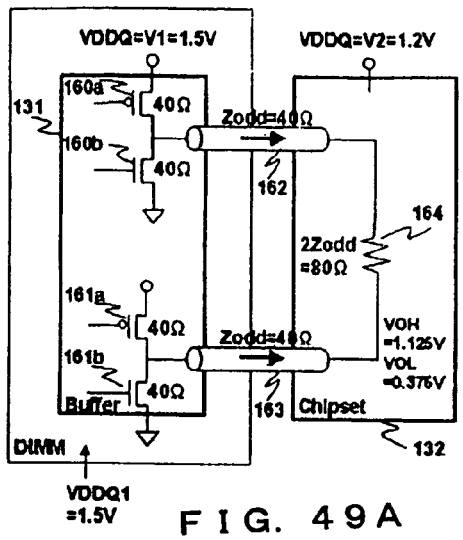
FIG. 49 is a circuit diagram of an arrangement of a twenty-fifth embodiment of a signal transmission system according to the present invention.
Figure 49B:
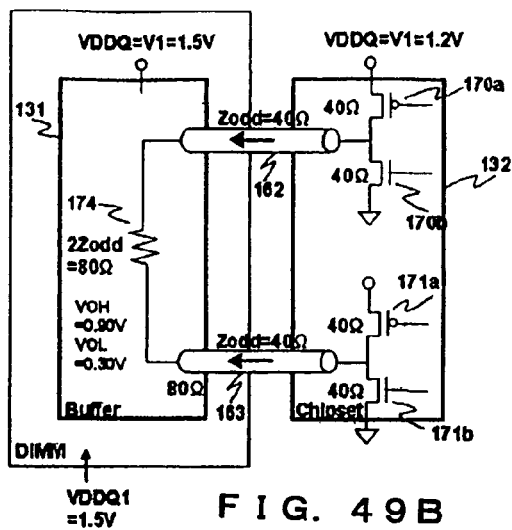

FIGS. 49A and 49B are circuit diagrams of an arrangement of a twenty-fifth embodiment of a signal transmission system according to the present invention. FIGS. 49A and 49B show a specific example of the signal transmission system according to the fourth working example, for sending and receiving a differential signal, and show a circuit example for transmitting a signal between 1.5-V LSI 131 and 1.2-V LSI 132, with no reference voltage VrefB required. FIG. 49A shows an equivalent circuit for sending a signal from 1.5-V LSI 131 to 1.2-V LSI 132, and FIG. 49B shows an equivalent circuit for sending a signal from 1.2-V LSI 132 to 1.5-V LSI 131.

In FIGS. 49A and 49B, switches that are turned off, receivers, and drivers that are set to a high impedance state on the signal reception side that do not contribute to the values of potentials, are omitted from the illustration, and the resistances of switches that are turned on, are included in the values of resistors 163 and 174.

The driver for sending a signal comprises a pMOS and an nMOS transistors which are push-pull-connected. Bidirectional buses 162 and 163 which are transmission lines have a characteristic impedance, here an impedance Zodd in an ODD mode, of 40 ?. The receiver for receiving a signal has a bridge terminating circuit for interconnecting a true signal and a bar signal with a resistor having a value of 2Zodd. When sending a signal, this resistor is disconnected from bidirectional buses 162 and 163 by turning off a switch (not shown), presenting an infinitely large resistance as viewed from the driver.

In the signal transmission system according to the twenty-fifth embodiment, for sending a signal from 1.5-V LSI 131, the value of resistor 164 forming a bridge termination on the signal reception side is set to 2Zodd=80 ?. Therefore, the terminating resistor and bidirectional buses 162 and 163 are impedance-matched.

The on resistances of pMOS transistors 160a and 161a of the driver and the on resistances of nMOS transistors 160b and 161b of the driver are set to 40 ?. In this manner, VOH2=1.125 V, and VOL2=0.375 V, making it possible to receive a signal with a differential input circuit (receiver). Therefore, no reference voltage VrefB is required.

For sending a signal from 1.2-V LSI 132, the value of register 174 forming a bridge termination on the signal reception side is set to 2Zodd= 80 ?. Therefore, the terminating resistor and bidirectional buses 162 and 163 are impedance-matched.

The on resistances of pMOS transistors 170a and 171a of the driver and the on resistances of nMOS transistors 170b and 171b of the driver are set to 40 ?. In this manner, VOH1=0.9 V, and VOL2=0.30 V, making it possible to receive a signal with a differential input circuit (receiver). Therefore, no reference voltage VrefB is required.

By thus setting the values of the terminating resistors and the on resistances of the drivers with respect to the characteristic impedance Zodd of the transmission line in the signal transmission system which has the bridge terminating circuit and the push-pull driver for sending and receiving a differential signal, the signal can be transmitted with good signal integrity without using the reference voltage VrefB.

The differential signal requires as many signal lines as twice the single-ended signal, but is excellent as providing a high-speed signal transmission system because it can reduce the number of connectors and package power supply pins and is resistant to common-mode noise since mutual signal paths are used as return current paths.

The arrangement of the twentieth embodiment shown in FIG. 43, for example, may be used for signal transmission between 1.5-V LSI 130 and 1.5-V LSI 131. However, each power supply voltage VDDQ is 1.5 V.

Therefore, a circuit arrangement for supplying 1.5 V as the power supply voltage VDDQ to the twentieth embodiment shown in FIG. 43 and the circuit arrangement shown in FIGS. 49A and 49B make it possible to realize the signal transmission system shown in FIG. 45 which has one type of reference voltage VrefA (=0.75 V).

The circuit shown in FIGS. 49A and 49B is also effective as a circuit for transmitting a signal bidirectionally between two LSIs that operate under different power supply voltages VDDQ.

Figure 50:
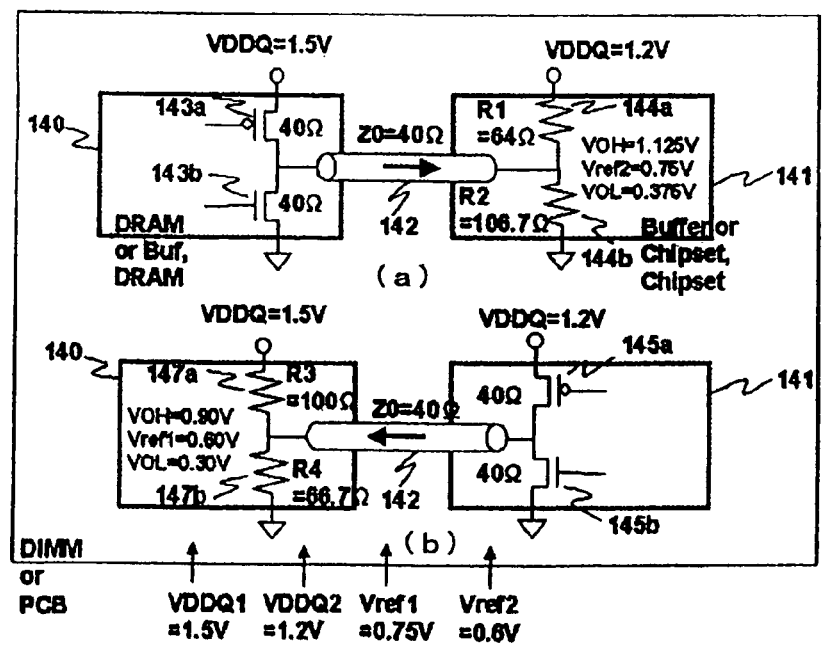
FIG. 50 is a circuit diagram of an arrangement of a twenty-sixth embodiment of a signal transmission system according to the present invention.

FIG. 50 is a circuit diagram of an arrangement of a twenty-sixth embodiment of a signal transmission system according to the present invention. FIG. 50 shows a circuit example for transmitting a single-ended signal between 1.5-V LSI 140 and 1.2-V LSI 141. FIG. 50(a) shows an equivalent circuit for sending a signal from 1.5-V LSI 140 to 1.2-V LSI 141, and FIG. 50(b) shows an equivalent circuit for sending a signal from 1.2-V LSI 141 to 1.5-V LSI 140.

In FIG. 50, switches that are turned off, receivers, and drivers that are set to a high impedance state on the signal reception side that do not contribute to the values of potentials, are omitted from the illustration, and the resistances of switches that are turned on, are included in the values of resistors 144a, 144b, 147a and 147b.

The driver for sending a signal comprises a pMOS and an nMOS transistors which are push-pull-connected. Bidirectional bus 142 which is a transmission line has a characteristic impedance Z0 of 40 ?, and the receiver for receiving a signal is CTT-terminated.

In the signal transmission system according to the twenty-sixth embodiment, for sending a signal from 1.5-V LSI 140, the on resistance of pMOS transistor 143a of the driver and the on resistance of nMOS transistor 143b of the driver are set to 40 ?. Therefore, the on resistance of the driver and bidirectional bus 142 are impedance-matched.

The value of resistor 144a forming a CTT termination on the signal reception side is set to 64 ?, and the value of resistor 144b is set to 106.7 ?. The value of the terminating resistor is the same as the value obtained when resistors 144a and 144b are connected parallel to each other, and is 40 ?. Therefore, the terminating resistor and bidirectional bus 142 are impedance-matched. In this manner, VOH2=1.125 V, VOL2=0.375 V, and the reference voltage Vref2 is 0.75 V. That is, the reference voltage Vref2 is ½ of the high VDDQ value. In this case, since a signal amplitude value ? with respect to the reference voltage Vref2 is 0.375 V, the signal amplitude value is sufficiently maintained.

For sending a signal from 1.2-V LSI 141, the on resistance of pMOS transistor 145a of the driver and the on resistance of nMOS transistor 145b of the driver are set to 40 ?. Therefore, the on resistance of the driver and bidirectional bus 142 are impedance-matched.

The value of resistor 147a forming a CTT termination on the signal reception side is set to 100 ?, and the value of resistor 147b is set to 66.7 ?. The value of the terminating resistor is the same as the value obtained when resistors 147a and 147b are connected parallel to each other, and is 40 ?. Therefore, the terminating resistor end and bidirectional bus 142 are impedance-matched. In this manner, VOH1=0.90 V, VOL1=0.30 V, and the reference voltage Vref1 is 0.60 V. That is, the reference voltage Vref1 is ½ of the low VDDQ value. In this case, since a signal amplitude value ? with respect to the reference voltage Vref1 is 0.30 V, the signal amplitude value is sufficiently maintained.

As with the other embodiments, the path of return current of a signal flowing on bidirectional bus 142 is a ground plane which is common to 1.5-V LSI 140 and 1.2-V LSI 141. This makes it easy to design a printed board. If the power supply voltage VDDQ is used as the path of return current, then since the 1.5-V power supply and the 1.2-V power supply need to be used as the path of return current, problems arise which make the layout of interconnections difficult and increase the number of layers of the printed board. Therefore, it is preferable that the path of return current of a signal flowing on bidirectional bus 142 be a ground plane.

By thus setting the values of the terminating resistors and the on resistances of the drivers as described above with respect to the characteristic impedance Z0 of the transmission line, the signal can be transmitted with good signal integrity. Two types of power supply voltages VDDQ and two types of reference voltages Vref are sufficient. Though there are two types of reference voltages Vref in the present embodiment, since they may be set to ½ of the value of the power supply voltage VDDQ of each driver, an equivalent potential is applied between the drain and source of the pMOS transistor and the nMOS transistor of each driver, enabling efficient operation of the pMOS and the nMOS transistors. Moreover, since their input/output capacity can be reduced, they can be used in a circuit which is required to operate at a high speed.

The present embodiment is identical in arrangement to the second embodiment (FIG. 13), the fifth embodiment (FIG. 22), and the sixth embodiment (FIG. 24) in that it has a driver which is CTT-terminated and push-pull-connected that has an on resistance equal to the characteristic impedance Z0 of the transmission line. Therefore, these embodiments can also be realized by making the value of the terminating resistor variable.

In the twenty-sixth embodiment, the value of the terminating resistor is in conformity with the characteristic impedance of the transmission line. An embodiment in which the value of the terminating resistor is in conformity with 1.5 times the characteristic impedance of the transmission line will be described below.

Figure 51:
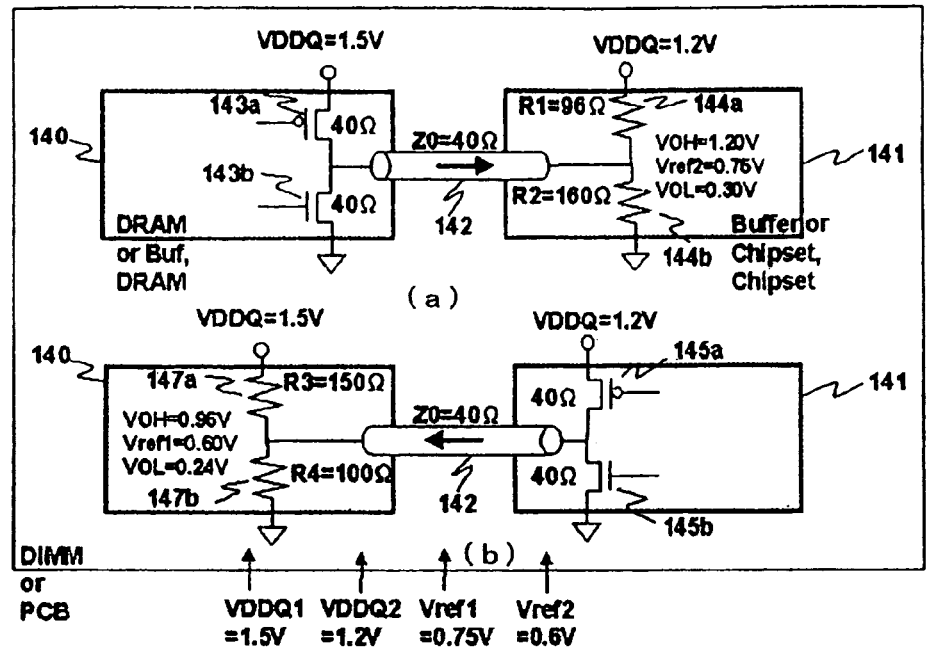
FIG. 51 is a circuit diagram of an arrangement of a twenty-seventh embodiment of a signal transmission system according to the present invention.

FIG. 51 is a circuit diagram of an arrangement of a twenty-seventh embodiment of a signal transmission system according to the present invention.

FIG. 51 shows a circuit example for transmitting a single-ended signal between 1.5-V LSI 140 and 1.2-V LSI 141. FIG. 51(a) shows an equivalent circuit for sending a signal from 1.5-V LSI 140 to 1.2-V LSI 141, and FIG. 51(b) shows an equivalent circuit for sending a signal from 1.2-V LSI 141 to 1.5-V LSI 140.

In FIG. 51, switches that are turned off, receivers, and drivers that are set to a high impedance state on the signal reception side that do not contribute to the values of potentials, are omitted from the illustration, and the resistances of switches that are turned on, are included in the values of resistors 144a, 144b, 147a and 147b.

The driver for sending a signal comprises a pMOS and an nMOS transistors which are push-pull-connected. Bidirectional bus 142 which is a transmission line has a characteristic impedance Z0 of 40 ?, and the receiver for receiving a signal is CTT-terminated.

In the signal transmission system according to the twenty-seventh embodiment, for sending a signal from 1.5-V LSI 140, the on resistance of pMOS transistor 143a of the driver and the on resistance of nMOS transistor 143b of the driver are set to 40 ?. Therefore, the on resistance of the driver and bidirectional bus 142 are impedance-matched.

The value of resistor 144a forming a CTT termination on the signal reception side is set to 96 ?, and the value of resistor 144b is set to 160 ?. The value of the terminating resistor is the same as the value obtained when resistors 144a and 144b are connected parallel to each other, and is 60 ?. Therefore, the value of the terminating resistor is in conformity with 1.5 times the characteristic impedance of bidirectional bus 142. In this manner, VOH2= 1.20 V, VOL2=0.30 V, and the reference voltage Vref2 is 0.75 V. That is, the reference voltage Vref2 is ½ of the high VDDQ value. In this case, since a signal amplitude value ? with respect to the reference voltage Vref2 is 0.45 V, the signal amplitude value is sufficiently maintained.

For sending a signal from 1.2-V LSI 141, the on resistance of pMOS transistor 145a of the driver and the on resistance of nMOS transistor 145b of the driver are set to 40 ?. Therefore, the on resistance of the driver and bidirectional bus 142 are impedance-matched.

The value of resistor 147a forming a CTT termination on the signal reception side is set to 150 ?, and the value of resistor 147b is set to 100 ?. The value of the terminating resistor is the same as the value obtained when resistors 147a and 147b are connected parallel to each other, and is 60 ?. Therefore, the value of the terminating resistor is in conformity with 1.5 times the characteristic impedance of bidirectional bus 142. In this manner, VOH1=0.96 V, VOL1=0.24 V, and the reference voltage Vref1 is 0.60 V. That is, the reference voltage Vref1 is ½ of the low VDDQ value. In this case, since a signal amplitude value ? with respect to the reference voltage Vref1 is 0.36 V, the signal amplitude value is sufficiently maintained.

By thus setting the values of the terminating resistors and the on resistances of the drivers as described above with respect to the characteristic impedance Z0 of the transmission line, the signal can be transmitted with good signal integrity. Two types of power supply voltages VDDQ and two types of reference voltages Vref are sufficient. Though there are required two types of reference voltages Vref in the present embodiment, since the values of the reference voltages are set to ½ of the value of the power supply voltage VDDQ of each driver, an equivalent potential is applied between the drain and source of the pMOS transistor and the nMOS transistor of each driver, enabling efficient operation of the pMOS and the nMOS transistors. Moreover, since their input/output capacity can be reduced, they can be used in a circuit which is required to operate at a high speed.

The present embodiment is identical in arrangement to the second embodiment (FIG. 13), the fifth embodiment (FIG. 22), and the sixth embodiment (FIG. 24) in that it has a driver which is CTT-terminated and push-pull-connected that has an on resistance equal to the characteristic impedance Z0 of the transmission line. Therefore, these embodiments can also be realized by making the value of the terminating resistor variable.

Figure 52:
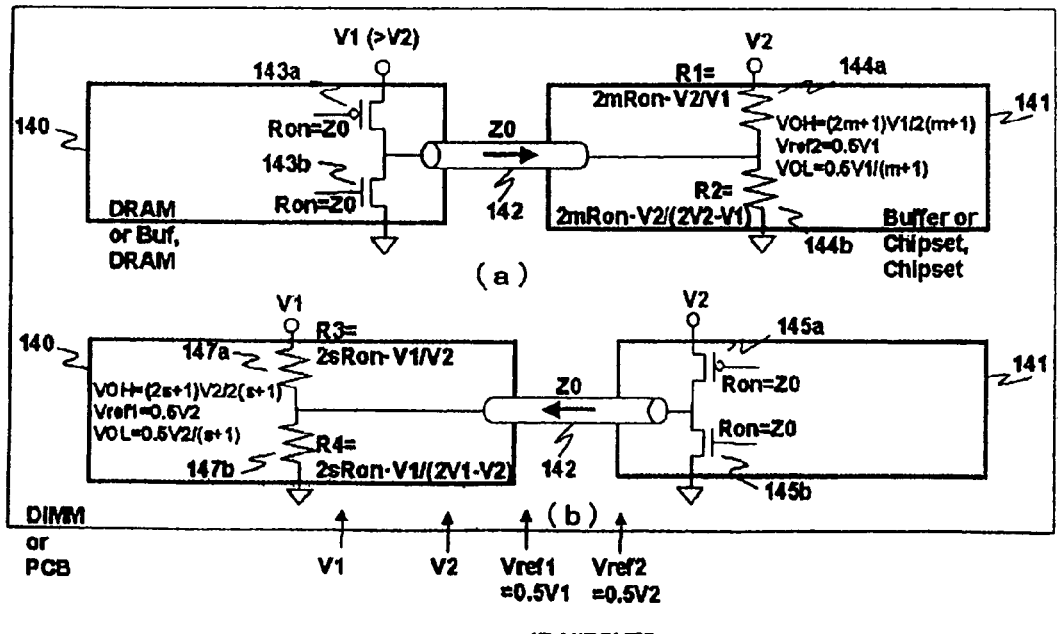
FIG. 52 is a circuit diagram of an arrangement of a generalized circuit of the signal transmission systems according to the twenty-sixth embodiment shown in FIG. 50 and the twenty-seventh embodiment shown in FIG. 51.

FIG. 52 is a circuit diagram of an arrangement of a generalized circuit of the signal transmission systems according to the twenty-sixth embodiment shown in FIG. 50 and the twenty-seventh embodiment shown in FIG. 51.

FIG. 52(a) shows an equivalent circuit for sending a signal from LSI 140 having a power supply voltage VDDQ=V1 system to LSI 141 having a power supply voltage VDDQ=V2 system, and FIG. 52(b) shows an equivalent circuit for sending a signal from V2 LSI 141 to V1 LSI 140. In FIG. 52, V1>V2. Switches that are turned off, receivers, and drivers that are set to a high impedance state on the signal reception side that do not contribute to the values of potentials, are omitted from the illustration, and the resistances of switches that are turned on, are included in the values of the resistors forming the terminating resistor.

The driver for sending a signal comprises a pMOS and an nMOS transistors which are push-pull-connected. Bidirectional bus 142 which is a transmission line has a characteristic impedance Z0 or 40 ?, and the receiver for receiving a signal is CTT-terminated.

For sending a signal from V1 LSI 140, the on resistance of PMOS transistor 143a of the driver and the on resistance of nMOS transistor 143b of the driver are set to Z0 which is equal to the characteristic impedance of bidirectional bus 142. Therefore, the on resistance of the driver and the bidirectional bus 142 are impedance-matched.

The value of resistor 144a forming a CTT termination on the signal reception side is set to R1 ?, and the value of resistor 144b is set to R2 ?. The value of the terminating resistor is the same as R1//R2 ? which is obtained when resistors 144a and 144b are connected parallel to each other. This value of the terminating resistor is in conformity with m times the characteristic impedance of bidirectional bus 142.

$R1 = 2mZ0 \cdot V2/V1$ $R2 = 2mZ0 \cdot V2(2V2-V1)$

In this manner, $VOH2 = (2m+1)V1/2(m+1)$ $VOL2 = 0.5V1(m+1)$

Thus, $Vref2 = 0.5V1$

Therefore, the reference voltage Vref2 is ½ of the high VDDQ value.

For sending a signal from V2 LSI 41, the on resistance of pMOS transistor 145a of the driver and the on resistance of nMOS transistor 145b of the driver are set to Z0 which is equal to the characteristic impedance of bidirectional bus 142. Therefore, the on resistance of the driver and the bidirectional bus 142 are impedance-matched.

The value of resistor 147a forming a CTT termination on the signal reception side is set to R3 ?, and the value of resistor 147b is set to R4 ?. The value of the terminating resistor is the same as R3//R4 ? which is obtained when resistors 147a and 147b are connected parallel to each other. This value of the terminating resistor is in conformity with s times the characteristic impedance of bidirectional bus 142.

$R3 = 2sZ0V1/V2$ $R4 = 2sZ0V1(2V1-V2)$

In this manner, $VOH = (2s+1)V2/2(s+1)$ $VOL1 = 0.5V2(s+1)$

Thus, $Vref1 = 0.5V2$

Therefore, the reference voltage Vref1 is ½ of the low VDDQ value.

By thus setting the values of the terminating resistors and the on resistances of the drivers as described above with respect to the characteristic impedance Z0 of the transmission line, the signal can be transmitted with good signal integrity. In the present embodiment, two types of power supply voltages VDDQ and two types of reference voltages Vref are sufficient. Though there are required two types of reference voltages Vref in the present embodiment, since the values of the reference voltages are set to ½ of the value of the power supply voltage VDDQ of each driver, an equivalent potential is applied between the drain and source of the pMOS transistor and the nMOS transistor of each driver, enabling efficient operation of the pMOS and the nMOS transistors. Moreover, since their input/output capacity can be reduced, they can be used in a circuit which is required to operate at a high speed.

The present embodiment is identical in arrangement to the second embodiment (FIG. 13), the fifth embodiment (FIG. 22), and the sixth embodiment (FIG. 24) in that it has a driver which is CTT-terminated and push-pull-connected that has an on resistance equal to the characteristic impedance Z0 of the transmission line. Therefore, these embodiments can also be realized by making the value of the terminating resistor variable.

FIG. 53 is a circuit diagram of an arrangement of a twenty-eighth embodiment of a signal transmission system according to the present invention.

FIG. 53 shows a circuit example for transmitting a single-ended signal between 1.5-V LSI 150 and 1.2-V LSI 151. FIG. 53(a) shows an equivalent circuit for sending a signal from 1.5-V LSI 150 to 1.2-V LSI 151, and FIG. 53(b) shows an equivalent circuit for sending a signal from 1.2-V LSI 151 to 1.5-V LSI 150.

In FIG. 53, switches that are turned off, receivers, and drivers that are set to a high impedance state on the signal reception side that do not contribute to the values of potentials, are omitted from the illustration, and the resistances of switches that are turned on, are included in the values of resistors 154a, 154b, 156a and 156b.

The driver for sending a signal comprises a pMOS and an nMOS transistors which are push-pull-connected. Bidirectional bus 152 which is a transmission line has a characteristic impedance Z0 of 40 ?, and the receiver for receiving a signal is CTT-terminated.

In the signal transmission system according to the twenty-eighth embodiment, for sending a signal from 1.5-V LSI 150, the values of resistors 154a and 154b forming a CTT termination on the signal reception side are set to 80 ?, which is equal to 2Z0. The value of the terminating resistor is the same as the value obtained when resistors 154a and 154b are connected parallel to each other, and is 40 ?. Therefore, the terminating resistor end and bidirectional bus 152 are impedance-matched.

The on resistance of nMOS transistor 153b of the driver is set to a value equal to or lower than the characteristic impedance Z0 of bidirectional bus 152, e.g., 40 ?, and the on resistance of pMOS transistor 153a of the driver is set to 20 ?. In this manner, VOH2=1.20 V, VOL2=0.30 V, and the reference voltage Vref2 is 0.75 V. That is, the reference voltage Vref2 is ½ of the high VDDQ value. Since a signal amplitude value ? with respect to the reference voltage Vref2 is 0.45 V, the signal amplitude value is sufficiently maintained.

For sending a signal from 1.2-V LSI 151, the values of resistors 156a and 156b forming a CTT termination on the signal reception side are set to 80 ?, which is equal to 2Z0. The value of the terminating resistor is the same as the value obtained when resistors 156a and 156b are connected parallel to each other, and is 40 ?. Therefore, the terminating resistor end and bidirectional bus 152 are impedance-matched.

The on resistance of pMOS transistor 155b of the driver is set to a value equal to or lower than the characteristic impedance Z0 of bidirectional bus 152, e.g., 40 ?, and the on resistance of nMOS transistor 155a of the driver is set to 17.14 ?. In this manner, VOH2=0.975 V, VOL1=0.225 V, and the reference voltage Vref1 is 0.65 V. That is, the reference voltage Vref1 is ½ of the low VDDQ value. Since a signal amplitude value ? with respect to the reference voltage Vref1 is 0.375 V, the signal amplitude value is sufficiently maintained.

By thus setting the values of the terminating resistors and the on resistances of the drivers as described above with respect to the characteristic impedance Z0 of the transmission line, the signal can be transmitted with good signal integrity. Two types of power supply voltages VDDQ and two types of reference voltages Vref are sufficient. Though there are required two types of reference voltages Vref in the present embodiment, since the values of the reference voltages are set to ½ of the value of the power supply voltage VDDQ of each driver, an equivalent potential is applied between the drain and source of the pMOS transistor and the nMOS transistor of each driver, enabling efficient operation of the pMOS and the nMOS transistors. Moreover, since their input/output capacity can be reduced, they can be used in a circuit which is required to operate at a high speed.

FIG. 54 shows a generalized circuit of the signal transmission system according to the twenty-eighth embodiment shown in FIG. 53.

FIG. 54(a) shows an equivalent circuit for sending a signal from LSI 150 having a power supply voltage VDDQ=V1 system to LSI 151 having a power supply voltage VDDQ=V2 system, and FIG. 54(b) shows an equivalent circuit for sending a signal from V2 LSI 151 to V1 LSI 150. In FIG. 54, V1>V2. Switches that are turned off, receivers, and drivers that are set to a high impedance state on the signal reception side that do not contribute to the values of potentials, are omitted from the illustration, and the resistances of switches that are turned on, are included in the values of the resistors forming the terminating resistor.

The driver for sending a signal comprises a pMOS and an nMOS transistors which are push-pull-connected. Bidirectional bus 152 which is a transmission line has a characteristic impedance Z0 or 40 ?, and the receiver for receiving a signal is CTT-terminated.

For sending a signal from V1 LSI 150, the values of resistors 154a and 154b forming a CTT termination on the signal reception side are set to 2Z0. The value of the terminating resistor is the same as the value obtained when resistors 154a and 154b are connected parallel to each other, and is in conformity with Z0. Therefore, the terminating resistor and bidirectional bus 152 are impedance-matched.

The on resistance of nMOS transistor 153b of the driver is set to a value equal to or lower than the characteristic impedance Z0 of bidirectional bus 152, e.g., Z0, and the on resistance of pMOS transistor 153a of the driver is set to Ron1 ?.

$Ron1 = 0.25 V2 \cdot Z0/(V1 - 0.75 V2)$

In this manner, $VOH2 = (0.5 V2 \cdot Ron1 + V1 \cdot Z0)/(Ron1 + Z0)$ $VOL2 = 0.25 V2$ Thus, $Vref2 = 0.5 V1$ Therefore, the reference voltage Vref2 is ½ of the high VDDQ value.

For sending a signal from V2 LSI 151, the values of resistors 156a and 156b forming a CTT termination on the signal reception side are set to 2Z0. The value of the terminating resistor is the same as the value obtained when resistors 156a and 156b are connected parallel to each other, and is in conformity with Z0. Therefore, the terminating resistor and bidirectional bus 152 are impedance-matched.

The on resistance of pMOS transistor 155b of the driver is set to a value equal to or lower than the characteristic impedance Z0 of bidirectional bus 152, e.g., Z0, and the on resistance of nMOS transistor 155a of the driver is set to Ron4 ?.

$Ron4 = Z0(2V2 - V1)/(3V1 - 2V2)$

In this manner, $VOH1 = 0.25 V1 + 0.5 V2$ $VOL1 = 0.5 V1 \cdot Ron4/(Ron4 + Z0)$ Thus, $Vref1 = 0.5 V2$ Therefore, the reference voltage Vref1 is ½ of the low VDDQ value.

As with the other embodiments, the path of return current of a signal flowing on bidirectional bus 152 is a ground plane which is common to 1.5-V LSI 150 and 1.2-V LSI 151. This makes it easy to design a printed board. If the power supply voltage VDDQ is used as the path of return current, then since the V1 power supply and the V2 power supply need to be used as the path of return current, problems arise which make the layout of interconnections difficult and increase the number of layers of the printed board. Therefore, it is preferable that the path of return current of a signal flowing on bidirectional bus 152 be a ground plane.

By thus setting the values of the terminating resistors and the on resistances of the drivers as described above with respect to the characteristic impedance Z0 of the transmission line, the signal can be transmitted with good signal integrity. Two types of power supply voltages VDDQ and two types of reference voltages Vref are sufficient. Though there are two types of reference voltages Vref in the present embodiment, since they may be set to ½ of the value of the power supply voltage VDDQ of each driver, an equivalent potential is applied between the drain and source of the pMOS transistor and the nMOS transistor of each driver, enabling efficient operation of the pMOS and the nMOS transistors. Moreover, since their input/output capacity can be reduced, they can be used in a circuit which is required to operate at a high speed.

While preferred embodiments of the present invention have been described using specific terms, such description is for illustrative purposes only, and it is to be understood that changes and variations may be made without departing from the spirit or scope of the following claims.

What is claimed is:

1. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:
    a transmission line having a predetermined characteristic impedance for performing bidirectional signal transmission between said first semiconductor integrated circuit device and said second semiconductor integrated circuit device;
    a first CTT terminating circuit for being supplied with said first power supply voltage, said first CTT terminating circuit having a resistance value in conformity with said characteristic impedance and disposed on a signal reception end of said first semiconductor integrated circuit device;
    a second CTT terminating circuit for being supplied with said second power supply voltage, said second CTT terminating circuit having a resistance value in conformity with said characteristic impedance and disposed on a signal reception end of said second semiconductor integrated circuit device;
    a reference voltage generating circuit for generating reference voltages which serve as a threshold value for determining the voltage of said single-ended signal and supplying the reference voltages respectively to said first semiconductor integrated circuit device and said second semiconductor integrated circuit device;
    a first driver of push-pull configuration for sending said single-ended signal from said first semiconductor integrated circuit device, said first driver having an on resistance value set such that the reference voltages used in said first semiconductor integrated circuit device and said second semiconductor integrated circuit device are equal to each other; and
    a second driver of push-pull configuration for sending said single-ended signal from said second semiconductor integrated circuit device, said second driver having an on resistance set such that the reference voltages used in said first semiconductor integrated circuit device and said second semiconductor integrated circuit device are equal to each other.

2. The signal transmission system according to claim 1, wherein said reference voltages are represented by 0.25 (V1+V2) where V1 represents said first power supply voltage and V2 represents said second power supply voltage.

3. The signal transmission system according to claim 1, wherein said reference voltages are represented by 0.5V1 where V1 represents said first power supply voltage.

4. The signal transmission system according to claim 1, wherein said reference voltages are represented by 0.6V1 where V1 represents said first power supply voltage.

5. The signal transmission system according to claim 1, wherein said reference voltages are represented by 0.5V2 where V2 represents said second power supply voltage.

6. The signal transmission system according to claim 1, wherein the path of return current of said single-ended signal flowing through said transmission line comprises a ground plane.

7. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:
    a transmission line having a predetermined characteristic impedance for performing bidirectional signal transmission between said first semiconductor integrated circuit device and said second semiconductor integrated circuit device;
    a first driver of push-pull configuration for sending said single-ended signal from said first semiconductor integrated circuit device, said first driver having an on resistance in conformity with said characteristic impedance;
    a second driver of push-pull configuration for sending said single-ended signal from said second semiconductor integrated circuit device, said second driver having an on resistance in conformity with said characteristic impedance;
    a reference voltage generating circuit for generating reference voltages which serve as a threshold value for determining the voltage of said single-ended signal and supplying the reference voltages respectively to said first semiconductor integrated circuit device and said second semiconductor integrated circuit device;
    a first CTT terminating circuit for being supplied with said first power supply voltage, said first CTT terminating circuit having a resistance value set such that the reference voltages used in said first semiconductor integrated circuit device and said second semiconductor integrated circuit device are equal to each other, and disposed on a signal reception end of said first semiconductor integrated circuit device; and
    a second CTT terminating circuit for being supplied with said second power supply voltage, said second CTT terminating circuit having a resistance value set such that the reference voltages used in said first semiconductor integrated circuit device and said second semiconductor integrated circuit device are equal to each other, and disposed on a signal reception end of said second semiconductor integrated circuit device.

8. The signal transmission system according to claim 7, wherein said reference voltages are represented by 0.25 (V1+V2) where V1 represents said first power supply voltage and V2 represents said second power supply voltage.

9. The signal transmission system according to claim 7, wherein the path of return current of said single-ended signal flowing through said transmission line comprises a ground plane.

10. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:

a transmission line having a predetermined characteristic impedance for performing bidirectional signal transmission between said first semiconductor integrated circuit device and said second semiconductor integrated circuit device;

a first driver of push-pull configuration for sending said single-ended signal from said first semiconductor integrated circuit device, said first driver having an on resistance in conformity with said characteristic impedance;

a second driver of push-pull configuration for sending said single-ended signal from said second semiconductor integrated circuit device, said second driver having an on resistance in conformity with said characteristic impedance;

a first CTT terminating circuit for being supplied with said first power supply voltage, said first CTT terminating circuit having a resistance value in conformity with said characteristic impedance and disposed on a signal reception end of said first semiconductor integrated circuit device;

a second CTT terminating circuit for being supplied with said second power supply voltage, said second CTT terminating circuit having a resistance value in conformity with said characteristic impedance and disposed on a signal reception end of said second semiconductor integrated circuit device; and a reference voltage generating circuit for supplying a common reference voltage which serves as a threshold value for determining the voltage of said single-ended signal to said first semiconductor integrated circuit device and said second semiconductor integrated circuit device.

11. The signal transmission system according to claim 10, wherein said reference voltages are represented by 0.25 (V1+V2) where V1 represents said first power supply voltage and V2 represents said second power supply voltage.

12. The signal transmission system according to claim 10, wherein the path of return current of said single-ended signal flowing through said transmission line comprises a ground plane.

13. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:

a transmission line having a predetermined characteristic impedance for performing bidirectional signal transmission between said first semiconductor integrated circuit device and said second semiconductor integrated circuit device;

a first VTT terminating circuit for being supplied with a voltage which is ½ of said second power supply voltage, said first VTT terminating circuit having a resistance value in conformity with said characteristic impedance and disposed on a signal reception end of said first semiconductor integrated circuit device;

a second VTT terminating circuit for being supplied with a voltage which is ½ of said second power supply voltage, said second VTT terminating circuit having a resistance value in conformity with said characteristic impedance and disposed on a signal reception end of said second semiconductor integrated circuit device;

a reference voltage generating circuit for generating reference voltages which serve as a threshold value for determining the voltage of said single-ended signal and supplying the reference voltages respectively to said first semiconductor integrated circuit device and said second semiconductor integrated circuit device;

a first driver of push-pull configuration for sending said single-ended signal from said first semiconductor integrated circuit device, said first driver having an on resistance value set such that the reference voltages used in said first semiconductor integrated circuit device and said second semiconductor integrated circuit device are equal to each other; and a second driver of push-pull configuration for sending said single-ended signal from said second semiconductor integrated circuit device, said second driver having an on resistance set such that the reference voltages used in said first semiconductor integrated circuit device and said second semiconductor integrated circuit device are equal to each other.

14. The signal transmission system according to claim 13, wherein said reference voltages are represented by 0.5V2 where V2 represents said second power supply voltage.

15. The signal transmission system according to claim 13, wherein the path of return current of said single-ended signal flowing through said transmission line comprises a ground plane.

16. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:

a transmission line having a predetermined characteristic impedance for performing bidirectional signal transmission between said first semiconductor integrated circuit device and said second semiconductor integrated circuit device;

a first driver of push-pull configuration for sending said single-ended signal from said first semiconductor integrated circuit device, said first driver having an on resistance in conformity with said characteristic impedance;

a second driver of push-pull configuration for sending said single-ended signal from said second semiconductor integrated circuit device, said second driver having an on resistance in conformity with said characteristic impedance;

a reference voltage generating circuit for generating reference voltages which serve as a threshold value for determining the voltage of said single-ended signal and supplying the reference voltages respectively to said first semiconductor integrated circuit device and said second semiconductor integrated circuit device;

a first VTT terminating circuit for being supplied with a voltage which is ½ of said first power supply voltage, said first VTT terminating circuit having a resistance value set such that the reference voltages used in said first semiconductor integrated circuit device and said second semiconductor integrated circuit device are equal to each other, and disposed on a signal reception end of said first semiconductor integrated circuit device; and a second VTT terminating circuit for being supplied with a voltage which is ½ of said second power supply voltage, said second VTT terminating circuit having a resistance value set such that the reference voltages used in said first semiconductor integrated circuit device and said second semiconductor integrated circuit device are equal to each other, and disposed on a signal reception end of said second semiconductor integrated circuit device.

17. The signal transmission system according to claim 16, wherein the path of return current of said single-ended signal flowing through said transmission line comprises a ground plane.

18. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:

a transmission line having a predetermined characteristic impedance for performing bidirectional signal transmission between said first semiconductor integrated circuit device and said second semiconductor integrated circuit device;

a first VTT terminating circuit for being supplied with a voltage which is ½ of said first power supply voltage, said first VTT terminating circuit having a resistance value in conformity with said characteristic impedance and disposed on a signal reception end of said first semiconductor integrated circuit device;

a second VTT terminating circuit for being supplied with a voltage which is ½ of said second power supply voltage, said second VTT terminating circuit having a resistance value in conformity with said characteristic impedance and disposed on a signal reception end of said second semiconductor integrated circuit device;

a reference voltage generating circuit for generating reference voltages which serve as a threshold value for determining the voltage of said single-ended signal and supplying the reference voltages respectively to said first semiconductor integrated circuit device and said second semiconductor integrated circuit device;

a first driver of push-pull configuration for sending said single-ended signal from said first semiconductor integrated circuit device, said first driver having an on resistance value set such that the reference voltages used in said first semiconductor integrated circuit device and said second semiconductor integrated circuit device are equal to each other; and a second driver of push-pull configuration for sending said single-ended signal from said second semiconductor integrated circuit device, said second driver having an on resistance set such that the reference voltages used in said first semiconductor integrated circuit device and said second semiconductor integrated circuit device are equal to each other.

19. The signal transmission system according to claim 18, wherein the path of return current of said single-ended signal flowing through said transmission line comprises a ground plane.

20. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:

a transmission line having a predetermined characteristic impedance for performing bidirectional signal transmission between said first semiconductor integrated circuit device and said second semiconductor integrated circuit device;

a first VTT terminating circuit for being supplied with a voltage which is ½ of said second power supply voltage, said first VTT terminating circuit having a resistance value in conformity with said characteristic impedance and disposed on a signal reception end of said first semiconductor integrated circuit device;

a second VTT terminating circuit for being supplied with a voltage which is ½ of said first power supply voltage, said second VTT terminating circuit having a resistance value in conformity with said characteristic impedance and disposed on a signal reception end of said second semiconductor integrated circuit device;

a reference voltage generating circuit for generating reference voltages which serve as a threshold value for determining the voltage of said single-ended signal and supplying the reference voltages respectively to said first semiconductor integrated circuit device and said second semiconductor integrated circuit device;

a first driver of push-pull configuration for sending said single-ended signal from said first semiconductor integrated circuit device, said first driver having an on resistance value set such that the reference voltages used in said first semiconductor integrated circuit device and said second semiconductor integrated circuit device are equal to each other; and a second driver of push-pull configuration for sending said single-ended signal from said second semiconductor integrated circuit device, said second driver having an on resistance set such that the reference voltages used in said first semiconductor integrated circuit device and said second semiconductor integrated circuit device are equal to each other.

21. The signal transmission system according to claim 20, wherein the path of return current of said single-ended signal flowing through said transmission line comprises a ground plane.

22. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:

a transmission line having a predetermined characteristic impedance for performing bidirectional signal transmission between said first semiconductor integrated circuit device and said second semiconductor integrated circuit device;

a first VTT terminating circuit for being supplied with a voltage which is ½ of said first power supply voltage, said first VTT terminating circuit having a resistance value in conformity with said characteristic impedance and disposed on a signal reception end of said first semiconductor integrated circuit device;

a second VTT terminating circuit for being supplied with a voltage which is ½ of said first power supply voltage, said second VTT terminating circuit having a resistance value in conformity with said characteristic impedance and disposed on a signal reception end of said second semiconductor integrated circuit device;

a reference voltage generating circuit for generating reference voltages which serve as a threshold value for determining the voltage of said single-ended signal and supplying the reference voltages respectively to said first semiconductor integrated circuit device and said second semiconductor integrated circuit device;

a first driver of push-pull configuration for sending said single-ended signal from said first semiconductor integrated circuit device, said first driver having an on resistance value set such that the reference voltages used in said first semiconductor integrated circuit device and said second semiconductor integrated circuit device are equal to each other; and a second driver of push-pull configuration for sending said single-ended signal from said second semiconductor integrated circuit device, said second driver having an on resistance set such that the reference voltages used in said first semiconductor integrated circuit device and said second semiconductor integrated circuit device are equal to each other.

23. The signal transmission system according to claim 22, wherein said reference voltages are represented by 0.5V1 where V1 represents said first power supply voltage.

24. The signal transmission system according to claim 22, wherein said reference voltages are represented by 0.5V2 where V2 represents said second power supply voltage.

25. The signal transmission system according to claim 22, wherein the path of return current of said single-ended signal flowing through said transmission line comprises a ground plane.

26. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:

a transmission line having a predetermined characteristic impedance for performing bidirectional signal transmission between said first semiconductor integrated circuit device and said second semiconductor integrated circuit device;

a first VTT terminating circuit for being supplied with said first power supply voltage, said first VTT terminating circuit having a resistance value in conformity with said characteristic impedance and disposed on a signal reception end of said first semiconductor integrated circuit device;

a second VTT terminating circuit for being supplied with said second power supply voltage, said second VTT terminating circuit having a resistance value in conformity with said characteristic impedance and disposed on a signal reception end of said second semiconductor integrated circuit device;

a reference voltage generating circuit for generating reference voltages which serve as a threshold value for determining the voltage of said single-ended signal and supplying the reference voltages respectively to said first semiconductor integrated circuit device and said second semiconductor integrated circuit device;

a first driver of open drain configuration for sending said single-ended signal from said first semiconductor integrated circuit device, said first driver having an on resistance value set such that the reference voltages used in said first semiconductor integrated circuit device and said second semiconductor integrated circuit device are equal to each other; and a second driver of open drain configuration for sending said single-ended signal from said second semiconductor integrated circuit device, said second driver having an on resistance set such that the reference voltages used in said first semiconductor integrated circuit device and said second semiconductor integrated circuit device are equal to each other.

27. The signal transmission system according to claim 26, wherein said reference voltages are equal to a fractional value of either said first power supply voltage or said second power supply voltage.

28. The signal transmission system according to claim 26, wherein the path of return current of said single-ended signal flowing through said transmission line comprises a ground plane.

29. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:

a transmission line having a predetermined characteristic impedance for performing bidirectional signal transmission between said first semiconductor integrated circuit device and said second semiconductor integrated circuit device;

a first driver of push-pull configuration for sending said single-ended signal from said first semiconductor integrated circuit device, said first driver having an on resistance in conformity with said characteristic impedance;

a second driver of push-pull configuration for sending said single-ended signal from said second semiconductor integrated circuit device, said second driver having an on resistance in conformity with said characteristic impedance;

a reference voltage generating circuit for generating reference voltages which serve as a threshold value for determining the voltage of said single-ended signal and supplying the reference voltages respectively to said first semiconductor integrated circuit device and said second semiconductor integrated circuit device;

a first VTT terminating circuit for being supplied with said first power supply voltage, said first VTT terminating circuit having a resistance value set such that the reference voltages used in said first semiconductor integrated circuit device and said second semiconductor integrated circuit device are equal to each other, and disposed on a signal reception end of said first semiconductor integrated circuit device; and a second VTT terminating circuit for being supplied with said second power supply voltage, said second VTT terminating circuit having a resistance value set such that the reference voltages used in said first semiconductor integrated circuit device and said second semiconductor integrated circuit device are equal to each other, and disposed on a signal reception end of said second semiconductor integrated circuit device.

30. The signal transmission system according to claim 29, wherein said reference voltages are represented by (V1+V2)/3 where V1 represents said first power supply voltage and V2 represents said second power supply voltage.

31. The signal transmission system according to claim 29, wherein the path of return current of said single-ended signal flowing through said transmission line comprises a ground plane.

32. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:
- a transmission line having a predetermined characteristic impedance for performing bidirectional signal transmission between said first semiconductor integrated circuit device and said second semiconductor integrated circuit device;
- a first VTT terminating circuit for being supplied with said first power supply voltage, said first VTT terminating circuit having a resistance value in conformity with said characteristic impedance and disposed on a signal reception end of said first semiconductor integrated circuit device;
- a second VTT terminating circuit for being supplied with said second power supply voltage, said second VTT terminating circuit having a resistance value in conformity with said characteristic impedance and disposed on a signal reception end of said second semiconductor integrated circuit device;
- a reference voltage generating circuit for generating reference voltages which serve as a threshold value for determining the voltage of said single-ended signal and supplying the reference voltages respectively to said first semiconductor integrated circuit device and said second semiconductor integrated circuit device;
- a first driver of push-pull configuration for sending said single-ended signal from said first semiconductor integrated circuit device, said first driver having an on resistance value set such that the reference voltages used in said first semiconductor integrated circuit device and said second semiconductor integrated circuit device are equal to each other; and
- a second driver of push-pull configuration for sending said single-ended signal from said second semiconductor integrated circuit device, said second driver having an on resistance set such that the reference voltages used in said first semiconductor integrated circuit device and said second semiconductor integrated circuit device are equal to each other.

33. The signal transmission system according to claim 32, wherein said reference voltages are represented by (V1+V2)/3 where V1 represents said first power supply voltage and V2 represents said second power supply voltage.

34. The signal transmission system according to claim 32, wherein the path of return current of said single-ended signal flowing through said transmission line comprises a ground plane.

35. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:
- a transmission line having a predetermined characteristic impedance for performing bidirectional signal transmission between said first semiconductor integrated circuit device and said second semiconductor integrated circuit device;
- a first CTT terminating circuit for being supplied with said first power supply voltage, said first CTT terminating circuit having a resistance value in conformity with said characteristic impedance and disposed on a signal reception end of said first semiconductor integrated circuit device;
- a second CTT terminating circuit for being supplied with said second power supply voltage, said second CTT terminating circuit having a resistance value in conformity with said characteristic impedance and disposed on a signal reception end of said second semiconductor integrated circuit device;
- a reference voltage generating circuit for generating reference voltages which serve as a threshold value for determining the voltage of said single-ended signal and supplying the reference voltages respectively to said first semiconductor integrated circuit device and said second semiconductor integrated circuit device;
- a first driver of push-pull configuration for sending said single-ended signal from said first semiconductor integrated circuit device, said first driver having an on resistance value set such that the reference voltage used in said first semiconductor integrated circuit device is in conformity with ½ of said first power supply voltage; and
- a second driver of push-pull configuration for sending said single-ended signal from said second semiconductor integrated circuit device, said second driver having an on resistance set such that the reference voltage used in said second semiconductor integrated circuit device is in conformity with ½ of said second power supply voltage.

36. The signal transmission system according to claim 35, wherein the path of return current of said single-ended signal flowing through said transmission line comprises a ground plane.

37. A signal transmission system for bidirectionally sending and receiving a single-ended signal between a first semiconductor integrated circuit device that operates under a first power supply voltage and a second semiconductor integrated circuit device that operates under a second power supply voltage which is lower than said first power supply voltage, comprising:
- a transmission line having a predetermined characteristic impedance for performing bidirectional signal transmission between said first semiconductor integrated circuit device and said second semiconductor integrated circuit device;
- a first driver of push-pull configuration for sending said single-ended signal from said first semiconductor integrated circuit device, said first driver having an on resistance in conformity with said characteristic impedance;
- a second driver of push-pull configuration for sending said single-ended signal from said second semiconductor integrated circuit device, said second driver having an on resistance in conformity with said characteristic impedance;
- a reference voltage generating circuit for generating reference voltages which serve as a threshold value for determining the voltage of said single-ended signal and supplying the reference voltages respectively to said first semiconductor integrated circuit device and said second semiconductor integrated circuit device;

a first CTT terminating circuit for being supplied with said first power supply voltage, said first CTT terminating circuit having a resistance value set such that the reference voltage used in said first semiconductor integrated circuit device is in conformity with ½ of said first power supply voltage, and disposed on a signal reception end of said first semiconductor integrated circuit device; and a second CTT terminating circuit for being supplied with said second power supply voltage, said second CTT terminating circuit having a resistance value set such that the reference voltage used in said second semiconductor integrated circuit device is in conformity with ½ of said second power supply voltage, and disposed on a signal reception end of said second semiconductor integrated circuit device.

38. The signal transmission system according to claim 37, wherein the path of return current of said single-ended signal flowing through said transmission line comprises a ground plane.

39. A signal transmission system for bidirectionally sending and receiving a differential signal between a first semiconductor integrated circuit device that operates under a first power supply voltage and a second semiconductor integrated circuit device that operates under a second power supply voltage which is lower than said first power supply voltage, comprising:

two transmission lines having a predetermined ODD mode characteristic impedance for performing bidirectional signal transmission between said first semiconductor integrated circuit device and said second semiconductor integrated circuit device;

two first drivers of push-pull configuration for sending said differential signal from said first semiconductor integrated circuit device, said first drivers having an on resistance in conformity with said characteristic impedance;

two second drivers of push-pull configuration for sending said differential signal from said second semiconductor integrated circuit device, said second drivers having an on resistance in conformity with said characteristic impedance;

a first bridge terminating circuit having a resistance value in conformity with twice said ODD mode characteristic impedance and disposed on a signal reception end of said first semiconductor integrated circuit device; and a second bridge terminating circuit having a resistance value in conformity with twice said ODD mode characteristic impedance and disposed on a signal reception end of said second semiconductor integrated circuit device.

* * * * *